United States Patent
Matsubayashi et al.

(10) Patent No.: US 11,804,551 B2
(45) Date of Patent: Oct. 31, 2023

(54) SEMICONDUCTOR DEVICE AND METHOD FOR MANUFACTURING SEMICONDUCTOR DEVICE

(71) Applicant: Semiconductor Energy Laboratory Co., Ltd., Atsugi (JP)

(72) Inventors: Daisuke Matsubayashi, Yokohama (JP); Yuichi Yanagisawa, Atsugi (JP); Masahiro Takahashi, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 193 days.

(21) Appl. No.: 17/257,921

(22) PCT Filed: Jul. 16, 2019

(86) PCT No.: PCT/IB2019/056049
§ 371 (c)(1),
(2) Date: Jan. 5, 2021

(87) PCT Pub. No.: WO2020/021383
PCT Pub. Date: Jan. 30, 2020

(65) Prior Publication Data
US 2021/0280718 A1    Sep. 9, 2021

(30) Foreign Application Priority Data

Jul. 27, 2018 (JP) ................................. 2018-141425

(51) Int. Cl.
*H01L 29/786* (2006.01)
*H01L 29/10* (2006.01)
(52) U.S. Cl.
CPC ...... *H01L 29/7869* (2013.01); *H01L 29/1095* (2013.01); *H01L 29/78696* (2013.01)

(58) Field of Classification Search
CPC ............. H01L 29/78693; H01L 21/477; H01L 27/1225; H01L 29/41733; H01L 29/42384;
(Continued)

(56) References Cited

U.S. PATENT DOCUMENTS 10,236,357 B2   3/2019  Yamane et al.
10,868,045 B2  12/2020  Yamazaki
(Continued)

FOREIGN PATENT DOCUMENTS

JP    2011-151383 A    8/2011
JP    2012-257187 A   12/2012
(Continued)

OTHER PUBLICATIONS

International Search Report (Application No. PCT/IB2019/056049) dated Sep. 3, 2019.
(Continued)

*Primary Examiner* — Jonathan Han
(74) *Attorney, Agent, or Firm* — ROBINSON INTELLECTUAL PROPERTY LAW OFFICE; Eric J. Robinson

(57) ABSTRACT

A semiconductor device having favorable electrical characteristics is provided. The semiconductor device in which first to third conductors are placed over a first oxide; first and second oxide insulators are placed respectively over the second and third conductors; a second oxide is placed in contact with a side surface of the first oxide insulator, a side surface of the second oxide insulator, and a top surface of the first oxide; a first insulator is placed between the first conductor and the second oxide; and the first oxide insulator and the second oxide insulator are not in contact with the first to third conductors, the first insulator, and the first oxide.

28 Claims, 27 Drawing Sheets

(58) Field of Classification Search
CPC .............. H01L 29/45; H01L 29/4908; H01L 29/66969; H01L 29/78615; H01L 29/78648; H01L 29/7869; H01L 29/78696; H01L 29/1095; H01L 21/8239; H01L 27/105; H01L 27/108; H01L 27/1156; H10B 12/00; H10B 41/70; H10B 99/00

See application file for complete search history.

(56) References Cited

U.S. PATENT DOCUMENTS

| | | | |
|---|---|---|---|
| 2013/0105865 | A1 | 5/2013 | Honda et al. |
| 2014/0042433 | A1 | 2/2014 | Yamazaki |
| 2015/0270402 | A1 | 9/2015 | Endo et al. |
| 2016/0035865 | A1 | 2/2016 | Nagamatsu et al. |
| 2016/0284859 | A1 | 9/2016 | Asami |
| 2016/0300952 | A1* | 10/2016 | Toriumi .............. H01L 21/8221 |
| 2016/0372606 | A1 | 12/2016 | Ito et al. |
| 2017/0033239 | A1* | 2/2017 | Nakano ................ H01L 29/247 |
| 2017/0170211 | A1* | 6/2017 | Yamazaki ........... H01L 29/4908 |
| 2017/0236842 | A1 | 8/2017 | Matsuda et al. |
| 2018/0151742 | A1 | 5/2018 | Kurata et al. |
| 2020/0279951 | A1 | 9/2020 | Hodo et al. |

FOREIGN PATENT DOCUMENTS

| | | |
|---|---|---|
| JP | 2017-130647 A | 7/2017 |
| JP | 2018-050044 A | 3/2018 |
| JP | 2018-073995 A | 5/2018 |
| TW | 201605042 | 2/2016 |
| WO | WO-2016/016761 | 2/2016 |
| WO | WO-2017/072627 | 5/2017 |
| WO | WO-2018/051208 | 3/2018 |

OTHER PUBLICATIONS

Written Opinion (Application No. PCT/IB2019/056049) dated Sep. 3, 2019.

Taiwanese Office Action (Application No. 108125759) dated Jul. 12, 2023.

* cited by examiner

FIG. 24A
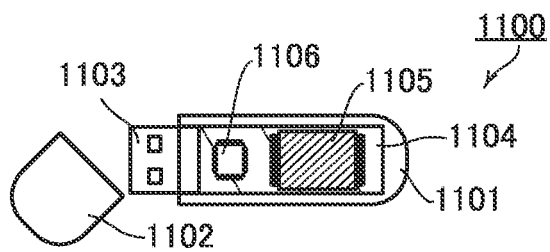
FIG. 24B  FIG. 24C
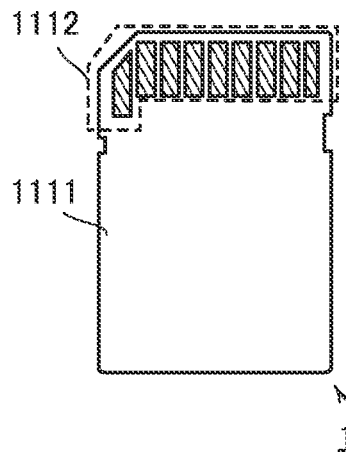 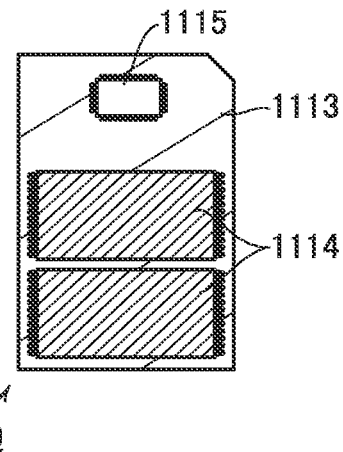
FIG. 24D  FIG. 24E
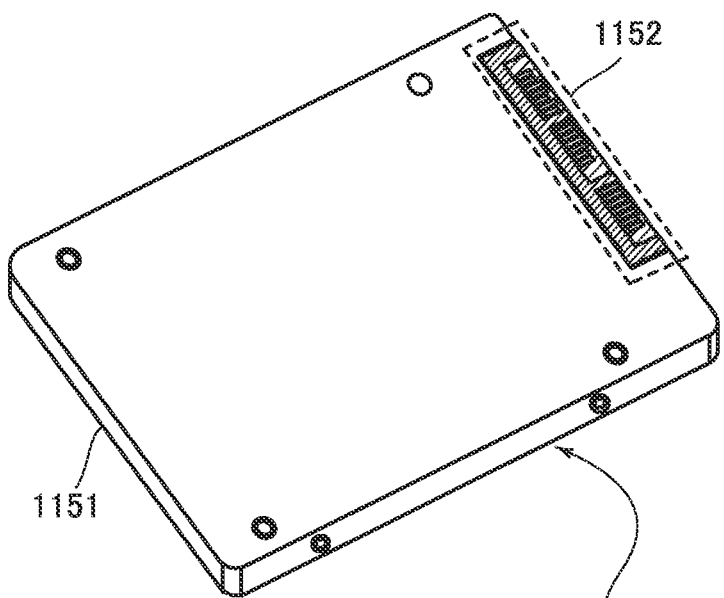 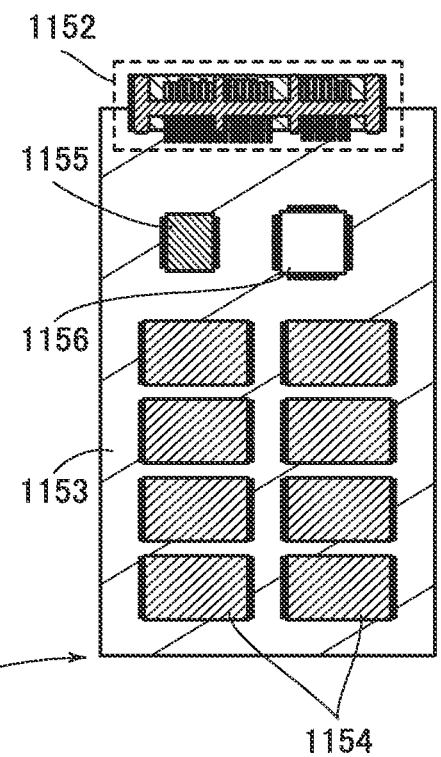

SEMICONDUCTOR DEVICE AND METHOD FOR MANUFACTURING SEMICONDUCTOR DEVICE

TECHNICAL FIELD

One embodiment of the present invention relates to a semiconductor device and a method for fabricating the semiconductor device. Alternatively, one embodiment of the present invention relates to a semiconductor wafer, a module, and an electronic device.

Note that in this specification and the like, a semiconductor device refers to all devices that can function by utilizing semiconductor characteristics. A semiconductor element such as a transistor, a semiconductor circuit, an arithmetic device, and a memory device are each one embodiment of a semiconductor device. In some cases, it can be said that a display device (e.g., a liquid crystal display device and a light-emitting display device), a projection device, a lighting device, an electro-optical device, a power storage device, a memory device, a semiconductor circuit, an imaging device, an electronic device, and the like include a semiconductor device.

Note that one embodiment of the present invention is not limited to the above technical field. One embodiment of the invention disclosed in this specification and the like relates to an object, a method, or a manufacturing method. Alternatively, one embodiment of the present invention relates to a process, a machine, manufacture, or a composition of matter.

BACKGROUND ART

In recent years, semiconductor devices have been developed and an LSI, a CPU, and a memory are mainly used. A CPU is an aggregation of semiconductor elements each provided with an electrode which is a connection terminal, which includes a semiconductor integrated circuit (including at least a transistor and a memory) separated from a semiconductor wafer.

A semiconductor circuit (IC chip) of an LSI, a CPU, a memory, and the like is mounted on a circuit board, for example, a printed wiring board, to be used as one of components of a variety of electronic devices.

A technique of forming a transistor using a semiconductor thin film formed over a substrate having an insulating surface has been attracting attention. The transistor is widely used in electronic devices such as an integrated circuit (IC) and an image display device (also simply referred to as a display device). A silicon-based semiconductor material is widely known as a semiconductor thin film that can be used in a transistor; in addition, an oxide semiconductor has been attracting attention as another material.

It is known that a transistor using an oxide semiconductor has extremely low leakage current in a non-conduction state. For example, a low-power-consumption CPU utilizing a characteristic of low leakage current of the transistor using an oxide semiconductor is disclosed (see Patent Document 1). Furthermore, a memory device that can retain stored contents for a long time by utilizing a characteristic of low leakage current of the transistor using an oxide semiconductor is disclosed, for example (see Patent Document 2).

In recent years, demand for an integrated circuit with higher density has risen with reductions in the size and weight of electronic devices. Furthermore, improvement in the productivity of a semiconductor device including an integrated circuit has been required.

REFERENCE

Patent Document

[Patent Document 1] Japanese Published Patent Application No. 2012-257187
[Patent Document 2] Japanese Published Patent Application No. 2011-151383

SUMMARY OF THE INVENTION

Problems to be Solved by the Invention

One object of one embodiment of the present invention is to provide a semiconductor device having favorable electrical characteristics. Another object of one embodiment of the present invention is to provide a semiconductor device with favorable reliability. Another object of one embodiment of the present invention is to provide a semiconductor device with high on-state current. Another object of one embodiment of the present invention is to provide a semiconductor device with excellent frequency characteristics. Another object of one embodiment of the present invention is to provide a semiconductor device with low off-state current. Another object of one embodiment of the present invention is to provide a semiconductor device with reduced power consumption. Another object of one embodiment of the present invention is to provide a semiconductor device that can be miniaturized or highly integrated. Another object of one embodiment of the present invention is to provide a semiconductor device with high productivity.

One object of one embodiment of the present invention is to provide a semiconductor device capable of retaining data for a long time. One object of one embodiment of the present invention is to provide a semiconductor device with high-speed data writing. One object of one embodiment of the present invention is to provide a semiconductor device with high design flexibility. One object of one embodiment of the present invention is to provide a semiconductor device capable of reducing power consumption. One object of one embodiment of the present invention is to provide a novel semiconductor device.

Note that the descriptions of these objects do not preclude the existence of other objects. One embodiment of the present invention does not have to achieve all these objects. Objects other than these will be apparent from the descriptions of the specification, the drawings, the claims, and the like, and objects other than these can be derived from the descriptions of the specification, the drawings, the claims, and the like.

Means for Solving the Problems

One embodiment of the present invention is a semiconductor device including first and second oxides, first to third insulators, first to third conductors, and first and second oxide insulators, in which the first conductor is placed over the first oxide, the second conductor and the third conductor are placed over the first oxide with the first conductor therebetween, the first oxide insulator is placed over the second conductor; the second oxide insulator is placed over the third conductor, the second oxide is placed in contact with a side surface of the first oxide insulator, a side surface of the second oxide insulator, and a top surface of the first oxide, the first insulator is placed between the first conductor and the second oxide; the second insulator is placed between the second conductor and the first oxide insulator, the third insulator is placed between the third conductor and the second oxide insulator, and the first oxide insulator and the second oxide insulator are in contact with none of the first to third conductors, the first insulator, and the first oxide.

Another embodiment of the present invention is a semiconductor device including first and second oxides, first to fourth insulators, first to third conductors, and first and second oxide insulators, in which the first conductor is placed over the first oxide, the second conductor and the third conductor are placed over the first oxide with the first conductor therebetween, the first oxide insulator is placed over the second conductor, the second oxide insulator is placed over the third conductor, the second oxide is placed in contact with a side surface of the first oxide insulator, a side surface of the second oxide insulator, and a top surface of the first oxide, the first insulator is placed between the first conductor and the second oxide, parts of the first conductor, the first insulator, and the second oxide overlap with part of the first oxide insulator and part of the second oxide insulator, the second insulator is placed between the second conductor and the first oxide insulator, the third insulator is placed between the third conductor and the second oxide insulator, the fourth insulator is placed to cover the first oxide insulator, the second oxide insulator, and the first conductor, the first oxide insulator is isolated from the first conductor, the second conductor, the first insulator, and the first oxide by the second insulator, the second oxide, and the fourth insulator, and the second oxide insulator is isolated from the first conductor, the third conductor, the first insulator, and the first oxide by the third insulator, the second oxide, and the fourth insulator.

Another embodiment of the present invention is a semiconductor device including first and second oxides, first to fourth insulators, first to third conductors, and first and second oxide insulators, in which the first conductor is placed over the first oxide, the second conductor and the third conductor are placed over the first oxide with the first conductor therebetween, the first oxide insulator is placed over the second conductor, the second oxide insulator is placed over the third conductor, the second oxide is placed in contact with a side surface of the first oxide insulator, a side surface of the second oxide insulator, and a top surface of the first oxide, the first insulator is placed between the first conductor and the second oxide, parts of the first conductor, the first insulator, and the second oxide overlap with part of the first oxide insulator and part of the second oxide insulator, the second insulator is placed in contact with a top surface and a side surface of the second conductor and a side surface of the first oxide, the third insulator is placed in contact with a top surface and a side surface of the third conductor and the side surface of the first oxide, the fourth insulator is placed over the first oxide insulator, the second oxide insulator, and the first conductor, the first oxide insulator is isolated from the first conductor, the second conductor, the first insulator, and the first oxide by the second insulator, the second oxide, and the fourth insulator, and the second oxide insulator is isolated from the first conductor, the third conductor, the first insulator, and the first oxide by the third insulator, the second oxide, and the fourth insulator.

In the above, the thickness of the first oxide insulator and the second oxide insulator in a region overlapping with the first oxide may be smaller than that in a region not overlapping with the first oxide. In the above, the first oxide insulator and the second oxide insulator may be integrated and have an opening overlapping with a region between the second conductor and the third conductor, and the second insulator and the third insulator may be integrated and have an opening overlapping with the region between the second conductor and the third conductor.

In the above, the fourth insulator is preferably in contact with a top surface of the first oxide insulator and a top surface of the second oxide insulator. In the above, the fourth insulator is preferably an oxide containing aluminum. In the above, it is preferable that the fourth insulator be less likely to allow oxygen to diffuse than the first oxide insulator and the second oxide insulator.

In the above, it is preferable that the second insulator and the third insulator be less likely to allow oxygen to diffuse than the first oxide insulator and the second oxide insulator.

In the above, it is preferable that the first oxide and the second oxide each contain In, an element M (M is Al, Ga, Y, or Sn), and Zn.

In the above, it is preferable that a third oxide be further provided under the first oxide, the third oxide contain In, the element M (M is Al, Ga, Y, or Sn), and Zn, and the atomic ratio of In to the element M in the third oxide be lower than the atomic ratio of In to the element M in the first oxide.

In the above, it is preferable that a fourth oxide be further provided between the second oxide and the first insulator, the fourth oxide contain In, the element M (M is Al, Ga, Y, or Sn), and Zn, and the atomic ratio of In to the element M in the fourth oxide be lower than the atomic ratio of In to the element M in the second oxide.

Effect of the Invention

According to one embodiment of the present invention, a semiconductor device having favorable electrical characteristics can be provided. According to another embodiment of the present invention, a semiconductor device with favorable reliability can be provided. According to another embodiment of the present invention, a semiconductor device with high on-state current can be provided. According to another embodiment of the present invention, a semiconductor device with excellent frequency characteristics can be provided. According to another embodiment of the present invention, a semiconductor device with low off-state current can be provided. According to another embodiment of the present invention, a semiconductor device with reduced power consumption can be provided. According to another embodiment of the present invention, a semiconductor device that can be miniaturized or highly integrated can be provided. According to another embodiment of the present invention, a semiconductor device with high productivity can be provided.

Alternatively, a semiconductor device capable of retaining data for a long time can be provided. Alternatively, a semiconductor device with high-speed data writing can be provided. Alternatively, a semiconductor device with high design flexibility can be provided. Alternatively, a semiconductor device capable of reducing power consumption can be provided. Alternatively, a novel semiconductor device can be provided.

Note that the descriptions of these effects do not preclude the existence of other effects. One embodiment of the present invention does not have to have all these effects. Effects other than these will be apparent from the descriptions of the specification, the drawings, the claims, and the like and effects other than these can be derived from the descriptions of the specification, the drawings, the claims, and the like.

BRIEF DESCRIPTION OF THE DRAWINGS

FIG. 24(A) to FIG. 24(E) are schematic diagrams of memory devices of one embodiment of the present invention.

FIG. 25(A) to FIG. 25(F) are diagrams each illustrating an electronic device of one embodiment of the present invention.

MODE FOR CARRYING OUT THE INVENTION

Figure 1:
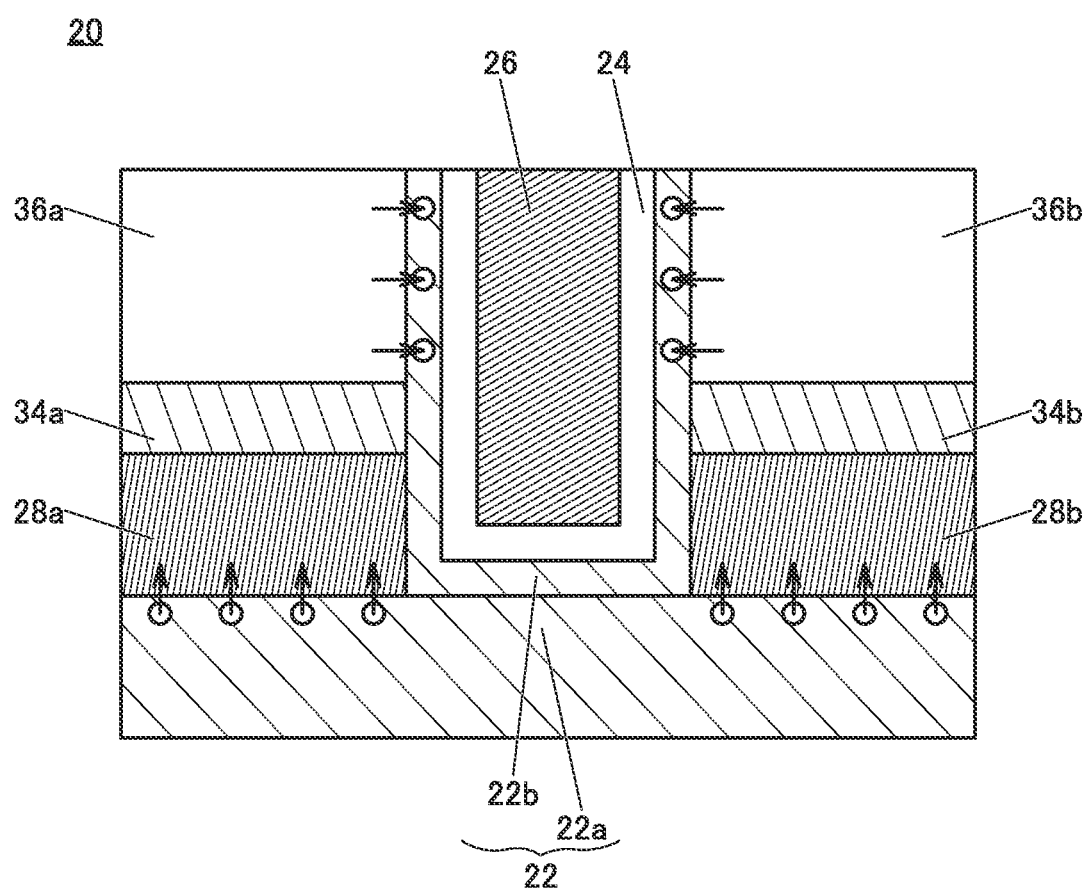
FIG. 1 is a cross-sectional view of a semiconductor device of one embodiment of the present invention.

Hereinafter, embodiments will be described with reference to the drawings. Note that the embodiments can be implemented in many different modes, and it will be readily understood by those skilled in the art that modes and details thereof can be changed in various ways without departing from the spirit and scope thereof. Therefore, the present invention should not be interpreted as being limited to the description of the embodiments below.

In the drawings, the size, the layer thickness, or the region is exaggerated for clarity in some cases. Therefore, they are not limited to the illustrated scale. Note that the drawings schematically illustrate ideal examples, and embodiments of the present invention are not limited to shapes, values, or the like shown in the drawings. For example, in an actual manufacturing process, a layer, a resist mask, or the like might be unintentionally reduced in size by treatment such as etching, which is omitted in some cases for easy understanding. Furthermore, in the drawings, the same reference numerals are used in common for the same portions or portions having similar functions in different drawings, and repeated description thereof is omitted in some cases. Furthermore, the same hatch pattern is used for the portions having similar functions, and the portions are not especially denoted by reference numerals in some cases.

Furthermore, especially in a top view (also referred to as a "plan view"), a perspective view, or the like, the description of some components might be omitted for easy understanding of the invention. Furthermore, the description of some hidden lines and the like might be omitted.

In addition, in this specification and the like, ordinal numbers such as "first" and "second" are used for convenience and do not denote the order of processes or the stacking order of layers. Thus, for example, description can be made by replacing "first" with "second," "third," or the like as appropriate. In addition, the ordinal numbers in this specification and the like do not correspond to the ordinal numbers which are used to specify one embodiment of the present invention in some cases.

In addition, in this specification and the like, terms for describing arrangement, such as "over" and "below," are used for convenience to describe the positional relation between components with reference to drawings. The positional relation between components is changed as appropriate in accordance with a direction in which the components are described. Thus, without limitation to the terms used for description in this specification, description can be changed appropriately depending on the situation.

In the case where there is an explicit description, X and Y are connected, in this specification and the like, for example, the case where X and Y are electrically connected, the case where X and Y are functionally connected, and the case where X and Y are directly connected are disclosed in this specification and the like. Accordingly, without being limited to a predetermined connection relation, for example, a connection relation shown in drawings or text, a connection relation other than a connection relation shown in drawings or text is regarded as being disclosed in the drawings or the text.

Here, X and Y each denote an object (e.g., a device, an element, a circuit, a wiring, an electrode, a terminal, a conductive film, or a layer).

Furthermore, functions of a source and a drain might be switched when a transistor of opposite polarity is employed or when a direction of current flow is changed in circuit operation, for example. Thus, the terms "source" and "drain" can sometimes be interchanged with each other in this specification and the like.

Note that in this specification and the like, depending on transistor structures, channel width in a region where a channel is actually formed (hereinafter also referred to as "effective channel width") is different from channel width illustrated in a top view of a transistor (hereinafter also referred to as "apparent channel width") in some cases. For example, when a gate electrode covers a side surface of a semiconductor, effective channel width is greater than apparent channel width, and its influence cannot be ignored in some cases. For example, in a miniaturized transistor having a gate electrode covering a side surface of a semiconductor, the proportion of a channel formation region formed in the side surface of the semiconductor is increased in some cases. In that case, effective channel width is greater than apparent channel width.

In such a case, an estimation of effective channel width by actual measurement may be difficult. For example, an estimation of effective channel width from a design value requires assumption that the shape of a semiconductor is known. Accordingly, in the case where the shape of a semiconductor is not known accurately, it is difficult to measure effective channel width accurately.

In this specification, the simple term "channel width" refers to an apparent channel width in some cases. Alternatively, in this specification, the simple term "channel width" refers to an effective channel width in some cases. Note that values of channel length, channel width, effective channel width, apparent channel width, and the like can be determined, for example, by analyzing a cross-sectional TEM image and the like.

Note that impurities in a semiconductor refer to, for example, elements other than the main components of a semiconductor. For example, an element with a concentration of lower than 0.1 atomic % can be regarded as an impurity. When an impurity is contained, for example, DOS (Density of States) in a semiconductor might be increased or crystallinity might be decreased.

In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. In the case of an oxide semiconductor, water also functions as an impurity in some cases. In addition, in the case of an oxide semiconductor, oxygen vacancies are formed in some cases by entry of impurities, for example. Furthermore, in the case where the semiconductor is silicon, examples of the impurity that changes characteristics of the semiconductor include oxygen, Group 1 elements except for hydrogen, Group 2 elements, Group 13 elements, and Group 15 elements.

Note that in this specification and the like, silicon oxynitride is a material that contains more oxygen than nitrogen in its composition. Furthermore, silicon nitride oxide is a material that contains more nitrogen than oxygen in its composition.

In this specification and the like, the term "insulator" can be replaced with an insulating film or an insulating layer. Furthermore, the term "conductor" can be replaced with a conductive film or a conductive layer. Moreover, the term "semiconductor" can be replaced with a semiconductor film or a semiconductor layer.

In this specification and the like, "parallel" indicates a state where two straight lines are placed at an angle of greater than or equal to $-10°$ and less than or equal to $10°$. Accordingly, the case where the angle is greater than or equal to $-5°$ and less than or equal to $5°$ is also included. Moreover, "substantially parallel" indicates a state where two straight lines are placed at an angle of greater than or equal to −30° and less than or equal to 30°. Moreover, "perpendicular" indicates a state where two straight lines are placed at an angle of greater than or equal to 80° and less than or equal to 100°. Accordingly, the case where the angle is greater than or equal to 85° and less than or equal to 95° is also included. Moreover, "substantially perpendicular" indicates a state where two straight lines are placed at an angle of greater than or equal to 60° and less than or equal to 120°.

Note that in this specification, a barrier film means a film having a function of inhibiting the passage of oxygen and impurities such as water and hydrogen; in the case where the barrier film has conductivity, the barrier film may be referred to as a conductive barrier film.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, when the term "OS FET" or "OS transistor" is used, the term can be replaced by a transistor including an oxide or an oxide semiconductor.

In this specification and the like, "normally off" means that current per micrometer of channel width flowing through a transistor when a potential is not applied to a gate or a ground potential is applied to the gate is lower than or equal to $1\times10^{-20}$ A at room temperature, lower than or equal to $1\times10^{-18}$ A at 85° C., or lower than or equal to $1\times10^{-16}$ A at 125° C.

Embodiment 1

The structure and characteristics of a semiconductor device of one embodiment of the present invention will be described below.

FIG. 1 is a cross-sectional view illustrating a transistor 20, which is a semiconductor device of one embodiment of the present invention.

As illustrated in FIG. 1, the transistor 20 includes an oxide 22a; a conductor 26 over the oxide 22a; a conductor 28a and a conductor 28b that are placed over the oxide 22a and isolated from each other with the conductor 26 therebetween; an oxide insulator 36a over the conductor 28a; an oxide insulator 36b over the conductor 28b; an oxide 22b placed in contact with a side surface of the oxide insulator 36a, a side surface of the oxide insulator 36b, and the top surface of the oxide 22a; an insulator 24 placed between the conductor 26 and the oxide 22b; an insulator 34a placed between the conductor 28a and the oxide insulator 36a; and an insulator 34b placed between the conductor 28b and the oxide insulator 36b. Hereinafter, the oxide 22a and the oxide 22b might be collectively referred to as an oxide 22. Furthermore, the conductor 28a and the conductor 28b might be collectively referred to as a conductor 28. Moreover, the insulator 34a and the insulator 34b might be collectively referred to as an insulator 34. In addition, the oxide insulator 36a and the oxide insulator 36b might be collectively referred to as an oxide insulator 36.

Here, each of the conductor 28a and the conductor 28b functions as a source electrode or a drain electrode of the transistor 20. The conductor 26 functions as a gate electrode of the transistor 20, and the insulator 24 functions as a gate insulator of the transistor 20.

In addition, it is preferable that the insulator 34 have a function of inhibiting diffusion of oxygen (e.g., an oxygen atom and an oxygen molecule) (or be less likely to allow the passage of the above oxygen). It is preferable that the insulator 34 be less likely than the oxide insulator 36 to allow oxygen to pass through, for example. As an insulator having such a barrier property against oxygen, an oxide containing one or both of aluminum and hafnium can be used, for example. Furthermore, as an insulator having a barrier property against oxygen, a nitride containing silicon or a nitride oxide containing silicon may be used, for example. Moreover, as an insulator having a barrier property against oxygen, an insulating film in which these oxides or nitrides are stacked may be used, for example.

The insulator 34 preferably has a function of inhibiting diffusion of hydrogen (e.g., at least one of a hydrogen atom, a hydrogen molecule, and the like). It is preferable that the insulator 34 be less likely than the oxide insulator 36 to allow hydrogen to pass through, for example. As an insulator having such a barrier property against hydrogen, a nitride containing silicon or a nitride oxide containing silicon can be used, for example.

The oxide insulator 36 preferably contains oxygen that is released therefrom by heating. The oxide insulator 36 may contain more oxygen than that in the stoichiometric composition. Note that in the following description, oxygen that is released by heating might be referred to as excess oxygen. The oxide insulator 36a and the oxide insulator 36b are preferably not in contact with the conductor 26, the conductor 28a, the conductor 28b, the insulator 24, and the oxide 22a.

Here, the side surface of the oxide insulator 36a on the conductor 26 side is preferably in contact with the oxide 22b. In addition, part of the top surface of the oxide insulator 36a may be covered with the oxide 22b. Similarly, the side surface of the oxide insulator 36b on the conductor 26 side is preferably in contact with the oxide 22b. In addition, part of the top surface of the oxide insulator 36b may be covered with the oxide 22b. With such a structure, oxygen contained in the oxide insulator 36 can be supplied to the oxide 22a and the vicinity of the interface between the oxide 22a and the oxide 22b through the oxide 22b. Furthermore, with such a structure, the oxide insulator 36 can be isolated from the conductor 26 and the insulator 24 by the oxide 22b. Accordingly, oxygen contained in the oxide insulator 36 can be prevented from directly diffusing into the conductor 26 and the insulator 24.

The bottom surface of the oxide insulator 36a is preferably in contact with the insulator 34a. Here, the insulator 34a is preferably in contact with a side surface of the oxide 22b and a top surface of the conductor 28a. Similarly, the bottom surface of the oxide insulator 36b is preferably in contact with the insulator 34b. Here, the insulator 34b is preferably in contact with a side surface of the oxide 22b and a top surface of the conductor 28b. With such a structure, the oxide insulator 36 can be isolated from the conductor 28 and the oxide 22a by the insulator 34. Accordingly, oxygen contained in the oxide insulator 36 can be prevented from directly diffusing into the conductor 28 and the oxide 22a.

Note that the insulator 34a and the insulator 34b of the insulator 34 are placed respectively on the conductor 28a side and the conductor 28b side in FIG. 1, but the structure is not limited thereto. For example, a structure in which the insulator 34a and the insulator 34b are integrated and have an opening overlapping with a region between the conductor 28a and the conductor 28b may be employed. Similarly, the oxide insulator 36 may have a structure in which the oxide insulator 36a and the oxide insulator 36b are integrated and have an opening overlapping with a region between the conductor 28a and the conductor 28b.

Alternatively, an insulator functioning as an interlayer film may be provided over the transistor 20. Note that it is preferable that the insulator functioning as an interlayer film be not in contact with the oxide insulator 36. For example, an insulator similar to the insulator 34 is placed between the insulator functioning as an interlayer film and the oxide insulator 36. With such a structure, oxygen contained in the oxide insulator 36 can be prevented from directly diffusing into the conductor 26, the conductor 28, the insulator 24, and the oxide 22a through the insulator functioning as an interlayer film.

The oxide 22a includes a channel formation region in a region between the conductor 28a and the conductor 28b, and includes a source region and a drain region in the vicinity of a region overlapping with the conductor 28a (the conductor 28b) so that the channel formation region is sandwiched between the source region and the drain region. Note that the source region and/or the drain region may have a shape in which the source region and/or the drain region extends inward from the conductor 28a (the conductor 28b). The channel formation region of the transistor 20 is formed not only in the oxide 22a but also in the vicinity of the interface between the oxide 22a and the oxide 22b and/or in the oxide 22b, in some cases.

Here, in the transistor 20, a metal oxide functioning as an oxide semiconductor (hereinafter also referred to as an oxide semiconductor) is preferably used as the oxide 22a and the oxide 22b. A metal oxide having an energy gap of 2 eV or more, preferably 2.5 eV or more is preferably used as a metal oxide to be the oxide 22a and the oxide 22b, for example. The off-state current (leakage current) of a transistor including a metal oxide having a wide energy gap as described above is small. With the use of such a transistor, a semiconductor device with low power consumption can be provided.

As the oxide 22a and the oxide 22b, a metal oxide such as an In-M-Zn oxide (an element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, aluminum, gallium, yttrium, or tin is preferably used as the element M. Furthermore, as the oxide 22a and the oxide 22b, an In—Ga oxide or an In—Zn oxide may be used.

Here, the atomic ratio of In to the element M in the metal oxide used as the oxide 22a may be higher than the atomic ratio of In to the element M in the metal oxide used as the oxide 22b. When the oxide 22b is placed over the oxide 22a as described above, impurities can be inhibited from diffusing into the oxide 22a from components formed above the oxide 22b. Furthermore, when the oxide 22a and the oxide 22b contain a common element (as its main component) besides oxygen, the density of defect states at the interface between the oxide 22a and the oxide 22b can be reduced. Since the density of defect states at the interface between the oxide 22a and the oxide 22b can be reduced, the influence of interface scattering on carrier conduction is small, and high on-state current can be obtained.

The oxide 22a preferably has crystallinity. It is particularly preferable to use a CAAC-OS (c-axis aligned crystalline oxide semiconductor) for the oxide 22a. The oxide 22b may also have crystallinity like the oxide 22a.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) is difficult to observe even in the vicinity of distortion in the CAAC-OS. That is, formation of a crystal grain boundary is inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. By contrast, in the CAAC-OS, a reduction in electron mobility due to the crystal grain boundary is less likely to occur because it is difficult to observe a clear crystal grain boundary. Entry of impurities, formation of defects, or the like might decrease the crystallinity of a metal oxide; thus, it can be said that the CAAC-OS is a metal oxide that has small amounts of impurities and defects (e.g., oxygen vacancies (also referred to as $V_O$)). Thus, a metal oxide including a CAAC-OS is physically stable. Therefore, the metal oxide including a CAAC-OS is resistant to heat and has high reliability.

Here, an example of a CAAC-OS analyzed by X-ray diffraction (XRD) will be described.

For example, when a CAAC-OS including an $InGaZnO_4$ crystal is subjected to structural analysis by an out-of-plane method, a peak appears at a diffraction angle (2θ) in the neighborhood of 31° in some cases. This peak is assigned to the (009) plane of the $InGaZnO_4$ crystal, which indicates that crystals in the CAAC-OS have c-axis alignment, and that the c-axes face in a direction substantially perpendicular to the formation surface or the top surface.

Furthermore, an example of a CAAC-OS analyzed by electron diffraction will be described. For example, when an electron beam with a probe diameter of 300 nm is incident on a CAAC-OS including an $InGaZnO_4$ crystal in a direction parallel to the sample surface, a diffraction pattern (also referred to as a selected-area transmission electron diffraction pattern) can be obtained in some cases. This diffraction pattern includes spots derived from the (009) plane of the $InGaZnO_4$ crystal. Thus, the electron diffraction also indicates that crystals included in the CAAC-OS have c-axis alignment, and that the c-axes face in a direction substantially perpendicular to the formation surface or the top surface. Meanwhile, a ring-like diffraction pattern is observed when an electron beam with a probe diameter of 300 nm is incident on the same sample in a direction perpendicular to the sample surface. Thus, the electron diffraction also indicates that the a-axes and b-axes of the crystals included in the CAAC-OS do not have regular alignment.

Here, the behavior of oxygen contained in the oxide insulator 36 at the time when heat treatment is performed in a fabrication process or after the fabrication of the transistor 20 of this embodiment will be described with reference to FIG. 1. Note that in FIG. 1, arrows represent an example of the movement of oxygen (e.g., an oxygen atom and an oxygen molecule), and white circles represent oxygen vacancies formed in the oxide 22.

A transistor using an oxide semiconductor is likely to have its electrical characteristics changed when impurities and oxygen vacancies exist in a region of the oxide semiconductor where a channel is formed, which may deteriorate the reliability. Moreover, when the region of the oxide semiconductor where a channel is formed includes oxygen vacancies, or impurities (typically, hydrogen) are introduced into the oxygen vacancies, the transistor tends to have normally on characteristics. An oxide semiconductor sometimes releases oxygen when subjected to heat treatment, so that oxygen vacancies might be formed.

For example, as illustrated in FIG. 1, the heat treatment in the fabrication process or after the fabrication of the transistor 20 might cause oxygen absorption from the oxide 22a into the conductor 28a and the conductor 28b, which forms oxygen vacancies in the oxide 22a in some cases. Here, oxygen in the oxide 22 is diffused into the oxide 22 by the above heat treatment so that the gradient of the oxygen vacancy concentration is reduced. In other words, oxygen vacancies formed in the vicinity of the interface between the oxide 22a and the conductor 28 are diffused into the oxide 22. Accordingly, oxygen vacancies are formed in a portion of the oxide 22 that functions as the channel formation region.

As a countermeasure to the above, an insulator containing excess oxygen is provided in the vicinity of the oxide semiconductor so that oxygen can be supplied from the insulator to the oxide semiconductor when heat treatment is performed. As described above, in the semiconductor device described in this embodiment, the oxide insulator 36 containing excess oxygen is provided in contact with the oxide 22b. As illustrated in FIG. 1, oxygen is released from the oxide insulator 36 and the oxygen is diffused by the above heat treatment to fill oxygen vacancies in the vicinity of the interface between the oxide insulator 36 and the oxide 22b. Similarly to the above, oxygen supplied from the oxide insulator 36 is also diffused into the oxide 22 so that the gradient of the oxygen vacancy concentration is reduced. Accordingly, oxygen is diffused also into a portion of the oxide 22 that functions as the channel formation region, so that oxygen vacancies are reduced.

Here, it is preferable that the oxide insulator 36 not be deprived of an excessive amount of oxygen during the above heat treatment. For example, when the conductor 26, the conductor 28a, and the conductor 28b are placed in contact with the oxide insulator 36, oxygen contained in the oxide insulator 36 might be absorbed into these conductors and unlikely to be supplied to the oxide 22. Furthermore, for example, when the insulator 24 is placed in contact with the oxide insulator 36, oxygen contained in the oxide insulator 36 might be absorbed into the conductor 26 through the insulator 24 and unlikely to be supplied to the oxide 22.

As described above, in the semiconductor device described in this embodiment, the oxide insulator 36 containing excess oxygen is isolated from the conductor 26 and the insulator 24 by the oxide 22b. Furthermore, the oxide insulator 36 containing excess oxygen is isolated from the conductor 28 by the insulator 34. Thus, even when the above heat treatment is performed, oxygen contained in the oxide insulator 36 is not excessively diffused into the conductor 26, the insulator 24, the conductor 28a, and the conductor 28b. Accordingly, oxygen in the oxide insulator 36 is not excessively decreased during the above heat treatment, and thus oxygen can be supplied from the oxide insulator 36 to the oxide 22.

Furthermore, when excess oxygen is supplied to the interface between the channel formation region of the oxide 22 and the insulator 24, defect states are formed at the interface between the channel formation region and the insulator 24, and the reliability of the transistor 20 is lowered in some cases. In contrast, in this embodiment, the oxide insulator 36 and the insulator 24 are isolated from each other, which inhibits oxygen from being supplied to the insulator 24. Accordingly, formation of defect states at the interface between the channel formation region and the insulator 24 can be prevented, and thus the reliability of the transistor 20 can be inhibited from being lowered.

Furthermore, when excess oxygen is supplied to the channel formation region of the oxide 22, the structure of the excess oxygen in the channel formation region is changed by stress such as voltage and a high temperature, so that the reliability of the transistor 20 is lowered in some cases. In contrast, in this embodiment, oxygen is not directly supplied to the channel formation region from the oxide insulator 36 but supplied to the channel formation region through the oxide 22b.

Accordingly, the amount of oxygen supplied to the channel formation region can be reduced by the oxide 22b, which can inhibit supply of excess oxygen to the channel formation region and thus can inhibit a decrease in the reliability of the transistor 20.

As described above, the oxygen vacancies generated in the oxide 22 by the heat treatment in the fabrication process or after the fabrication of the transistor 20 can be reduced by oxygen supplied from the oxide insulator 36. At this time, oxygen can be inhibited from being excessively supplied to the vicinity of the channel formation region of the oxide 22 and the vicinity of the interface between the channel formation region of the oxide 22 and the insulator 24. Accordingly, the deterioration of the electrical characteristics and reliability of the transistor 20 because of excess heat treatment (thermal budget) can be inhibited, and a semiconductor device having favorable electrical characteristics and reliability can be provided.

Note that the oxide 22b is preferably a CAAC-OS. A CAAC-OS has a property that makes oxygen more easily diffuse in the a-b plane direction rather than in the c-axis direction. Here, the oxide 22b is formed using the oxide insulator 36, the insulator 34, and the conductor 28 as a formation surface in a portion apart from the oxide 22a. Thus, oxygen supplied from the oxide insulator 36 to the oxide 22b is easily diffused in the direction of the oxide 22a rather than in the direction of the insulator 24.

According to one embodiment of the present invention, a semiconductor device having favorable electrical characteristics can be provided. According to another embodiment of the present invention, a semiconductor device with favorable reliability can be provided. According to another embodiment of the present invention, a semiconductor device with high on-state current can be provided. According to another embodiment of the present invention, a semiconductor device with excellent frequency characteristics can be provided. According to another embodiment of the present invention, a semiconductor device with low off-state current can be provided. According to another embodiment of the present invention, a semiconductor device that can be miniaturized or highly integrated can be provided. According to another embodiment of the present invention, a semiconductor device with reduced power consumption can be provided.

The structure, method, and the like described above in this embodiment can be used in an appropriate combination with structures, methods, and the like described in the other embodiments.

Embodiment 2

Figure 2A:
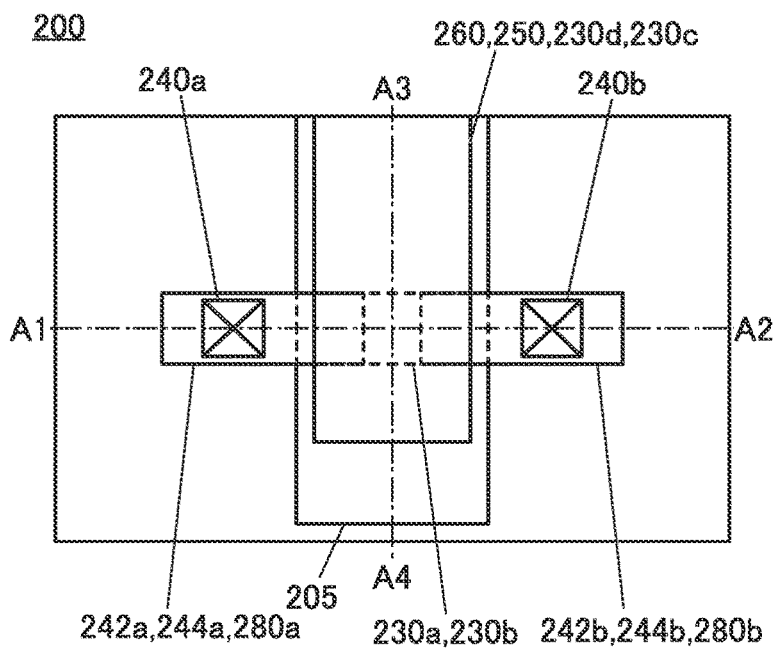
FIG. 2(A) is a top view of a semiconductor device of one embodiment of the present invention.
Figure 2C:
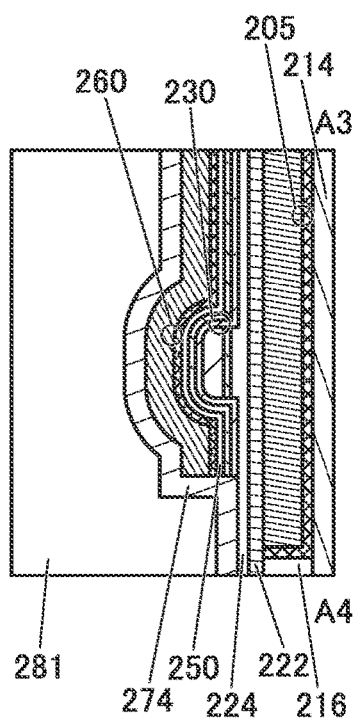
FIG. 2(B) and FIG. 2(C) are cross-sectional views of the semiconductor device of one embodiment of the present invention.
Figure 2B:
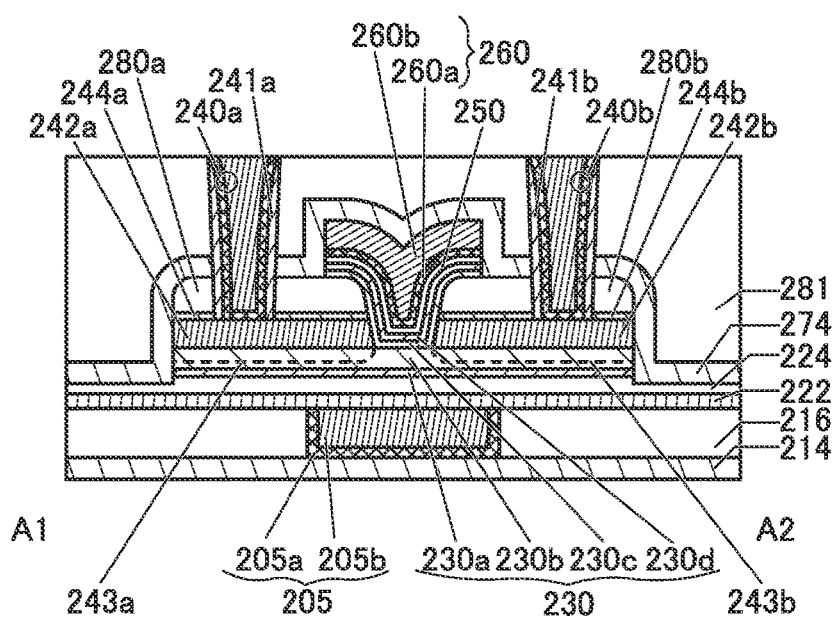

Specific structure examples of the semiconductor device described in the above embodiment will be described below with reference to FIG. 2 to FIG. 19.
<Structure Example of Semiconductor Device>
FIG. 2(A), FIG. 2(B), and FIG. 2(C) are a top view and cross-sectional views of a transistor 200 of one embodiment of the present invention and the periphery of the transistor 200. The transistor 200 corresponds to the transistor 20 described in the above embodiment.

FIG. 2(A) is a top view of a semiconductor device including the transistor 200. FIG. 2(B) and FIG. 2(C) are cross-sectional views of the semiconductor device. Here, FIG. 2(B) is a cross-sectional view of a portion indicated by a dashed-dotted line A1-A2 in FIG. 2(A), and is also a cross-sectional view of the transistor 200 in the channel length direction. FIG. 2(C) is a cross-sectional view of a portion indicated by a dashed-dotted line A3-A4 in FIG. 2(A), and is also a cross-sectional view of the transistor 200 in the channel width direction. Note that for simplification of the drawing, some components are not illustrated in the top view in FIG. 2(A).

The semiconductor device of one embodiment of the present invention includes the transistor 200, and an insulator 214, an insulator 274, and an insulator 281 that function as interlayer films. A conductor 240 (a conductor 240a and a conductor 240b) functioning as a plug and being electrically connected to the transistor 200 is also included. Note that an insulator 241 (an insulator 241a and an insulator 241b) is provided in contact with a side surface of the conductor 240 functioning as a plug.

In contact with an inner wall of an opening in an insulator 244, an oxide insulator 280, the insulator 274, and the insulator 281, the insulator 241 is provided; in contact with its side surface, a first conductor of the conductor 240 is provided, and a second conductor of the conductor 240 is further provided on the inner side. Here, the level of a top surface of the conductor 240 and the level of a top surface of the insulator 281 can be substantially the same. Note that although the transistor 200 having a structure in which the first conductor of the conductor 240 and the second conductor of the conductor 240 are stacked is illustrated, the present invention is not limited thereto. The conductor 240 may be provided as a single layer or to have a stacked-layer structure of three or more layers, for example. In the case where a structure body has a stacked-layer structure, layers may be distinguished by ordinal numbers corresponding to the formation order.
[Transistor 200]
As illustrated in FIG. 2, the transistor 200 includes the insulator 214 and an insulator 216 placed over a substrate (not illustrated); a conductor 205 placed to be embedded in the insulator 216; an insulator 222 placed over the insulator 216 and the conductor 205; an insulator 224 placed over the insulator 222; an oxide 230 (an oxide 230a, an oxide 230b, an oxide 230c, and an oxide 230d) placed over the insulator 224; an insulator 250 placed over the oxide 230; a conductor 260 (a conductor 260a and a conductor 260b) placed over the insulator 250; a conductor 242a and a conductor 242b in contact with a top surface of the oxide 230b; an insulator 244a placed over the conductor 242a; an insulator 244b placed over the conductor 242b; an oxide insulator 280a placed over the insulator 244a; an oxide insulator 280b placed over the insulator 244b; and the insulator 274 placed to cover the oxide insulator 280a, the oxide insulator 280b, and the conductor 260. Here, as illustrated in FIGS. 2(A) and 2(B), parts of the conductor 260, the insulator 250, the oxide 230c, and the oxide 230d overlap with part of the oxide insulator 280a and part of the oxide insulator 280b.

Note that the oxide 230a, the oxide 230b, the oxide 230c, and the oxide 230d might be collectively referred to as the oxide 230. The conductor 242a and the conductor 242b might be collectively referred to as a conductor 242. The insulator 244a and the insulator 244b might be collectively referred to as the insulator 244. Furthermore, the oxide insulator 280a and the oxide insulator 280b might be collectively referred to as the oxide insulator 280.

Here, the oxide 230b corresponds to the oxide 22a of the transistor 20 of the above embodiment. The conductor 242a and the conductor 242b correspond to the conductor 28a and the conductor 28b of the transistor 20 of the above embodiment. The insulator 244 corresponds to the insulator 34 of the transistor 20 of the above embodiment. The oxide insulator 280 corresponds to the oxide insulator 36 of the transistor 20 of the above embodiment. The oxide 230c corresponds to the oxide 22b of the transistor 20 of the above embodiment. The insulator 250 corresponds to the insulator 24 of the transistor 20 of the above embodiment. The conductor 260 corresponds to the conductor 26 of the transistor 20 of the above embodiment.

Thus, as in the transistor 20 described in the above embodiment, in the transistor 200, the conductor 260 is placed over the oxide 230b; the conductor 242a and the conductor 242b are placed over the oxide 230b with the conductor 260 therebetween; the oxide insulator 280a is placed over the conductor 242a; the oxide insulator 280b is placed over the conductor 242b; the oxide 230c is placed in contact with a side surface of the oxide insulator 280a, a side surface of the oxide insulator 280b, and the top surface of the oxide 230b; the insulator 250 is placed between the conductor 260 and the oxide 230c; the insulator 244a is placed between the conductor 242a and the oxide insulator 280a; and the insulator 244b is placed between the conductor 242b and the oxide insulator 280b.

The oxide insulator 280 preferably includes a region containing oxygen that is released by heating. When the oxide insulator 280 from which oxygen is released by heating is provided in contact with the oxide 230c, oxygen in the oxide insulator 280 can be efficiently supplied to the oxide 230b through the oxide 230c.

The insulator 222, the insulator 244, and the insulator 274 preferably have a function of inhibiting diffusion of oxygen (e.g., at least one of an oxygen atom, an oxygen molecule, and the like). Furthermore, the insulator 222, the insulator 244, and the insulator 274 preferably have a function of inhibiting diffusion of hydrogen (e.g., at least one of a hydrogen atom, a hydrogen molecule, and the like). For example, the insulator 222, the insulator 244, and the insulator 274 each preferably have lower permeability of one or both of oxygen and hydrogen than the insulator 224. The insulator 222, the insulator 244, and the insulator 274 each preferably have lower permeability of one or both of oxygen and hydrogen than the insulator 250. The insulator 222, the insulator 244, and the insulator 274 each preferably have lower permeability of one or both of oxygen and hydrogen than the oxide insulator 280.

As illustrated in FIG. 2(B), the insulator 244a is preferably in contact with a top surface of the conductor 242a and a bottom surface of the oxide insulator 280a. As illustrated in FIG. 2(B), the insulator 244b is preferably in contact with a top surface of the conductor 242b and a bottom surface of the oxide insulator 280b. As illustrated in FIG. 2(B), the insulator 274 is preferably in contact with a top surface and a side surface of the conductor 260, a side surface of the insulator 250, side surfaces of the oxide 230c and the oxide 230d, a top surface and a side surface of the oxide insulator 280a, a top surface and a side surface of the oxide insulator 280b, a side surface of the insulator 244a, a side surface of the insulator 244b, a side surface of the conductor 242a, a side surface of the conductor 242b, side surfaces of the oxide 230a and the oxide 230b, and a top surface of the insulator 224. Furthermore, the insulator 241a is preferably provided between the conductor 240a and the oxide insulator 280a. Moreover, the insulator 241b is preferably provided between the conductor 240b and the oxide insulator 280b.

With the above structure, the oxide insulator 280a can be isolated from the insulator 281, the conductor 240a, the conductor 260, the conductor 242a, the insulator 250, and the oxide 230b by the insulator 244a, the insulator 241a, the insulator 274, and the oxide 230c. Furthermore, the oxide insulator 280b can be isolated from the insulator 281, the conductor 240b, the conductor 260, the conductor 242b, the insulator 250, and the oxide 230b by the insulator 244b, the insulator 241b, the insulator 274, and the oxide 230c. Accordingly, oxygen contained in the oxide insulator 280 can be prevented from directly diffusing into the insulator 281, the conductor 260, the conductor 240, the conductor 242, the insulator 250, and the oxide 230b.

Here, the oxide 230c is preferably in contact with the side surface and part of the top surface of the oxide insulator 280a and is preferably in contact with the side surface and part of the top surface of the oxide insulator 280b. Furthermore, part of the conductor 260 preferably overlaps with part of the oxide insulator 280a and part of the oxide insulator 280b with the oxide 230c, the oxide 230d, and the conductor 260 therebetween. With such a structure, the oxide 230c and the oxide 230d can be more surely placed between the oxide insulator 280a (the oxide insulator 280b) and the conductor 260 and the insulator 250. Thus, the oxide insulator 280a (the oxide insulator 280b) can be more surely isolated from the conductor 260 and the insulator 250.

The oxide 230 preferably includes the oxide 230a placed over the insulator 224, the oxide 230b placed over the oxide 230a, and the oxide 230c which is placed over the oxide 230b and at least partly in contact with the top surface of the oxide 230b. Furthermore, the oxide 230d may be provided between the oxide 230c and the insulator 250.

Note that although the structure of the transistor 200 in which four layers, the oxide 230a, the oxide 230b, the oxide 230c, and the oxide 230d, are stacked in a region where a channel is formed (hereinafter also referred to as a channel formation region) and in its vicinity is illustrated, the present invention is not limited thereto. For example, a two-layer structure of the oxide 230b and the oxide 230c, a three-layer structure of the oxide 230a, the oxide 230b, and the oxide 230c, or a stacked-layer structure of five or more layers may be provided.

Here, the conductor 260 functions as a gate electrode of the transistor, and the conductor 242a and the conductor 242b function as a source electrode and a drain electrode. The conductor 260 preferably includes a region overlapping with the conductor 242a and a region overlapping with the conductor 242b with the oxide 230c, the oxide 230d, and the insulator 250 therebetween. When the conductor 260 has such a shape, the conductor 260 can have a margin for alignment; thus, the conductor 260 can surely overlap with a region of the oxide 230b between the conductor 242a and the conductor 242b.

In the transistor 200, as the oxide 230 (the oxide 230a, the oxide 230b, the oxide 230c, and the oxide 230d) including the channel formation region, a metal oxide functioning as an oxide semiconductor (such a metal oxide is hereinafter also referred to as an oxide semiconductor) is preferably used.

The transistor 200 using an oxide semiconductor in the channel formation region has extremely low leakage current in a non-conduction state (off-state current); thus, a semiconductor device with low power consumption can be provided. An oxide semiconductor can be deposited by a sputtering method or the like, and thus can be used for the transistor 200 constituting a highly integrated semiconductor device.

For example, as the oxide 230, a metal oxide such as an In-M-Zn oxide (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, aluminum, gallium, yttrium, or tin is preferably used as the element M. An In—Ga oxide or an In—Zn oxide may also be used as the oxide 230.

A transistor using an oxide semiconductor is likely to have its electrical characteristics changed when impurities and oxygen vacancies exist in a region of the oxide semiconductor where a channel is formed, which may deteriorate the reliability. Moreover, when the region of the oxide semiconductor where a channel is formed includes oxygen vacancies, the transistor tends to have normally on characteristics. Thus, oxygen vacancies in the channel formation region are preferably reduced as much as possible. For example, oxygen may be supplied to the oxide 230b through the oxide 230c or the like to fill oxygen vacancies. Accordingly, a transistor with inhibited variation in electrical characteristics, stable electrical characteristics, and improved reliability can be provided.

A low-resistance region might be formed in part of a region between the oxide 230 and the conductor 242 or the vicinity of a surface of the oxide 230 when an element (e.g., a second element) included in the conductor 242 (the conductor 242a and the conductor 242b) which is provided over and in contact with the oxide 230 and functions as the source electrode and the drain electrode has a function of absorbing oxygen in the oxide 230. In that case, in the low-resistance region, an impurity (such as hydrogen, nitrogen, or a metal element) entering oxygen vacancies functions as a donor, which causes an increase in carrier density in some cases. Note that in the following description, hydrogen that enters oxygen vacancies is referred to as $V_oH$ in some cases.

Furthermore, as illustrated in FIG. 2(B), the conductor 242 is provided over and in contact with the oxide 230, and a region 243 (a region 243a and a region 243b) is formed as a low-resistance region at an interface between the oxide 230 and the conductor 242 and the vicinity of the interface in some cases. The oxide 230 includes a region functioning as the channel formation region of the transistor 200 and a region including part of the region 243 and functioning as a source region or a drain region.

Note that although an example in which the region 243a and the region 243b are provided to spread in the depth direction of the oxide 230b near the conductor 242 is illustrated, the present invention is not limited thereto. The region 243a and the region 243b may be formed as appropriate in accordance with the required electrical characteristics of the transistor. In the oxide 230, the boundaries between the regions are difficult to detect clearly in some cases. The concentration of an element detected in each region may not only gradually change between the regions, but also continuously change (also referred to as a gradation) within each region.

The detailed structure of the semiconductor device including the transistor 200 of one embodiment of the present invention will be described below.

The conductor 205 is placed to overlap with the oxide 230 and the conductor 260. The conductor 205 is preferably embedded in the insulator 216. Part of the conductor 205 may be embedded in the insulator 214. Here, a top surface of the conductor 205 preferably has favorable planarity. For example, the average surface roughness (Ra) of the top surface of the conductor 205 is less than or equal to 1 nm, preferably less than or equal to 0.5 nm, further preferably less than or equal to 0.3 nm. This achieves favorable planarity of the insulator 224 formed over the conductor 205 and the increase in crystallinity of the oxide 230b and the oxide 230c.

Here, the conductor 260 functions as a first gate (also referred to as a top gate) electrode in some cases. The conductor 205 functions as a second gate (also referred to as a bottom gate) electrode in some cases. In such cases, Vth of the transistor 200 can be controlled by changing a potential applied to the conductor 205 not in synchronization with but independently of a potential applied to the conductor 260. In particular, Vth of the transistor 200 can be higher than 0 V and the off-state current can be reduced by application of a negative potential to the conductor 205. Thus, drain current when a potential applied to the conductor 260 is 0 V can be lower in the case where a negative potential is applied to the conductor 205 than in the case where the negative potential is not applied to the conductor 205.

Note that as illustrated in FIG. 2(A), the conductor 205 is preferably provided to be larger than the oxide 230b. As illustrated in FIG. 2(C), it is particularly preferable that the conductor 205 also extend to a region outside an end portion of the oxide 230b that intersects with the channel width direction. That is, the conductor 205 and the conductor 260 preferably overlap with each other with the insulators therebetween outside the side surface of the oxide 230b in the channel width direction.

Since the above structure is included, the channel formation region of the oxide 230b can be electrically surrounded by an electric field of the conductor 260 having a function of the first gate electrode and an electric field of the conductor 205 having a function of the second gate electrode.

Furthermore, as illustrated in FIG. 2(C), the conductor 205 is extended to function as a wiring as well. However, without limitation to this structure, a structure where a conductor functioning as a wiring is provided below the conductor 205 may be employed. In addition, the conductor 205 does not necessarily have to be provided in each transistor. For example, the conductor 205 may be shared by a plurality of transistors.

In the conductor 205, a conductor 205a is formed in contact with an inner wall of an opening in the insulator 216, and a conductor 205b is further formed on the inner side. Here, the levels of the conductor 205a and the conductor 205b and the level of a top surface of the insulator 216 can be substantially the same. Although the transistor 200 having a structure in which the conductor 205a and the conductor 205b are stacked is illustrated, the present invention is not limited thereto. For example, the conductor 205 may be provided as a single layer or to have a stacked-layer structure of three or more layers. In the case where a structure body has a stacked-layer structure, layers may be distinguished by ordinal numbers corresponding to the formation order.

In addition, a conductor having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom (a conductor through which the above impurities are less likely to pass) may be used as the conductor 205a. Alternatively, it is preferable to use a conductor having a function of inhibiting diffusion of oxygen (e.g., at least one of an oxygen atom, an oxygen molecule, and the like) (a conductor through which the above oxygen is less likely to pass). Note that in this specification, a function of inhibiting diffusion of impurities or oxygen means a function of inhibiting diffusion of any one or all of the above impurities and oxygen.

When a conductor having a function of inhibiting diffusion of oxygen is used as the conductor 205a, the conductivity of the conductor 205 can be inhibited from being lowered because of oxidation. As a conductive material having a function of inhibiting diffusion of oxygen, for example, tantalum, tantalum nitride, ruthenium, or ruthenium oxide is preferably used. Thus, the conductor 205a is a single layer or a stacked layer of the above conductive materials.

Moreover, for the conductor 205b, a conductive material containing tungsten, copper, or aluminum as its main component is preferably used.

It is preferable to use an insulating material having a function of inhibiting diffusion of oxygen (e.g., an oxygen atom and an oxygen molecule) (an insulating material through which the oxygen is less likely to pass) for the insulator 214. The insulator 214 preferably functions as a barrier insulating film that inhibits impurities such as water or hydrogen from entering the transistor 200 from the substrate side. Accordingly, for the insulator 214, it is preferable to use an insulating material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom (an insulating material through which the above impurities are less likely to pass).

For example, it is preferable that silicon nitride or the like be used for the insulator 214. Accordingly, impurities such as water or hydrogen can be inhibited from diffusing to the transistor 200 side from the substrate side through the insulator 214. Alternatively, oxygen contained in the insulator 224 and the like can be inhibited from diffusing to the substrate side through the insulator 214. Alternatively, an insulator containing an oxide of one or both of aluminum and hafnium, which is an insulating material, may be used as the insulator 214. For example, a stacked-layer film in which aluminum oxide is stacked over silicon nitride may be used as the insulator 214.

The permittivity of the insulator 216 and the insulator 281 is preferably lower than that of the insulator 214. When a material with a low permittivity is used for an interlayer film, the parasitic capacitance generated between wirings can be reduced. For the insulator 216 and the insulator 281, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like is used as appropriate, for example.

The insulator 222 and the insulator 224 have a function of a gate insulator.

Here, the insulator 224 in contact with the oxide 230 may have a function of releasing oxygen by heating. For example, silicon oxide, silicon oxynitride, or the like is used for the insulator 224 as appropriate. When an insulator containing oxygen is provided in contact with the oxide 230a, oxygen vacancies in the oxide 230 can be reduced and the reliability of the transistor 200 can be improved.

As illustrated in FIG. 2(C), the thickness of the insulator 224 in a region overlapping with neither the insulator 244 nor the oxide 230b is smaller than the thickness of the other regions in some cases. In the insulator 224, the region overlapping with neither the insulator 244 nor the oxide 230b preferably has thickness with which the above oxygen can be adequately diffused.

It is preferable that the insulator 222 have a function of inhibiting diffusion of oxygen (e.g., at least one of an oxygen atom, an oxygen molecule, and the like) (or be less likely to allow the passage of the above oxygen). For example, the insulator 222 preferably has lower oxygen permeability than the insulator 224. The insulator 222 preferably has a function of inhibiting diffusion of oxygen or impurities, in which case diffusion of oxygen contained in the oxide 230 to the insulator 220 side can be reduced. Furthermore, the conductor 205 can be inhibited from reacting with oxygen contained in the insulator 224 or the oxide 230.

Furthermore, the insulator 222 preferably functions as a barrier insulating film that inhibits impurities such as water or hydrogen from entering the transistor 200 from the substrate side. For example, the insulator 222 preferably has lower hydrogen permeability than the insulator 224. Surrounding the insulator 224, the oxide 230, and the like by the insulator 222 and the insulator 244 can inhibit entry of impurities such as water or hydrogen into the transistor 200 from the outside.

As the insulator 222, an insulator containing an oxide of one or both of aluminum and hafnium, which is an insulating material, is preferably used. As the insulator containing an oxide of one or both of aluminum and hafnium, aluminum oxide, hafnium oxide, an oxide containing aluminum and hafnium (hafnium aluminate), or the like is preferably used. When the insulator 222 is formed using such a material, the insulator 222 functions as a layer that inhibits release of oxygen from the oxide 230 and entry of impurities such as hydrogen from the periphery of the transistor 200 into the oxide 230.

Alternatively, to these insulators, aluminum oxide, bismuth oxide, germanium oxide, niobium oxide, silicon oxide, titanium oxide, tungsten oxide, yttrium oxide, or zirconium oxide may be added, for example. Alternatively, these insulators may be subjected to nitriding treatment. Silicon oxide, silicon oxynitride, or silicon nitride may be stacked over the above insulator.

Alternatively, for example, a single layer or stacked layers of an insulator containing what is called a high-k material such as aluminum oxide, hafnium oxide, tantalum oxide, zirconium oxide, lead zirconate titanate (PZT), strontium titanate ($SrTiO_3$), or $(Ba,Sr)TiO_3$ (BST) may be used for the insulator 222. With miniaturization and high integration of a transistor, a problem such as leakage current may arise because of a thinner gate insulator. When a high-k material is used for an insulator functioning as the gate insulator, a gate potential during operation of the transistor can be reduced while the physical thickness of the gate insulator is kept.

Note that the insulator 222 and the insulator 224 may each have a stacked-layer structure of two or more layers. In that case, without limitation to a stacked-layer structure formed of the same material, a stacked-layer structure formed of different materials may be employed.

The oxide 230 includes the oxide 230a, the oxide 230b over the oxide 230a, and the oxide 230c over the oxide 230b. Including the oxide 230a below the oxide 230b makes it possible to inhibit diffusion of impurities into the oxide 230b from the components formed below the oxide 230a. Moreover, including the oxide 230c over the oxide 230b makes it possible to inhibit diffusion of impurities into the oxide 230b from the components formed above the oxide 230c.

As illustrated in FIG. 2 and the like, the oxide 230d placed over the oxide 230c is preferably included. The oxide 230c preferably contains at least one of the metal elements contained in the metal oxide used as the oxide 230b, and further preferably contains all of these metal elements. Accordingly, the density of defect states at the interface between the oxide 230b and the oxide 230c can be decreased.

Note that the oxide 230 preferably has a stacked-layer structure of oxides that differ in the atomic ratio of metal atoms. Specifically, the atomic ratio of the element M to the constituent elements in the metal oxide used as the oxide 230a is preferably higher than the atomic ratio of the element M to the constituent elements in the metal oxide used as the oxide 230b. Moreover, the atomic ratio of the element M to In in the metal oxide used as the oxide 230a is preferably higher than the atomic ratio of the element M to In in the metal oxide used as the oxide 230b. Furthermore, the atomic ratio of In to the element M in the metal oxide used as the oxide 230b is preferably higher than the atomic ratio of In to the element M in the metal oxide used as the oxide 230a.

Thus, when the atomic ratio of In contained in the oxide 230a is made lower than the atomic ratio of In contained in the oxide 230b, the diffusion rate of oxygen in the oxide 230a can be made lower than that in the oxide 230b. Furthermore, when the atomic ratio of the element M (e.g., Ga) contained in the oxide 230a is made higher than the atomic ratio of the element M (e.g., Ga) contained in the oxide 230b, the diffusion rate of oxygen in the oxide 230a can be made lower than that in the oxide 230b.

A metal oxide that can be used as the oxide 230a or the oxide 230b can be used as the oxide 230c. Moreover, the atomic ratio of In in constituent elements in the metal oxide used as the oxide 230d is preferably lower than the atomic ratio of In in constituent elements in the metal oxide used as the oxide 230c. Furthermore, the atomic ratio of In to the element M in the metal oxide used as the oxide 230d is preferably lower than the atomic ratio of In to the element M in the metal oxide used as the oxide 230c.

Thus, when the atomic ratio of In contained in the oxide 230d is made lower than the atomic ratio of In contained in the oxide 230c, the diffusion rate of oxygen in the oxide 230d can be made lower than that in the oxide 230c. Furthermore, when the atomic ratio of the element M (e.g., Ga) contained in the oxide 230d is made higher than the atomic ratio of the element M (e.g., Ga) contained in the oxide 230c, the diffusion rate of oxygen in the oxide 230d can be made lower than that in the oxide 230c. Moreover, the oxide 230d can inhibit In from diffusing to the insulator 250 side.

The oxide 230b preferably has crystallinity. For example, a CAAC-OS is preferably used. An oxide having crystallinity, such as a CAAC-OS, has a dense structure with small amounts of impurities and defects (oxygen vacancies or the like) and high crystallinity. This can reduce oxygen extraction from the oxide 230b by the source electrode or the drain electrode. Therefore, oxygen extraction from the oxide 230b can be reduced even when heat treatment is performed; thus, the transistor 200 is stable with respect to high temperatures in a manufacturing process (what is called thermal budget).

The oxide 230c and the oxide 230d preferably have crystallinity; for example, a CAAC-OS is preferably used.

The energy of the conduction band minimum of each of the oxide 230a and the oxide 230d is preferably higher than the energy of the conduction band minimum of the oxide 230b. In other words, the electron affinity of each of the oxide 230a and the oxide 230d is preferably lower than the electron affinity of the oxide 230b.

Here, the energy level of the conduction band minimum gradually changes at junction portions of the oxide 230a, the oxide 230b, the oxide 230c, and the oxide 230d. In other words, the energy level of the conduction band minimum at the junction portions of the oxide 230a, the oxide 230b, the oxide 230c, and the oxide 230d continuously changes or is continuously connected. To obtain this, the density of defect states in a mixed layer formed at an interface between the oxide 230a and the oxide 230b and interfaces between the oxide 230b and the oxide 230c and between the oxide 230c and the oxide 230d is preferably decreased.

Specifically, as the oxide 230a, a metal oxide with In:Ga:Zn=1:3:4 [atomic ratio] or 1:1:0.5 [atomic ratio] is used. As the oxide 230b, a metal oxide with In:Ga:Zn=4:2:3 [atomic ratio] or 3:1:2 [atomic ratio] is used. As the oxide 230c, a metal oxide with In:Ga:Zn=1:3:4 [atomic ratio], In:Ga:Zn=4:2:3 [atomic ratio], Ga:Zn=2:1 [atomic ratio], or Ga:Zn=2:5 [atomic ratio] is used. Specific examples of the combination of the oxide 230c and the oxide 230d include a stacked-layer structure of In:Ga:Zn=4:2:3 [atomic ratio] and In:Ga:Zn=1:3:4 [atomic ratio], a stacked-layer structure of In:Ga:Zn=4:2:3 [atomic ratio] and Ga:Zn=2:1 [atomic ratio], a stacked-layer structure of In:Ga:Zn=4:2:3 [atomic ratio] and Ga:Zn=2:5 [atomic ratio], and a stacked-layer structure of In:Ga:Zn=4:2:3 [atomic ratio] and gallium oxide.

At this time, the oxide 230b and the vicinity of the interface between the oxide 230b and the oxide 230c serve as a main carrier path. When the oxide 230a and the oxide 230c have the above structure, the density of defect states at the interface between the oxide 230a and the oxide 230b and the interface between the oxide 230b and the oxide 230c can be decreased. Thus, the influence of interface scattering on carrier conduction is small, and the transistor 200 can have high on-state current and high frequency characteristics.

A metal oxide functioning as an oxide semiconductor is preferably used as the oxide 230. For example, as a metal oxide to be a region 234, it is preferable to use a metal oxide having a bandgap of 2 eV or more, preferably 2.5 eV or more. With the use of a metal oxide having such a wide bandgap, the off-state current of the transistor can be reduced. With the use of such a transistor, a semiconductor device with low power consumption can be provided.

Figure 3A:
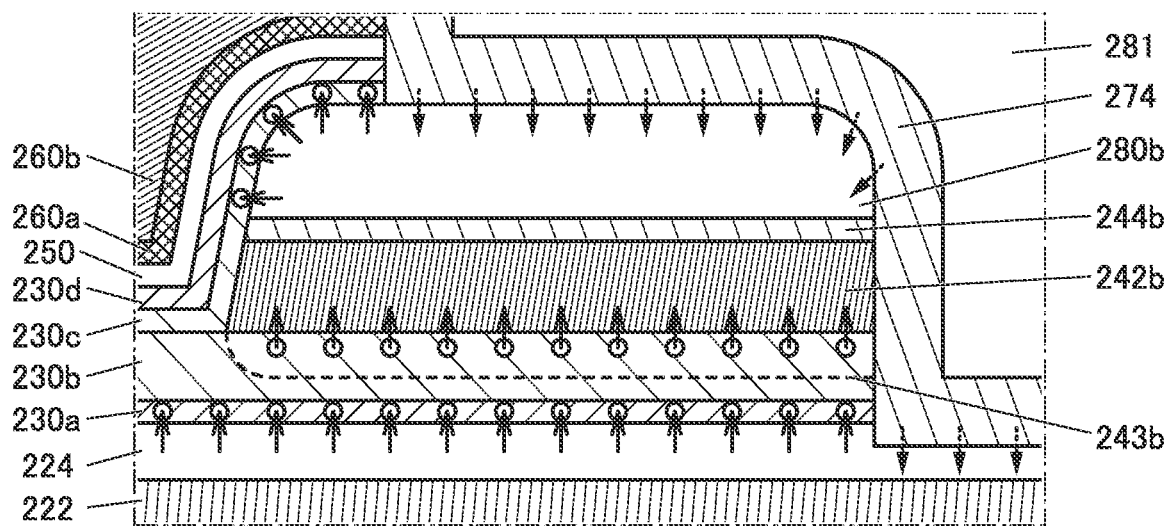
FIG. 3(A) and FIG. 3(B) are cross-sectional views of a semiconductor device of one embodiment of the present invention.
Figure 3B:
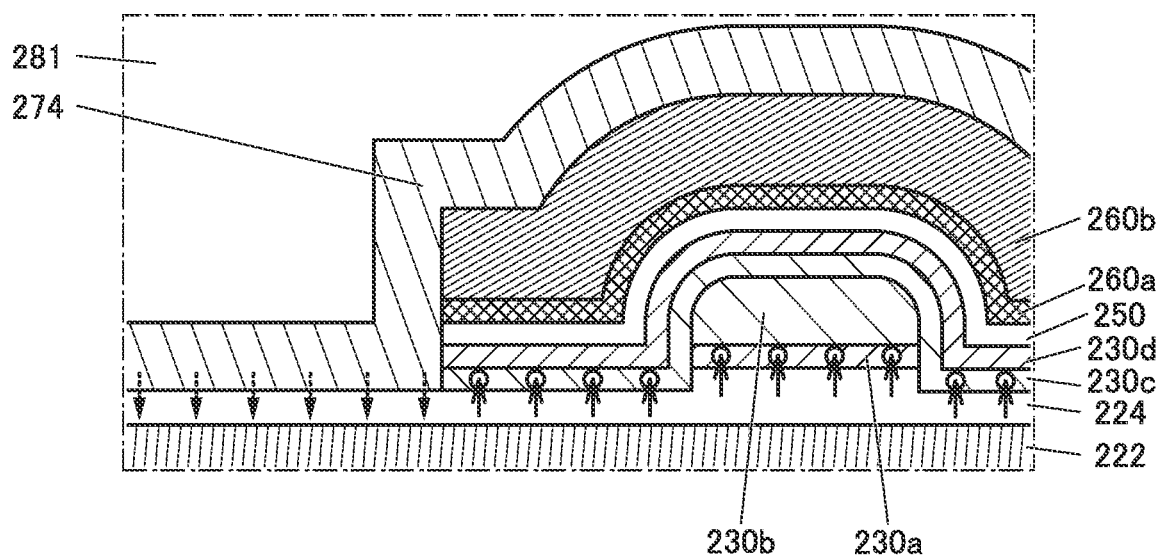

Here, the behavior of oxygen contained in the oxide insulator 280 at the time when heat treatment is performed in the fabrication process or after the fabrication of the transistor 200 of this embodiment will be described with reference to FIGS. 3(A) and 3(B). FIG. 3(A) is an enlarged view of the transistor 200 in the channel length direction, and FIG. 3(B) is an enlarged view of the transistor 200 in the channel width direction. Note that although FIG. 3(A) illustrates the conductor 242b side, the same applies to the conductor 242a side. Note that in FIGS. 3(A) and 3(B), solid arrows represent an example of the movement of oxygen diffused by heat treatment, dotted arrows represent an example of the movement of oxygen added at the time of depositing the insulator 274, and white circles represent oxygen vacancies formed in the oxide 230.

As illustrated in FIGS. 3(A) and 3(B), the heat treatment in the fabrication process or after the fabrication of the transistor 200 might cause oxygen absorption from the oxide 230b into the conductor 242b (the same applies to the conductor 242a), which forms oxygen vacancies in the oxide 230b in some cases. Here, oxygen in the oxide 230 is diffused into the oxide 230 by the above heat treatment so that the gradient of the oxygen vacancy concentration is reduced. In other words, oxygen vacancies formed in the vicinity of the interface between the oxide 230b and the conductor 242 are diffused into the oxide 230. Accordingly, oxygen vacancies are formed in a portion of the oxide 230 that functions as the channel formation region.

As illustrated in FIGS. 3(A) and 3(B), oxygen is released from the oxide insulator 280 and the oxygen is diffused by the above heat treatment to fill oxygen vacancies in the vicinity of the interface between the oxide insulator 280 and the oxide 230c. Similarly to the above, oxygen supplied from the oxide insulator 280 is also diffused into the oxide 230 so that the gradient of the oxygen vacancy concentration is reduced. Accordingly, oxygen is diffused also into the portion of the oxide 230 that functions as the channel formation region, so that oxygen vacancies are reduced.

At this time, providing the oxide 230d over the oxide 230c can reduce diffusion of oxygen in the oxide 230c into the insulator 250.

Note that as illustrated in FIGS. 3(A) and 3(B), the insulator 274 is deposited over the oxide insulator 280 in an atmosphere containing oxygen by a sputtering method, whereby oxygen can be added to the oxide insulator 280. At the same time, oxygen can be added to the insulator 224.

It is preferable that the oxide insulator 280 not be deprived of an excessive amount of oxygen during the above heat treatment. For example, when the conductor 260, the conductor 242a, and the conductor 242b are placed in contact with the oxide insulator 280, oxygen contained in the oxide insulator 280 might be absorbed into these conductors and unlikely to be supplied to the oxide 230. Furthermore, for example, when the insulator 250 or the insulator 281 is placed in contact with the oxide insulator 280, oxygen contained in the oxide insulator 280 might be absorbed into the conductor 260 through the insulator 250 or the insulator 281 and unlikely to be supplied to the oxide 230.

As described above, in the semiconductor device described in this embodiment, the oxide insulator 280 containing excess oxygen is isolated from the conductor 260 and the insulator 250 by the oxide 230c and the oxide 230d. Furthermore, the oxide insulator 280 containing excess oxygen is isolated from the conductor 242 by the insulator 244. Moreover, the oxide insulator 280 containing excess oxygen is isolated from the insulator 281 by the insulator 274. Thus, even when the above heat treatment is performed, oxygen contained in the oxide insulator 280 is not excessively diffused into the insulator 281, the conductor 260, the insulator 250, the conductor 242a, and the conductor 242b. Accordingly, oxygen in the oxide insulator 280 is not excessively decreased during the above heat treatment, and thus oxygen can be supplied from the oxide insulator 280 to the oxide 230.

In this embodiment, the oxide insulator 280 and the insulator 250 are isolated from each other, which inhibits oxygen from being supplied to the insulator 250. Accordingly, formation of defect states at the interface between the channel formation region and the insulator 250 can be prevented, and thus the reliability of the transistor 200 can be inhibited from being lowered.

In this embodiment, oxygen is not directly supplied to the channel formation region from the oxide insulator 280 but supplied to the channel formation region through the oxide 230c. Accordingly, the amount of oxygen supplied to the channel formation region can be reduced by the oxide 230c, which can inhibit supply of excess oxygen to the channel formation region and thus can inhibit a decrease in the reliability of the transistor 200.

As illustrated in FIGS. 3(A) and 3(B), oxygen can be supplied from the insulator 224 to the channel formation region of the oxide 230. Here, the oxide 230a and the oxide 230c are provided between the oxide 230b and the insulator 224, and oxygen is supplied to the channel formation region through the oxide 230a and the oxide 230c. Accordingly, the amount of oxygen supplied to the channel formation region can be reduced by the oxide 230a and the oxide 230c, so that a decrease in the reliability of the transistor 200 can be inhibited.

As described above, the oxygen vacancies generated in the oxide 230 by the heat treatment in the fabrication process or after the fabrication of the transistor 200 can be reduced by oxygen supplied from the oxide insulator 280. At this time, oxygen can be inhibited from being excessively supplied to the vicinity of the channel formation region of the oxide 230 and the vicinity of the interface between the channel formation region of the oxide 230 and the insulator 250. Accordingly, the deterioration of the electrical characteristics and reliability of the transistor 200 because of excess heat treatment (thermal budget) can be inhibited, and a semiconductor device having favorable electrical characteristics and reliability can be provided.

The conductor 242 (the conductor 242a and the conductor 242b) functioning as the source electrode and the drain electrode is provided over the oxide 230b. The thickness of the conductor 242 is greater than or equal to 1 nm and less than or equal to 50 nm, preferably greater than or equal to 2 nm and less than or equal to 25 nm, for example.

For the conductor 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements as its component; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

It is preferable that, like the insulator 222 or the like, the insulator 244 have a function of inhibiting diffusion of oxygen (e.g., an oxygen atom and an oxygen molecule) (or be less likely to allow the passage of the above oxygen). For example, the insulator 244 preferably has lower oxygen permeability than the insulator 224. Furthermore, as illustrated in FIGS. 2(B) and 2(C), the insulator 244a (the insulator 244b) is preferably in contact with the top surface of the conductor 242a (the conductor 242b) and the bottom surface of the oxide insulator 280a (the oxide insulator 280b). With such a structure, oxygen contained in the oxide insulator 280 can be inhibited from being absorbed into the conductor 242.

In addition, the insulator 244 preferably functions as a barrier insulating film that inhibits entry of impurities such as water or hydrogen into the conductor 242 from the oxide insulator 280. For example, the insulator 244 preferably has lower hydrogen permeability than the insulator 224.

The insulator 244 can have a multilayer structure of two or more layers. For example, the insulator 244 may have a two-layer structure in which a first layer is deposited by a sputtering method in an atmosphere containing oxygen, after which a second layer is deposited by an ALD method. An ALD method is a deposition method providing favorable coverage, and thus can prevent formation of disconnection or the like due to unevenness of the first layer.

An insulator containing an oxide of one or both of aluminum and hafnium is preferably deposited as the insulator 244, for example. Note that as the insulator containing an oxide of one or both of aluminum and hafnium, aluminum oxide, hafnium oxide, an oxide containing aluminum and hafnium (hafnium aluminate), or the like is preferably used. A nitride having a high barrier property, such as silicon nitride, may be used for the insulator 244.

The insulator 250 functions as a gate insulator. The insulator 250 is preferably placed in contact with a top surface of the oxide 230d. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which are thermally stable, are preferable.

Furthermore, a metal oxide may be provided between the insulator 250 and the conductor 260. The metal oxide preferably inhibits diffusion of oxygen from the insulator 250 into the conductor 260. Provision of the metal oxide that inhibits diffusion of oxygen inhibits diffusion of oxygen from the insulator 250 into the conductor 260, and oxidation of the conductor 260 can be prevented.

The metal oxide has a function of part of the gate insulator in some cases. Therefore, when silicon oxide, silicon oxynitride, or the like is used for the insulator 250, a metal oxide that is a high-k material with a high relative permittivity is preferably used as the metal oxide. When the gate insulator has a stacked-layer structure of the insulator 250 and the metal oxide, the stacked-layer structure can be thermally stable and have a high relative permittivity. Accordingly, a gate potential that is applied during operation of the transistor can be reduced while the physical thickness of the gate insulator is kept. In addition, the equivalent oxide thickness (EOT) of an insulator functioning as the gate insulator can be reduced.

Specifically, a metal oxide containing one kind or two or more kinds selected from hafnium, aluminum, gallium, yttrium, zirconium, tungsten, titanium, tantalum, nickel, germanium, magnesium, and the like can be used. It is particularly preferable to use an insulator containing an oxide of one or both of aluminum and hafnium, such as aluminum oxide, hafnium oxide, or an oxide containing aluminum and hafnium (hafnium aluminate).

Although the conductor 260 has a two-layer structure in which the conductor 260b is placed over the conductor 260a in FIG. 2, the conductor 260 may have a single-layer structure or a stacked-layer structure of three or more layers.

For the conductor 260a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use a conductive material having a function of inhibiting diffusion of oxygen (e.g., at least one of an oxygen atom, an oxygen molecule, and the like).

When the conductor 260a has a function of inhibiting diffusion of oxygen, it is possible to prevent a reduction in conductivity of the conductor 260b due to oxidation caused by oxygen contained in the insulator 250. As the conductive material having a function of inhibiting diffusion of oxygen, for example, tantalum, tantalum nitride, ruthenium, ruthenium oxide, or the like is preferably used.

Moreover, a conductive material containing tungsten, copper, or aluminum as its main component is preferably used for the conductor 260b. As the conductor 260 also functioning as a wiring, a conductor having high conductivity is preferably used. For example, a conductive material containing tungsten, copper, or aluminum as its main component can be used. In addition, the conductor 260b may have a stacked-layer structure, for example, a stacked-layer structure of any of the above conductive materials and titanium or titanium nitride.

The conductor 260 preferably covers a top surface and a side surface of the portion of the oxide 230b that functions as the channel formation region with the oxide 230c, the oxide 230d, and the insulator 250 therebetween. Accordingly, the electric field of the conductor 260 is likely to affect the portion of the oxide 230b that functions as the channel formation region. Thus, the on-state current of the transistor 200 can be increased and the frequency characteristics can be improved.

The oxide insulator 280a is provided to be surrounded by the insulator 274, the oxide 230c, and the insulator 244a. The oxide insulator 280b is provided to be surrounded by the insulator 274, the oxide 230c, and the insulator 244b. The oxide insulator 280 preferably contains oxygen that is released by heating. The oxide insulator 280 preferably has a thickness large enough to contain a large amount of oxygen; for example, the thickness is preferably 30 nm or more. Note that the oxide insulator 280 is not limited to having the above thickness as long as a sufficient amount of oxygen can be supplied.

For example, for the oxide insulator 280, silicon oxide, silicon oxynitride, silicon nitride oxide, silicon oxide to which fluorine is added, silicon oxide to which carbon is added, silicon oxide to which carbon and nitrogen are added, porous silicon oxide, or the like is preferably included. In particular, silicon oxide and silicon oxynitride, which are thermally stable, are preferable. Materials such as silicon oxide, silicon oxynitride, and porous silicon oxide, in each of which a region containing oxygen that is released by heating can be easily formed, are particularly preferable.

For the oxide insulator 280, specifically, an oxide material from which part of oxygen is released by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$, or greater than or equal to $3.0 \times 10^{20}$ atoms/cm$^3$ in TDS (Thermal Desorption Spectroscopy) analysis. Note that the temperature of the film surface in the above TDS analysis is preferably higher than or equal to 100° C. and lower than or equal to 700° C., or higher than or equal to 100° C. and lower than or equal to 400° C.

The concentration of impurities such as water or hydrogen in the oxide insulator 280 is preferably reduced. Furthermore, a diffusion coefficient of hydrogen in the oxide insulator 280 is preferably low.

Here, it is preferable that the side surface of the oxide insulator 280a, the side surface of the insulator 244a, and the side surface of the conductor 242a be substantially aligned with each other in a top view. Alternatively, it is preferable that the side surface of the oxide insulator 280a, the side surface of the insulator 244a, and the side surface of the conductor 242a be substantially aligned with each other. Furthermore, the same applies to the side surface of the oxide insulator 280b, the side surface of the insulator 244b, and the side surface of the conductor 242b. With such a structure, the insulator 274 can cover the oxide insulator 280, the insulator 244, and the conductor 242 with favorable coverage. Thus, oxygen can be prevented from diffusing from the oxide insulator 280. Moreover, impurities can be prevented from entering the oxide insulator 280 and the conductor 242.

It is preferable that, like the insulator 244 or the like, the insulator 274 have a function of inhibiting diffusion of oxygen (e.g., an oxygen atom and an oxygen molecule) (or be less likely to allow the passage of the above oxygen). The insulator 274 preferably has a lower oxygen permeability than the oxide insulator 280. As the insulator 274, an insulator that can be used as the insulator 244 and the like can be used. For the insulator 274, aluminum oxide deposited by a sputtering method can be used, for example. Furthermore, for example, a stacked-layer film of aluminum oxide deposited by a sputtering method and silicon nitride deposited thereover can be used.

In addition, the insulator 274 preferably functions as a barrier insulating film that inhibits the entry of impurities such as water or hydrogen into the transistor 200 from the insulator 281 side. For example, the insulator 274 preferably has a lower hydrogen permeability than the oxide insulator 280.

The insulator 274 is preferably in contact with the top surface and the side surface of the conductor 260, the side surface of the insulator 250, the side surfaces of the oxide 230c and the oxide 230d, the top surface and the side surface of the oxide insulator 280a, the top surface and the side surface of the oxide insulator 280b, the side surface of the insulator 244a, the side surface of the insulator 244b, the side surface of the conductor 242a, the side surface of the conductor 242b, the side surfaces of the oxide 230a and the oxide 230b, and the top surface of the insulator 224.

With the above structure, the oxide insulator 280 can be isolated from the conductor 260, the conductor 242, the insulator 250, the oxide 230b, and the insulator 281 by the insulator 244, the insulator 274, and the oxide 230c. Accordingly, oxygen contained in the oxide insulator 280 can be prevented from directly diffusing into the conductor 260, the conductor 242, the insulator 250, the oxide 230b, and the insulator 281.

It is preferable that the insulator 274 be deposited by a sputtering method. It is further preferable that the insulator 274 be deposited in an atmosphere containing oxygen by a sputtering method. When the insulator 274 is deposited by a sputtering method, excess oxygen can be added to the vicinity of a region of the oxide insulator 280 that is in contact with the insulator 274. Accordingly, oxygen can be supplied from the region to the oxide 230b through the oxide 230c. Here, with the insulator 274 having a function of inhibiting diffusion of oxygen, oxygen can be prevented from diffusing above and to the side surface direction of the oxide insulator 280. Moreover, with the insulator 244 having a function of inhibiting downward oxygen diffusion, oxygen can be prevented from diffusing downward from the oxide insulator 280. In the above manner, oxygen is supplied to the region of the oxide 230 that functions as the channel formation region. Accordingly, oxygen vacancies in the region of the oxide 230 that functions as the channel formation region can be reduced, so that the transistor can be inhibited from becoming normally on.

When the insulator 274 is deposited by a sputtering method, excess oxygen can also be added to the vicinity of a region of the insulator 224 that is in contact with the insulator 274.

Note that the insulator 274 preferably covers the side surfaces of the oxide 230a, the oxide 230b, the conductor 242, the insulator 244, and the oxide insulator 280 on the channel width direction side. With such a structure, impurities contained in the insulator 281 can be inhibited from being absorbed into the oxide 230a, the oxide 230b, the conductor 242, the insulator 244, and the oxide insulator 280.

The insulator 281 functioning as an interlayer film is preferably provided over the insulator 274. As in the insulator 224 or the like, the concentration of impurities such as water or hydrogen in the insulator 281 is preferably reduced.

The conductor 240a and the conductor 240b are placed in openings formed in the insulator 281, the insulator 274, the oxide insulator 280, and the insulator 244. The conductor 240a and the conductor 240b are provided to face each other with the conductor 260 therebetween. Note that top surfaces of the conductor 240a and the conductor 240b may be at the same level as the top surface of the insulator 281.

Note that the insulator 241a is provided in contact with an inner wall of the opening of the insulator 281, the insulator 274, the oxide insulator 280, and the insulator 244, and a first conductor of the conductor 240a is formed in contact with the side surface. The conductor 242a is located on at least part of a bottom portion of the opening, and thus the conductor 240a is in contact with the conductor 242a. Similarly, the insulator 241b is provided in contact with an inner wall of the opening of the insulator 281, the insulator 274, the oxide insulator 280, and the insulator 244, and a first conductor of the conductor 240b is formed in contact with the side surface. The conductor 242b is located on at least part of a bottom portion of the opening, and thus the conductor 240b is in contact with the conductor 242b.

For the conductor 240a and the conductor 240b, a conductive material containing tungsten, copper, or aluminum as its main component is preferably used. In addition, the conductor 240a and the conductor 240b may each have a stacked-layer structure.

In the case where the conductor 240 has a stacked-layer structure, a conductive material having a function of inhibiting the passage of impurities such as water or hydrogen is preferably used for a conductor in contact with the oxide 230a, the oxide 230b, the conductor 242, the insulator 244, the oxide insulator 280, the insulator 274, and the insulator 281. For example, tantalum, tantalum nitride, titanium, titanium nitride, ruthenium, ruthenium oxide, or the like is preferably used. A single layer or a stacked layer of the conductive material having a function of inhibiting the passage of impurities such as water or hydrogen may be used. The use of the conductive material can prevent oxygen added to the oxide insulator 280 from being absorbed into the conductor 240a and the conductor 240b. Furthermore, impurities such as water or hydrogen can be inhibited from entering the oxide 230 through the conductor 240a and the conductor 240b from a layer above the insulator 281.

As the insulator 241a and the insulator 241b, an insulator that can be used as the insulator 244 or the like (e.g., aluminum oxide or silicon nitride) is used. Since the insulator 241a and the insulator 241b are provided in contact with the insulator 244, impurities such as water or hydrogen can be inhibited from entering the oxide 230 through the conductor 240a and the conductor 240b from the oxide insulator 280 or the like. Furthermore, oxygen contained in the oxide insulator 280 can be prevented from being absorbed into the conductor 240a and the conductor 240b.

Moreover, although not illustrated, a conductor functioning as a wiring may be placed in contact with the top surface of the conductor 240a and the top surface of the conductor 240b. For the conductor functioning as a wiring, a conductive material containing tungsten, copper, or aluminum as its main component is preferably used. The conductor may have a stacked-layer structure, for example, a stacked layer of any of the above conductive materials and titanium or titanium nitride. Note that the conductor may be formed to be embedded in an opening provided in an insulator.

<Constituent Material of Semiconductor Device>

Constituent materials that can be used for the semiconductor device will be described below.

<<Substrate>>

As a substrate over which the transistor 200 is formed, an insulator substrate, a semiconductor substrate, or a conductor substrate may be used, for example. Examples of the insulator substrate include a glass substrate, a quartz substrate, a sapphire substrate, a stabilized zirconia substrate (an yttria-stabilized zirconia substrate or the like), and a resin substrate. Examples of the semiconductor substrate include a semiconductor substrate using silicon or germanium as a material and a compound semiconductor substrate including silicon carbide, silicon germanium, gallium arsenide, indium phosphide, zinc oxide, or gallium oxide. Moreover, a semiconductor substrate in which an insulator region is included in the above semiconductor substrate, for example, an SOI (Silicon On Insulator) substrate or the like is used. Examples of the conductor substrate include a graphite substrate, a metal substrate, an alloy substrate, and a conductive resin substrate. Alternatively, a substrate containing a metal nitride, a substrate containing a metal oxide, or the like is used. Furthermore, an insulator substrate provided with a conductor or a semiconductor, a semiconductor substrate provided with a conductor or an insulator, a conductor substrate provided with a semiconductor or an insulator, or the like is used. Alternatively, any of these substrates provided with an element may be used. Examples of the element provided for the substrate include a capacitor, a resistor, a switching element, a light-emitting element, and a memory element.

<<Insulator>>

Examples of an insulator include an oxide, a nitride, an oxynitride, a nitride oxide, a metal oxide, a metal oxynitride, and a metal nitride oxide, each of which has an insulating property.

For example, with miniaturization and high integration of a transistor, a problem such as leakage current may arise because of a thinner gate insulator. When a high-k material is used for an insulator functioning as the gate insulator, a voltage during operation of the transistor can be reduced while the physical thickness of the gate insulator is kept. By contrast, when a material with a low relative permittivity is used for the insulator functioning as an interlayer film, the parasitic capacitance generated between wirings can be reduced. Thus, a material is preferably selected depending on the function of an insulator.

Examples of the insulator having a high relative permittivity include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator having a low relative permittivity include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor using an oxide semiconductor is surrounded by insulators having a function of inhibiting the passage of oxygen and impurities such as hydrogen (e.g., the insulator 214, the insulator 222, the insulator 244, the insulator 274, and the like), the electrical characteristics of the transistor can be stable. As the insulator having a function of inhibiting the passage of oxygen and impurities such as hydrogen, a single layer or a stacked layer of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, for the insulator having a function of inhibiting the passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; a metal nitride such as aluminum nitride, aluminum titanium nitride, titanium nitride, silicon nitride oxide, or silicon nitride; or the like can be used.

Furthermore, the insulator functioning as the gate insulator is preferably an insulator including a region containing oxygen that is released by heating. For example, when a structure is employed in which silicon oxide or silicon oxynitride including a region containing oxygen that is released by heating is in contact with the oxide 230, oxygen vacancies included in the oxide 230 can be filled.

<<Conductor>>

For the conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements as its component; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a semiconductor having high electrical conductivity, typified by polycrystalline silicon containing an impurity element such as phosphorus, or silicide such as nickel silicide may be used.

Furthermore, a stack including a plurality of conductive layers formed with the above materials may be used. For example, a stacked-layer structure combining a material containing the above metal element and a conductive material containing oxygen may be employed.

Furthermore, a stacked-layer structure combining a material containing the above metal element and a conductive material containing nitrogen may be employed. Moreover, a stacked-layer structure combining a material containing the above metal element, a conductive material containing oxygen, and a conductive material containing nitrogen may be employed.

Note that when an oxide is used for the channel formation region of the transistor, a stacked-layer structure combining a material containing the above metal element and a conductive material containing oxygen is preferably employed for the conductor functioning as the gate electrode. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide in which a channel is formed. Furthermore, a conductive material containing the above metal element and nitrogen may be used. For example, a conductive material containing nitrogen, such as titanium nitride or tantalum nitride, may be used. Furthermore, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With the use of such a material, hydrogen contained in the metal oxide in which a channel is formed can be trapped in some cases. Alternatively, hydrogen entering from an external insulator or the like can be trapped in some cases.

<<Metal Oxide>>

As the oxide 230, a metal oxide functioning as an oxide semiconductor is preferably used. A metal oxide that can be used for the oxide 230 of the present invention will be described below.

The metal oxide preferably contains at least indium or zinc. In particular, indium and zinc are preferably contained. Furthermore, aluminum, gallium, yttrium, tin, or the like is preferably contained in addition to them. Furthermore, one kind or a plurality of kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, the element M, and zinc is considered. Note that the element M is aluminum, gallium, yttrium, tin, or the like. Examples of other elements that can be used as the element M include boron, titanium, iron, nickel, germanium, zirconium, molybdenum, lanthanum, cerium, neodymium, hafnium, tantalum, tungsten, and magnesium. Note that it is sometimes acceptable to use a plurality of the above elements in combination as the element M.

Note that in this specification and the like, a metal oxide containing nitrogen is also collectively referred to as a metal oxide in some cases. A metal oxide containing nitrogen may be referred to as a metal oxynitride.

[Structure of Metal Oxide]

Oxide semiconductors (metal oxides) can be classified into a single crystal oxide semiconductor and a non-single-crystal oxide semiconductor. Examples of the non-single-crystal oxide semiconductors include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

[Impurities]

Here, the influence of each impurity in the metal oxide will be described.

When the metal oxide contains an alkali metal or an alkaline earth metal, defect states are formed and carriers are generated, in some cases. Thus, a transistor using a metal oxide that contains an alkali metal or an alkaline earth metal in its channel formation region is likely to have normally-on characteristics. Therefore, it is preferable to reduce the concentration of an alkali metal or an alkaline earth metal in the metal oxide. Specifically, the concentration of an alkali metal or an alkaline earth metal in the metal oxide obtained by SIMS (the concentration obtained by secondary ion mass spectrometry (SIMS)) is set lower than or equal to $1\times10^{18}$ atoms/cm$^3$, preferably lower than or equal to $2\times10^{16}$ atoms/cm$^3$.

Hydrogen contained in a metal oxide reacts with oxygen bonded to a metal atom to become water, and thus forms oxygen vacancies, in some cases. When hydrogen enters the oxygen vacancies, an electron which is a carrier is generated in some cases. Furthermore, bonding of part of hydrogen to oxygen bonded to a metal atom causes generation of an electron serving as a carrier in some cases. Thus, a transistor using a metal oxide containing hydrogen is likely to have normally-on characteristics.

Accordingly, hydrogen in the metal oxide is preferably reduced as much as possible. Specifically, the hydrogen concentration of the metal oxide, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When a metal oxide in which impurities are sufficiently reduced is used in a channel formation region of a transistor, stable electrical characteristics can be given.

<Fabricating Method of Semiconductor Device>

Next, a method for fabricating the semiconductor device including the transistor 200 of the present invention, which is illustrated in FIG. 2, will be described with reference to FIG. 4 to FIG. 12. In FIG. 4 to FIG. 12, (A) of each drawing is a top view. Moreover, (B) of each drawing is a cross-sectional view corresponding to a portion indicated by the dashed-dotted line A1-A2 in (A), and is also a cross-sectional view of the transistor 200 in the channel length direction. Furthermore, (C) of each drawing is a cross-sectional view corresponding to a portion indicated by the dashed-dotted line A3-A4 in (A), and is also a cross-sectional view of the transistor 200 in the channel width direction. Note that for simplification of the drawings, some components are not illustrated in the top view of (A) of each drawing.

First, a substrate (not illustrated) is prepared, and the insulator 214 is deposited over the substrate. The insulator 214 can be deposited by a sputtering method, a chemical vapor deposition (CVD) method, a molecular beam epitaxy (MBE) method, a pulsed laser deposition (PLD) method, an atomic layer deposition (ALD) method, or the like.

Note that CVD methods can be classified into a plasma CVD (PECVD: Plasma Enhanced CVD) method using plasma, a thermal CVD (TCVD) method using heat, a photo CVD method using light, and the like. Moreover, the CVD methods can be classified into a metal CVD (MCVD) method and a metal organic CVD (MOCVD) method depending on a source gas to be used.

By a plasma CVD method, a high-quality film can be obtained at a relatively low temperature. Furthermore, a thermal CVD method is a deposition method that does not use plasma and thus enables less plasma damage to an object. For example, a wiring, an electrode, an element (e.g., transistor or capacitor), or the like included in a semiconductor device might be charged up by receiving charges from plasma. In this case, accumulated charges might break the wiring, electrode, element, or the like included in the semiconductor device. By contrast, in the case of a thermal CVD method that does not use plasma, such plasma damage is not caused and the yield of the semiconductor device can be increased. Furthermore, a thermal CVD method does not cause plasma damage during deposition, so that a film with few defects can be obtained.

In an ALD method, one atomic layer can be deposited at a time using self-regulating characteristics of atoms. Hence, an ALD method has effects such as deposition of an extremely thin film, deposition on a component with a large aspect ratio, deposition of a film with a small number of defects such as pinholes, deposition with excellent coverage, and low-temperature deposition. An ALD method includes a PEALD (Plasma Enhanced ALD) method, which is a deposition method using plasma. The use of plasma is sometimes preferable because deposition at a lower temperature is possible. Note that a precursor used in an ALD method sometimes contains impurities such as carbon. Thus, in some cases, a film provided by an ALD method contains impurities such as carbon in a larger amount than a film provided by another deposition method. Note that impurities can be quantified by X-ray photoelectron spectroscopy (XPS).

Unlike a deposition method in which particles ejected from a target or the like are deposited, a CVD method and an ALD method are deposition methods in which a film is formed by reaction at a surface of an object. Thus, an ALD method is a deposition method that enables favorable step coverage almost regardless of the shape of an object. In particular, an ALD method enables excellent step coverage and excellent thickness uniformity and thus is suitable for covering a surface of an opening portion with a high aspect ratio, for example. On the other hand, an ALD method has a relatively low deposition rate; thus, it is sometimes preferable to combine an ALD method with another deposition method with a high deposition rate such as a CVD method.

A CVD method and an ALD method enable control of the composition of a film to be obtained with a flow rate ratio of source gases. For example, by a CVD method and an ALD method, a film with a certain composition can be deposited depending on the flow rate ratio of the source gases. Moreover, for example, by a CVD method and an ALD method, by changing the flow rate ratio of the source gases during the deposition, a film whose composition is continuously changed can be deposited. In the case of depositing while changing the flow rate ratio of the source gases, as compared with the case of depositing with the use of a plurality of deposition chambers, time taken for the deposition can be shortened because time taken for transfer and pressure adjustment is omitted. Thus, the productivity of semiconductor devices can be improved in some cases.

In this embodiment, for the insulator 214, silicon nitride is deposited by a CVD method. As described here, an insulator through which copper is less likely to pass, such as silicon nitride, is used for the insulator 214; accordingly, even when a metal that is likely to diffuse, such as copper, is used for a conductor in a layer (not illustrated) below the insulator 214, diffusion of the metal into a layer above the insulator 214 can be inhibited.

Next, the insulator 216 is deposited over the insulator 214. The insulator 216 can be deposited by a sputtering method, a CVD method, an MBE method, a PLD method, an ALD method, or the like. In this embodiment, for the insulator 216, silicon oxide is deposited by a CVD method.

Next, an opening reaching the insulator 214 is formed in the insulator 216 by a lithography method. Examples of the opening include a groove and a slit. A region where the opening is formed may be referred to as an opening portion. A wet etching method may be used for the formation of the opening; however, a dry etching method is preferably used for microfabrication. As the insulator 214, it is preferable to select an insulator that functions as an etching stopper used in forming the opening by etching the insulator 216. For example, in the case where silicon oxide is used for the insulator 216 in which the opening is formed, silicon nitride, aluminum oxide, or hafnium oxide is preferably used for the insulator 214 as the insulator that functions as an etching stopper.

In the lithography method, first, a resist is exposed to light through a mask. Next, a region exposed to light is removed or left using a developing solution, so that a resist mask is formed. Then, etching treatment through the resist mask is performed, whereby a conductor, a semiconductor, an insulator, or the like can be processed into a desired shape. The resist mask is formed by, for example, exposure of the resist to light using KrF excimer laser light, ArF excimer laser light, EUV (Extreme Ultraviolet) light, or the like. Alternatively, a liquid immersion technique may be employed in which a portion between a substrate and a projection lens is filled with liquid (e.g., water) to perform light exposure. An electron beam or an ion beam may be used instead of the above light. Note that a mask is not necessary in the case of using an electron beam or an ion beam. Note that the resist mask can be removed by dry etching treatment such as to ashing, wet etching treatment, wet etching treatment after dry etching treatment, or dry etching treatment after wet etching treatment.

A hard mask formed of an insulator or a conductor may be used instead of the resist mask. In the case where a hard mask is used, a hard mask with a desired shape can be formed by forming an insulating film or a conductive film to be a hard mask material over the insulating film to be the insulator 216, forming a resist mask thereover, and then etching the hard mask material. The etching of the insulating film to be the insulator 216 may be performed after removal of the resist mask or with the resist mask remaining. In the latter case, the resist mask sometimes disappears during the etching. The hard mask may be removed by etching after the etching of the insulating film to be the insulator 216. Meanwhile, the hard mask does not need to be removed in the case where the material of the hard mask does not affect a later process or can be utilized in a later process.

As a dry etching apparatus, a capacitively coupled plasma (CCP) etching apparatus including parallel plate type electrodes can be used. The capacitively coupled plasma etching apparatus including the parallel plate type electrodes may have a structure in which a high-frequency power is applied to one of the parallel plate type electrodes. Alternatively, a structure may be employed in which different high-frequency powers are applied to one of the parallel plate type electrodes. Alternatively, a structure may be employed in which high-frequency power sources with the same frequency are applied to the parallel plate type electrodes. Alternatively, a structure may be employed in which high-frequency power sources with different frequencies are applied to the parallel plate type electrodes. Alternatively, a dry etching apparatus including a high-density plasma source can be used. As the dry etching apparatus including a high-density plasma source, an inductively coupled plasma (ICP) etching apparatus can be used, for example.

After the formation of the opening, a conductive film to be the conductor 205a is formed. A conductive barrier film having a function of inhibiting the passage of impurities and oxygen is preferably used as the conductive film. For example, tantalum nitride, tungsten nitride, or titanium nitride can be used. Alternatively, a stacked-layer film with tantalum, tungsten, titanium, molybdenum, aluminum, copper, or a molybdenum-tungsten alloy can be used. The conductive film to be the conductor 205a can be deposited by a sputtering method, a CVD method, an MBE method, a PLD method, an ALD method, or the like.

In this embodiment, as the conductive film to be the conductor 205a, tantalum nitride or a film of tantalum nitride and titanium nitride stacked thereover is deposited. With the use of such a metal nitride as the conductor 205a, even when a metal that is likely to diffuse, such as copper, is used for the conductor 205b, the metal can be inhibited from diffusing outward through the conductor 205a.

Next, a conductive film to be the conductor 205b is deposited over the conductive film to be the conductor 205a. The conductive film can be deposited by a sputtering method, a CVD method, an MBE method, a PLD method, an ALD method, or the like. In this embodiment, a low-resistance conductive material such as tungsten, copper, or aluminum is deposited for the conductive film to be the conductor 205b.

Next, CMP (Chemical Mechanical Polishing) treatment is performed to remove by polishing part of the conductive film to be the conductor 205a and part of the conductive film to be the conductor 205b to expose the insulator 216. As a result, the conductive film to be the conductor 205a and the conductive film to be the conductor 205b remain only in the opening portion. Accordingly, the conductor 205 including the conductor 205a and the conductor 205b, which has a planar top surface, can be formed (see FIG. 4). Note that the insulator 216 is partly removed by the CMP treatment in some cases.

Note that the method for fabricating the insulator 216 and the conductor 205 is not limited to the above. For example, a conductive film to be the conductor 205 is deposited over the insulator 214, and the conductive film is processed by a lithography method to form the conductor 205. Next, the insulating film to be the insulator 216 may be provided to cover the conductor 205 and part of the insulating film may be removed by CMP treatment until part of the conductor 205 is exposed, so that the conductor 205 and the insulator 216 may be formed.

The conductor 205 and the insulator 216 are formed by CMP treatment as described above, whereby the planarity of the top surfaces of the conductor 205 and the insulator 216 can be improved, and the crystallinity of the CAAC-OS that forms the oxide 230a, the oxide 230b, and the oxide 230c in a later process, can be improved.

Next, the insulator 222 is deposited over the insulator 216 and the conductor 205. An insulator containing an oxide of one or both of aluminum and hafnium is preferably deposited as the insulator 222. Note that as the insulator containing an oxide of one or both of aluminum and hafnium, aluminum oxide, hafnium oxide, an oxide containing aluminum and hafnium (hafnium to aluminate), or the like is preferably used. The insulator containing an oxide of one or both of aluminum and hafnium has a barrier property against oxygen, hydrogen, and water. When the insulator 222 has a barrier property against hydrogen and water, hydrogen and water contained in structure bodies provided around the transistor 200 are inhibited from diffusing into the transistor 200 through the insulator 222, and generation of oxygen vacancies in the oxide 230 can be inhibited.

The insulator 222 can be deposited by a sputtering method, a CVD method, an MBE method, a PLD method, an ALD method, or the like.

Then, an insulating film to be the insulator 224 is deposited over the insulator 222. The insulating film to be the insulator 224 can be deposited by a sputtering method, a CVD method, an MBE method, a PLD method, an ALD method, or the like.

Next, heat treatment is preferably performed. The heat treatment may be performed at a temperature higher than or equal to 250° C. and lower than or equal to 650° C., preferably higher than or equal to 300° C. and lower than or equal to 500° C., further preferably higher than or equal to 320° C. and lower than or equal to 450° C. Note that the heat treatment is performed in a nitrogen atmosphere, an inert gas atmosphere, or an atmosphere containing an oxidizing gas at 10 ppm or more, 1% or more, or 10% or more. Alternatively, the heat treatment may be performed under reduced pressure. Alternatively, the heat treatment may be performed in such a manner that heat treatment is performed in a nitrogen atmosphere or an inert gas atmosphere, and then another heat treatment is performed in an atmosphere containing an oxidizing gas at 10 ppm or more, 1% or more, or 10% or more in order to compensate for released oxygen.

In this embodiment, treatment is performed at 400° C. in a nitrogen atmosphere for one hour, and successively another treatment is performed at 400° C. in an oxygen atmosphere for one hour. By the heat treatment, impurities such as water and hydrogen contained in the insulator 224 can be removed, for example.

The heat treatment may be performed after the insulator 222 is deposited. For the heat treatment, the conditions for the above heat treatment can be used.

Here, plasma treatment containing oxygen may be performed under reduced pressure so that an excess-oxygen region can be formed in the insulator 224. The plasma treatment containing oxygen is preferably performed using an apparatus including a power source for generating high-density plasma using microwaves, for example. Alternatively, a power source for applying an RF (Radio Frequency) to the substrate side may be included. The use of high-density plasma enables high-density oxygen radicals to be generated, and RF application to the substrate side allows the oxygen radicals generated by the high-density plasma to be efficiently introduced into the insulator 224. Alternatively, after plasma treatment containing an inert gas is performed with this apparatus, plasma treatment containing oxygen may be performed to compensate for released oxygen. Note that impurities such as water and hydrogen contained in the insulator 224 can be removed by selecting the conditions for the plasma treatment appropriately. In that case, the heat treatment is not necessarily performed.

Here, aluminum oxide may be deposited over the insulator 224 by a sputtering method and the aluminum oxide may be subjected to CMP until the insulator 224 is reached. The CMP can planarize a surface of the insulator 224 and smooth the surface of the insulator 224. When the CMP is performed on the aluminum oxide placed over the insulator 224, it is easy to detect the endpoint of CMP. Although part of the insulator 224 is polished by CMP and the thickness of the insulator 224 is reduced in some cases, the thickness can be adjusted when the insulator 224 is deposited. Planarizing and smoothing the surface of the insulator 224 can prevent deterioration of the coverage with an oxide deposited later and prevent a decrease in the yield of the semiconductor device in some cases. The deposition of aluminum oxide over the insulator 224 by a sputtering method is preferred because oxygen can be added to the insulator 224.

Next, an oxide film 230A and an oxide film 230B are deposited in this order over the insulator 224. Note that the oxide films are preferably deposited successively without exposure to an atmospheric environment. By the deposition without exposure to the air, impurities or moisture from the atmospheric environment can be prevented from being attached onto the oxide films to be the oxide film 230A and the oxide film 230B, so that the vicinity of the interface between the oxide film 230A and the oxide film 230B can be kept clean.

The oxide film 230A and the oxide film 230B can be deposited by a sputtering method, a CVD method, an MBE method, a PLD method, an ALD method, or the like.

In the case where the oxide film 230A and the oxide film 230B are deposited by a sputtering method, for example, oxygen or a mixed gas of oxygen and a rare gas is used as a sputtering gas. The amount of excess oxygen in the oxide film to be deposited can be increased by an increase in the proportion of oxygen contained in the sputtering gas. In the case where the above oxide film is deposited by a sputtering method, the above In-M-Zn oxide target can be used.

In particular, at the time of depositing the oxide film 230A, part of oxygen contained in the sputtering gas is supplied to the insulator 224 in some cases. Therefore, the proportion of oxygen contained in the sputtering gas for the oxide film 230A is 70% or higher, preferably 80% or higher, and further preferably 100%.

In the case where the oxide film 230B is formed by a sputtering method, when the proportion of oxygen contained in the sputtering gas is higher than or equal to 1% and lower than or equal to 30%, preferably higher than or equal to 5% and lower than or equal to 20% during the deposition, an oxygen-deficient oxide semiconductor is formed. In a transistor using an oxygen-deficient oxide semiconductor for its channel formation region, relatively high field-effect mobility can be obtained. Furthermore, when the deposition is performed while the substrate is heated, the crystallinity of the oxide film can be improved. Note that one embodiment of the present invention is not limited thereto. In the case where the oxide film 230B is formed by a sputtering method, when the proportion of oxygen contained in the sputtering gas is higher than 30% and lower than or equal to 100%, preferably higher than or equal to 70% and lower than or equal to 100% during the deposition, an oxygen-excess oxide semiconductor is formed. In a transistor using an oxygen-excess oxide semiconductor for its channel formation region, relatively high reliability can be obtained.

In this embodiment, the oxide film 230A is formed by a sputtering method using a target with In:Ga:Zn=1:1:0.5 [atomic ratio] (2:2:1 [atomic ratio]) or 1:3:4 [atomic ratio]. In addition, the oxide film 230B is formed by a sputtering method using a target with In:Ga:Zn=4:2:4.1 [atomic ratio]. Note that each of the oxide films is formed to have characteristics required for the oxide 230 by appropriate selection of deposition conditions and an atomic ratio.

Here, the insulator 222, the insulator 224, the oxide film 230A, and the oxide film 230B are preferably deposited without exposure to the air. For example, a multi-chamber deposition apparatus is used.

Next, heat treatment may be performed. For the heat treatment, the conditions for the above heat treatment can be used. Through the heat treatment, impurities such as water and hydrogen in the oxide film 230A and the oxide film 230B can be removed, for example. In this embodiment, treatment is performed at 400° C. in a nitrogen atmosphere for one hour, and successively another treatment is performed at 400° C. in an oxygen atmosphere for one hour.

Figure 4A:
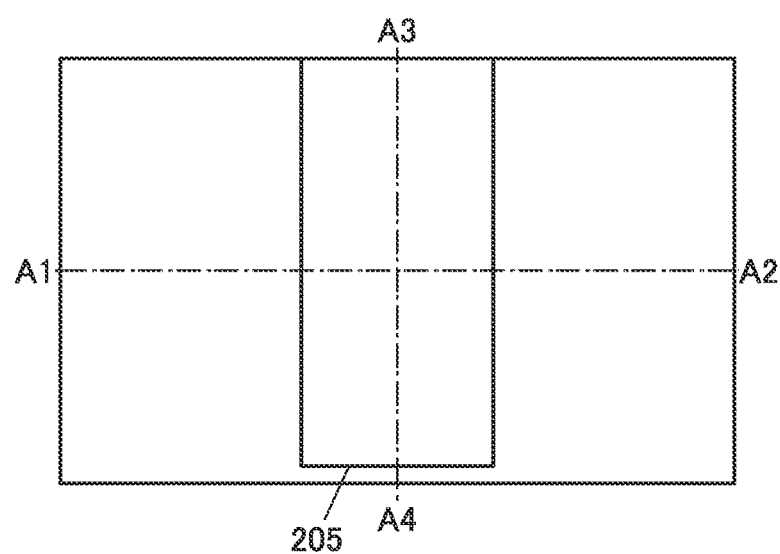
FIG. 4(A) is a top view illustrating a method for fabricating a semiconductor device of one embodiment of the present invention.
Figure 4C:
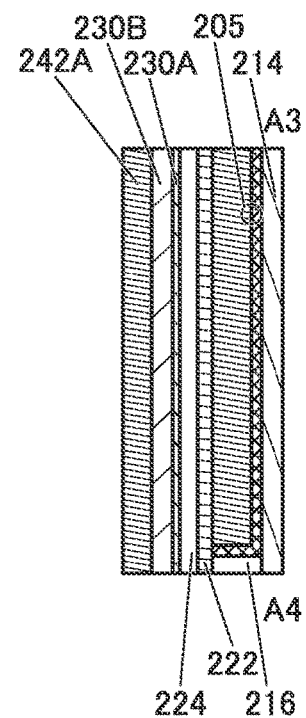
FIG. 4(B) and FIG. 4(C) are cross-sectional views illustrating a method for fabricating the semiconductor device of one embodiment of the present invention.
Figure 4B:
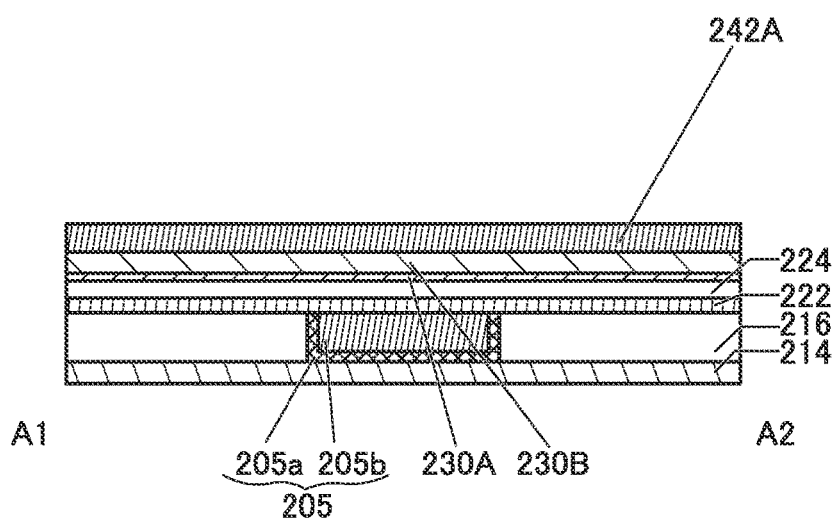

Then, a conductive film 242A is deposited over the oxide film 230B (see FIG. 4). The conductive film 242A can be deposited by a sputtering method, a CVD method, an MBE method, a PLD method, an ALD method, or the like.

Next, an insulating film 244A is deposited over the conductive film 242A. An insulating film containing an oxide of one or both of aluminum and hafnium is preferably deposited as the insulating film 244A. Note that as the insulating film containing an oxide of one or both of aluminum and hafnium, aluminum oxide, hafnium oxide, an oxide containing aluminum and hafnium (hafnium aluminate), or the like is preferably used. The insulating film containing an oxide of one or both of aluminum and hafnium has a barrier property against oxygen, hydrogen, and water. The insulating film 244A can be deposited by a sputtering method, a CVD method, an MBE method, a PLD method, an ALD method, or the like.

Then, an oxide insulating film 280A is deposited over the insulating film 244A. The oxide insulating film 280A can be deposited by a sputtering method, a CVD method, an MBE method, a PLD method, an ALD method, or the like. A silicon oxynitride film may be deposited by a PECVD method as the oxide insulating film 280A, for example. A silicon oxide film may be deposited by a sputtering method as an insulating film to be the oxide insulating film 280A, for example. For example, as the insulating film to be the oxide insulating film 280A, a silicon oxide film may be deposited by a sputtering method, and a silicon oxynitride film may be deposited thereover by a PECVD method.

Figure 5A:
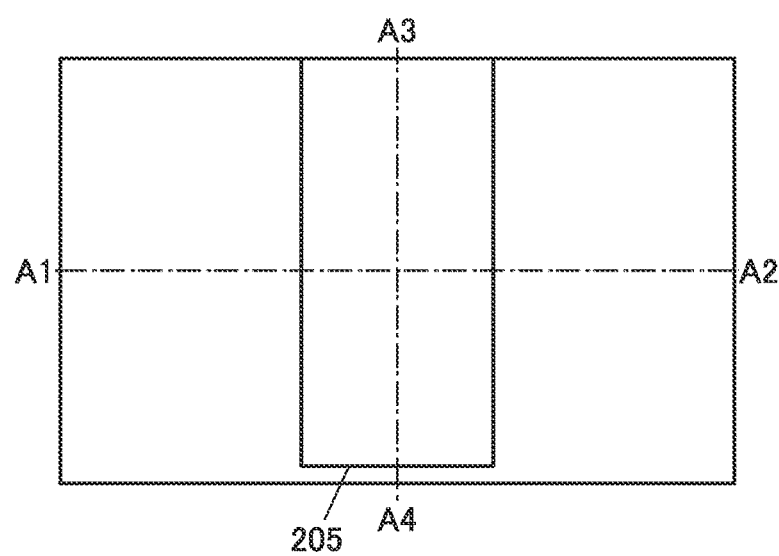
FIG. 5(A) is a top view illustrating a method for fabricating a semiconductor device of one embodiment of the present invention.
Figure 5C:
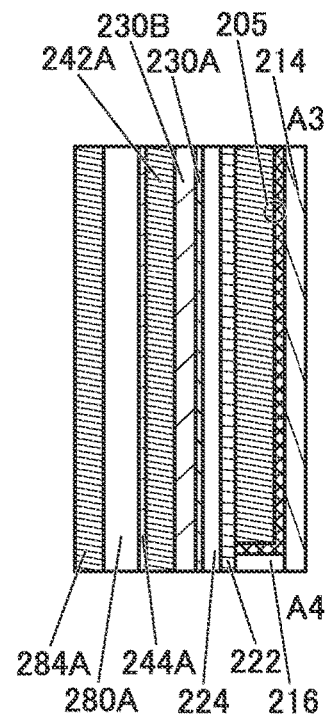
FIG. 5(B) and FIG. 5(C) are cross-sectional views illustrating a method for fabricating the semiconductor device of one embodiment of the present invention.
Figure 5B:
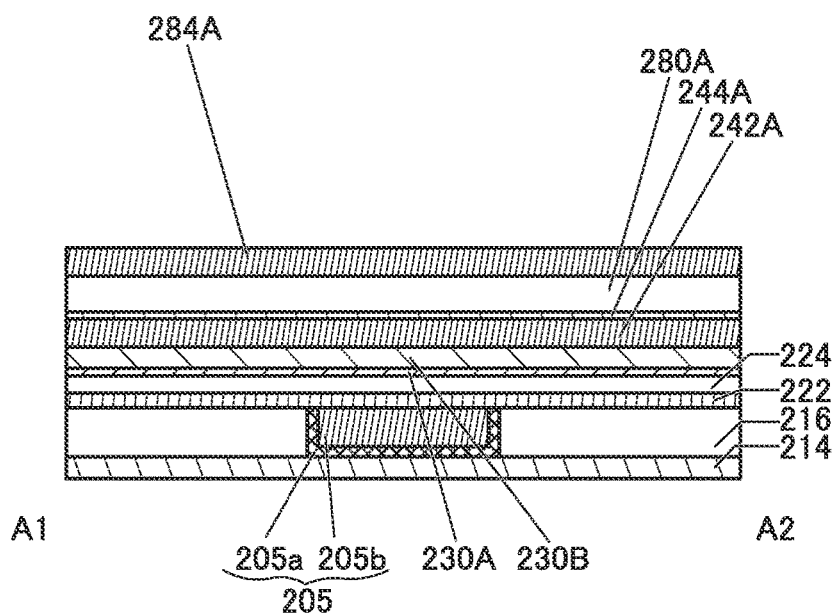

Next, a conductive film 284A is deposited over the oxide insulating film 280A (see FIG. 5). The conductive film 284A can be deposited by a sputtering method, a CVD method, an MBE method, a PLD method, an ALD method, or the like. As the conductive film 284A, a conductive film similar to the conductive film 242A is preferably used.

Note that the insulator 222, the insulator 224, the oxide film 230A, the oxide film 230B, the conductive film 242A, the insulating film 244A, the oxide insulating film 280A, and the conductive film 284A described above may be successively deposited in this order.

When the insulator 222, the insulator 224, the oxide film 230A, the oxide film 230B, the conductive film 242A, the insulating film 244A, the oxide insulating film 280A, and the conductive film 284A are successively deposited in this order without exposure to the air, surface adsorbed water and the like can be inhibited from being adsorbed by each surface of the insulating films, the oxide films, and the conductive films. Therefore, each interface of the above stacked-layer films is not exposed to the air; thus, concentration of impurities is reduced. Furthermore, impurities such as water and hydrogen can be inhibited from entering the insulating films, the oxide films, the conductive films, and the like.

In order to deposit the insulator 222, the insulator 224, the oxide film 230A, the oxide film 230B, the conductive film 242A, the insulating film 244A, and the conductive film 284A in this order without exposure to the air, a multi-chamber apparatus with a plurality of treatment chambers in which different kinds of films can be successively deposited is preferably used.

Figure 6A:
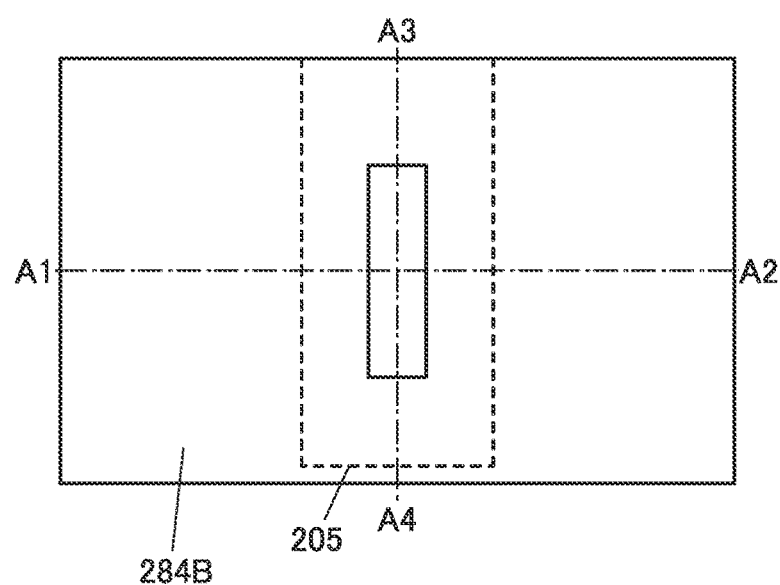
FIG. 6(A) is a top view illustrating a method for fabricating a semiconductor device of one embodiment of the present invention.
Figure 6C:
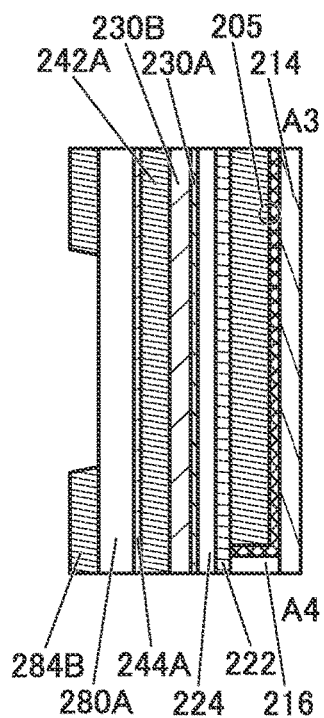
FIG. 6(B) and FIG. 6(C) are cross-sectional views illustrating a method for fabricating the semiconductor device of one embodiment of the present invention.
Figure 6B:
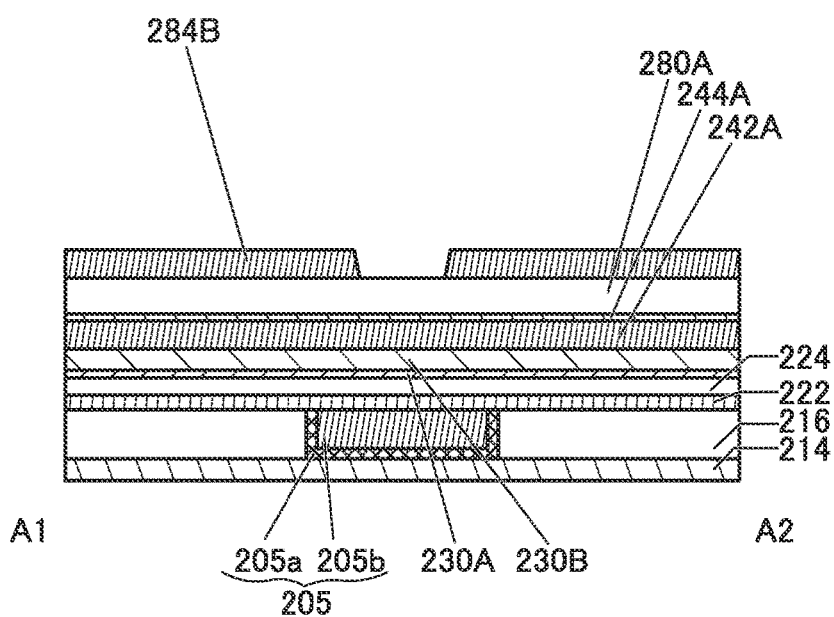

Then, the conductive film 284A is processed by a lithography method to form a conductor layer 284B (see FIG. 6). Through the processing, a cross section preferably has a tapered shape. The taper angle with respect to a plane parallel to a bottom surface of the substrate is greater than or equal to 30° and less than 75°, preferably greater than or equal to 30° and less than 70°. With such a taper angle, coverage with films deposited in the following process can be improved. In addition, the processing is preferably performed by a dry etching method. The processing by a dry etching method is suitable for microfabrication and the above processing into a tapered shape.

Figure 7A:
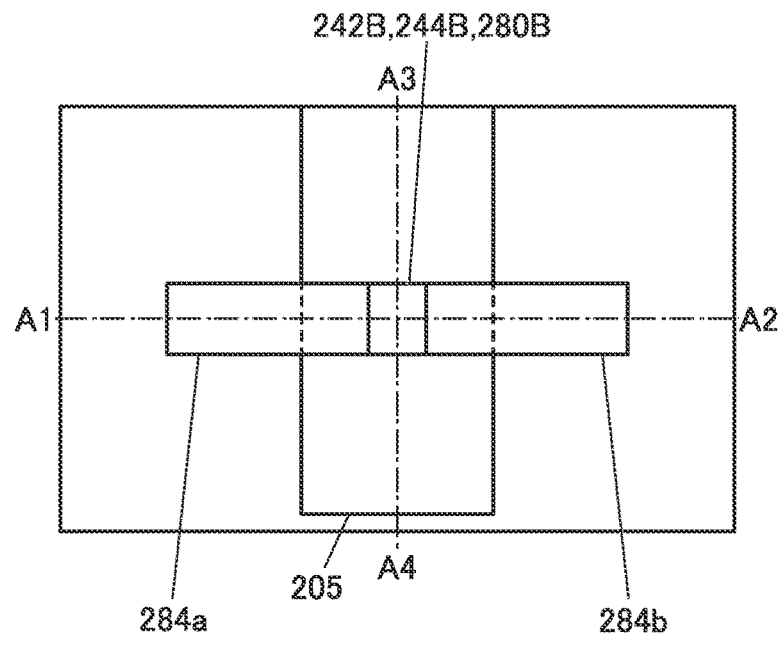
FIG. 7(A) is a top view illustrating a method for fabricating a semiconductor device of one embodiment of the present invention.
Figure 7C:
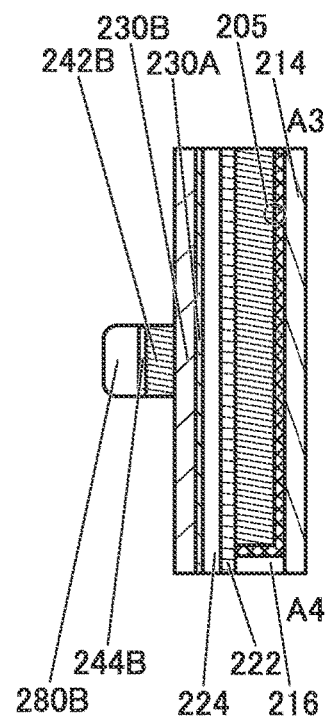
FIG. 7(B) and FIG. 7(C) are cross-sectional views illustrating a method for fabricating the semiconductor device of one embodiment of the present invention.
Figure 7B:
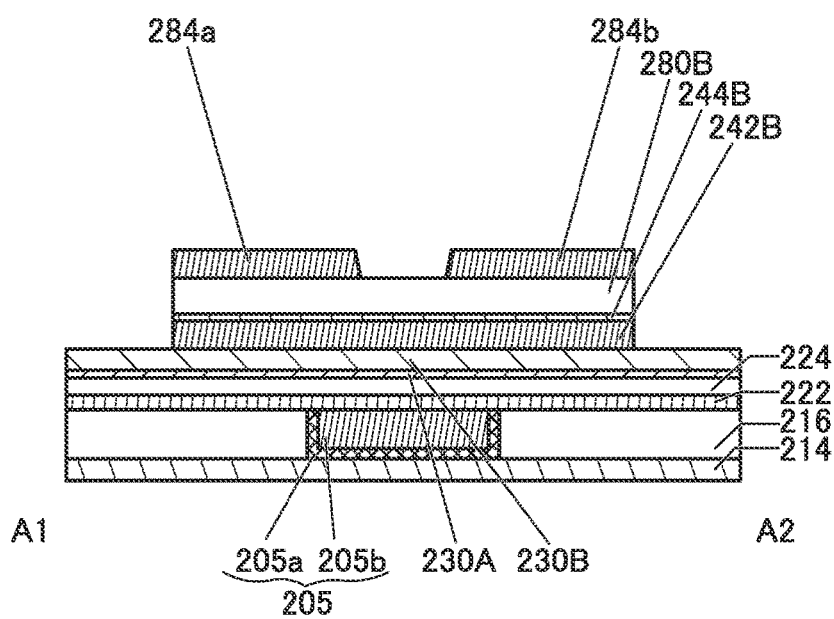
Figure 8A:
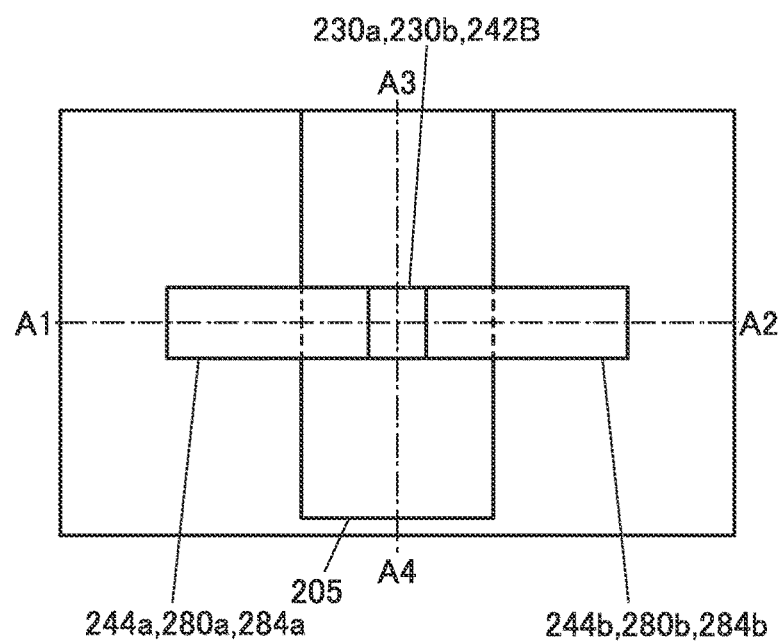
FIG. 8(A) is a top view illustrating a method for fabricating a semiconductor device of one embodiment of the present invention.
Figure 8C:
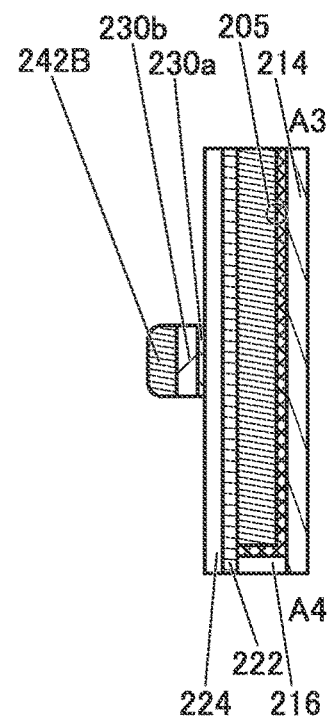
FIG. 8(B) and FIG. 8(C) are cross-sectional views illustrating a method for fabricating the semiconductor device of one embodiment of the present invention.
Figure 8B:
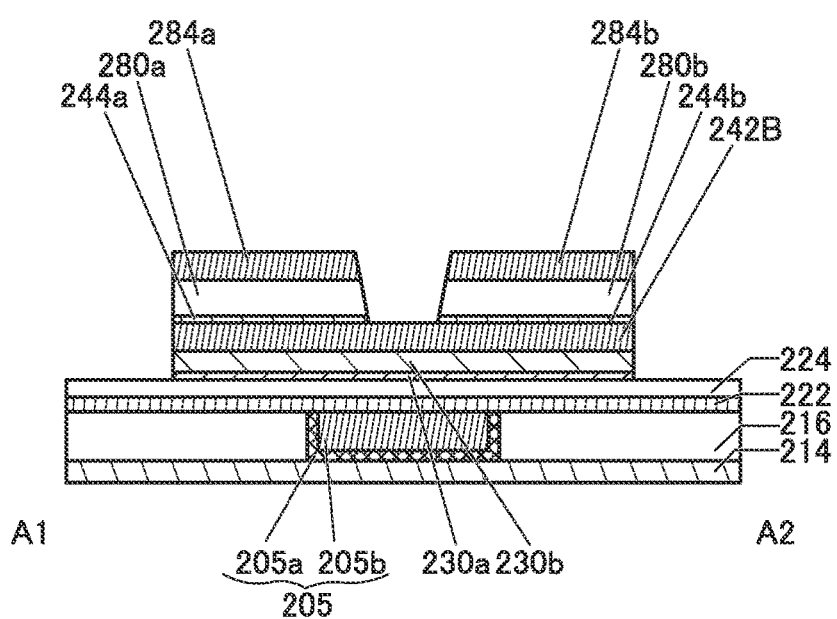

Next, the conductor layer 284B, the oxide insulating film 280A, the insulating film 244A, and the conductive film 242A are etched in an island shape by a lithography method, and a conductor 284a, a conductor 284b, an insulator layer 280B, an insulator layer 244B, and a conductor layer 242B are formed (see FIG. 7).

Next, the oxide film 230A and the oxide film 230B are etched with the use of the conductor 284a, the conductor 284b, the insulator layer 280B, and an exposed portion of a surface of the insulator layer 244B as etching masks to form an oxide 230a and an oxide 230b. At the same time, a region of the insulator layer 280B and the insulator layer 244B over the conductor layer 242B and sandwiched between the conductor 284a and the conductor 284b is etched, whereby the oxide insulator 280a, the oxide insulator 280b, the insulator 244a, and the insulator 244b are formed (see FIG. 8).

It is preferable to perform processing using an etching condition where the etching rate of the oxide film 230A and the oxide film 230B are higher than the etching rate of the conductor 284a, the conductor 284b, and the conductor layer 242B. When the etching rate of the conductor 284a, the conductor 284b, and the conductor layer 242B is 1, the etching rate of the oxide film 230A and the oxide film 230B is set to larger than or equal to 3 and lower than or equal to 50, preferably larger than or equal to 5 and lower than or equal to 30.

Figure 9A:
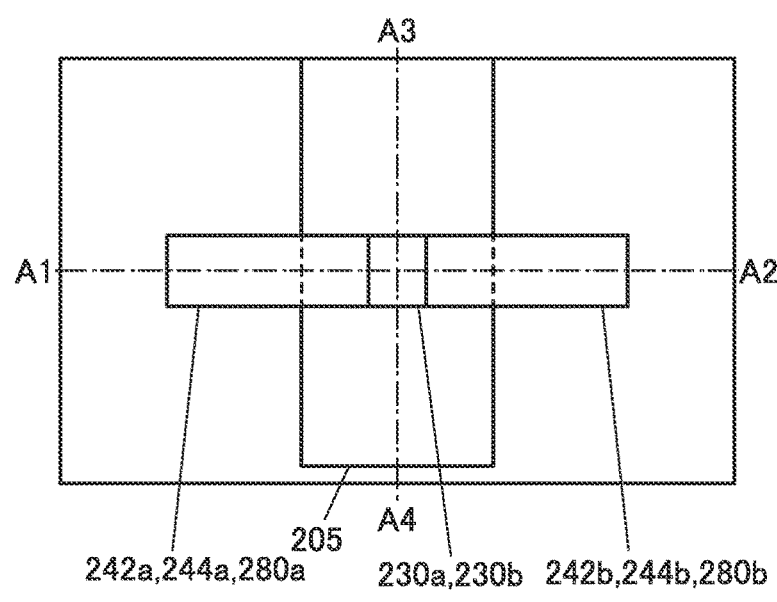
FIG. 9(A) is a top view illustrating a method for fabricating a semiconductor device of one embodiment of the present invention.
Figure 9C:
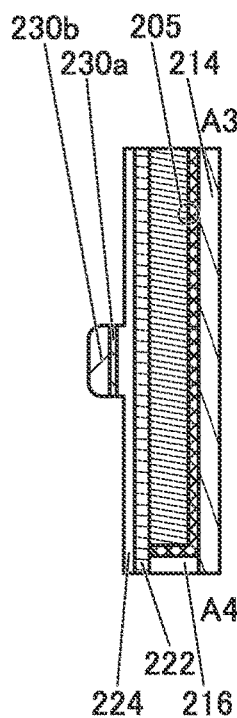
FIG. 9(B) and FIG. 9(C) are cross-sectional views illustrating a method for fabricating the semiconductor device of one embodiment of the present invention.
Figure 9B:
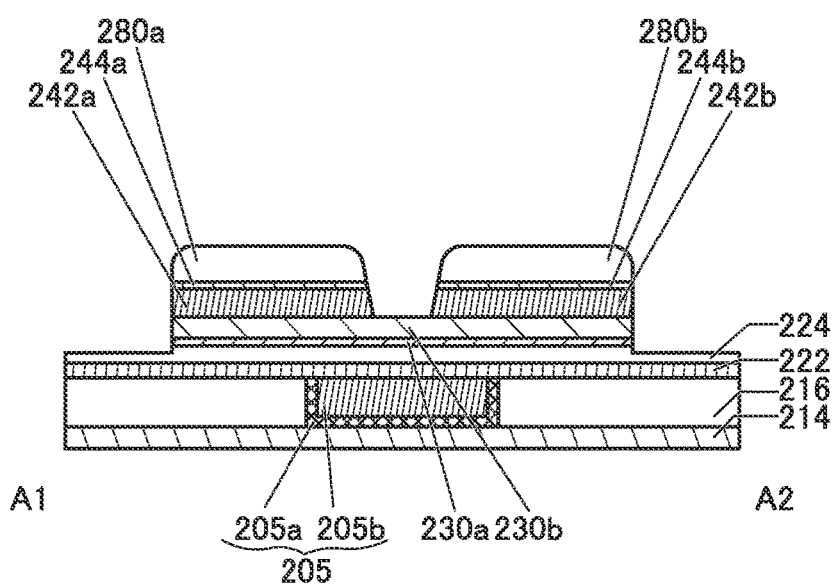
Figure 10A:
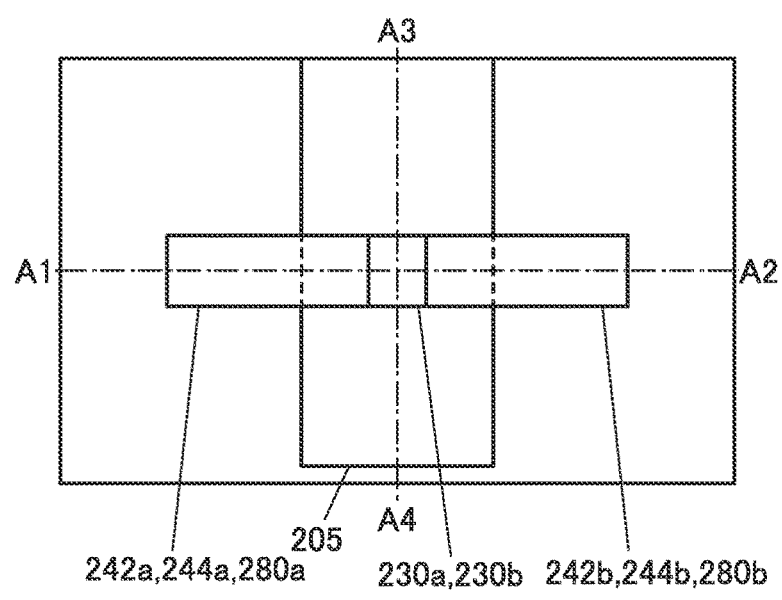
FIG. 10(A) is a top view illustrating a method for fabricating a semiconductor device of one embodiment of the present invention.
Figure 10C:
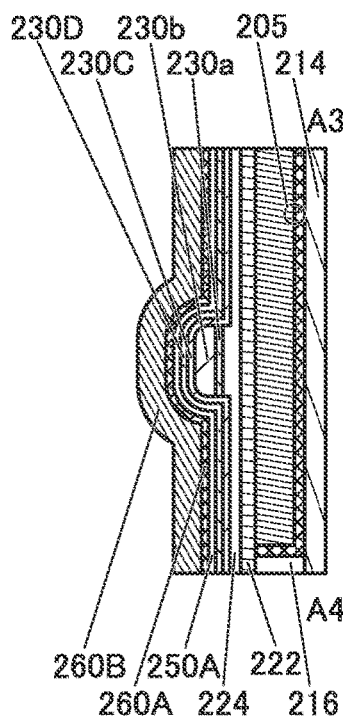
FIG. 10(B) and FIG. 10(C) are cross-sectional views illustrating a method for fabricating the semiconductor device of one embodiment of the present invention.
Figure 10B:
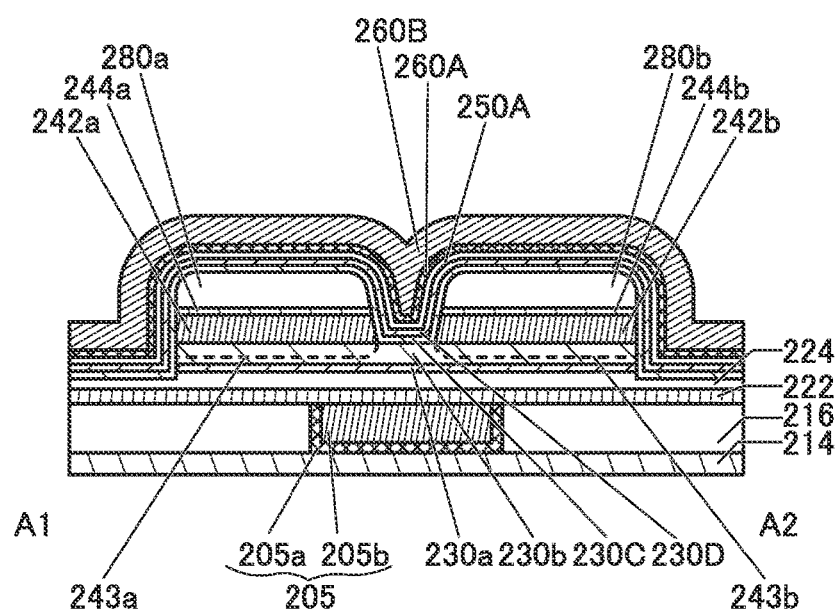

Next, the conductor 284a, the conductor 284b, and an exposed portion of a surface of the conductor layer 242B are etched to form the conductor 242a and the conductor 242b (see FIG. 9). At this time, an upper part of the insulator 224 is removed by etching in some cases.

Here, the oxide 230a, the oxide 230b, the conductor 242a, and the conductor 242b are formed to at least partly overlap with the conductor 205. It is preferable that a side surface of the oxide 230a, the side surface of the oxide 230b, the side surface of the conductor 242a, and the side surface of the conductor 242b be substantially perpendicular to a top surface of the insulator 222. When the side surfaces are substantially perpendicular to the top surface of the insulator 222, a plurality of the transistors 200 can be provided with high density in a small area. Alternatively, a structure may be employed in which an angle formed between each of the side surface of the oxide 230a, the side surface of the oxide 230b, the side surface of the conductor 242a, and the side surface of the conductor 242b and the top surface of the insulator 222 is an acute angle. In that case, the angle formed between each of the side surface of the oxide 230a, the side surface of the oxide 230b, the side surface of the conductor 242a, and the side surface of the conductor 242b and the top surface of the insulator 222 is preferably greater than or equal to 60° and less than 70°. With such a shape, coverage with the insulator 244 and the like can be improved in a later process, so that defects such as voids can be reduced.

Note that for the processing of the oxide films and the conductive film, a lithography method can be employed. The processing can be performed by a dry etching method or a wet etching method. The processing by a dry etching method is suitable for microfabrication.

In some cases, the treatment such as dry etching performed in the above process causes the attachment or diffusion of impurities due to an etching gas or the like to a surface or an inside of the oxide 230a, the oxide 230b, or the like. Examples of the impurities include fluorine and chlorine.

In order to remove the above impurities and the like, cleaning is performed. Examples of the cleaning method include wet cleaning using a cleaning solution, plasma treatment using plasma, and cleaning by heat treatment, and any of these cleanings may be performed in appropriate combination.

The wet cleaning may be performed using an aqueous solution in which oxalic acid, phosphoric acid, hydrofluoric acid, or the like is diluted with carbonated water or pure water. Alternatively, ultrasonic cleaning using pure water or carbonated water may be performed.

Next, heat treatment may be performed. Heat treatment may be performed under reduced pressure, and an oxide film 230C may be successively deposited without exposure to the air. The treatment can remove moisture and hydrogen adsorbed onto a surface of the oxide 230b and the like, and further can reduce the moisture concentration and the hydrogen concentration in the oxide 230a and the oxide 230b. The heat treatment is preferably performed at a temperature higher than or equal to 100° C. and lower than or equal to 400° C. In this embodiment, the heat treatment is performed at 200° C. (see FIG. 10).

The oxide film 230C can be deposited by a sputtering method, a CVD method, an MBE method, a PLD method, an ALD method, or the like. The oxide film 230C is deposited by a method similar to that for the oxide film 230A or the oxide film 230B in accordance with characteristics required for the oxide film 230C. In this embodiment, the oxide film 230C is deposited by a sputtering method using a target with In:Ga:Zn=4:2:4.1 [atomic ratio].

In particular, at the time of depositing the oxide film 230C, part of oxygen contained in a sputtering gas is supplied to the oxide 230a and the oxide 230b in some cases. Therefore, the proportion of oxygen contained in the sputtering gas for the oxide film 230C is 70% or higher, preferably 80% or higher, and further preferably 100%.

Then, an oxide film 230D can be successively deposited by a sputtering method, a CVD method, an MBE method, a PLD method, an ALD method, or the like. The oxide film 230D is deposited by a method similar to that for the oxide film 230A or the oxide film 230B in accordance with characteristics required for the oxide film 230D. In this embodiment, the oxide film 230D is deposited by a sputtering method using a target with In:Ga:Zn=1:3:4 [atomic ratio].

Next, heat treatment may be performed. Heat treatment may be performed under reduced pressure, and an insulating film 250A may be successively deposited without exposure to the air. The treatment can remove moisture and hydrogen adsorbed onto a surface of the oxide film 230D and the like, and further can reduce the moisture concentration and the hydrogen concentration in the oxide 230a, the oxide 230b, the oxide film 230C, and the oxide film 230D. The heat treatment is preferably performed at a temperature higher than or equal to 100° C. and lower than or equal to 400° C.

The insulating film 250A can be deposited by a sputtering method, a CVD method, an MBE method, a PLD method, an ALD method, or the like. For the insulating film 250A, silicon oxynitride is preferably deposited by a CVD method. Note that the deposition temperature at the time of the deposition of the insulating film 250A is preferably higher than or equal to 350° C. and lower than 450° C., particularly preferably approximately 400° C. When the insulating film 250A is deposited at 400° C., an insulator having few impurities can be deposited.

Next, a conductive film 260A and a conductive film 260B are deposited. The conductive film 260A and the conductive film 260B can be deposited by a sputtering method, a CVD method, an MBE method, a PLD method, an ALD method, or the like. For example, a CVD method is preferably used. In this embodiment, the conductive film 260A is deposited by an ALD method, and the conductive film 260B is deposited by a CVD method (see FIG. 10).

Figure 11A:
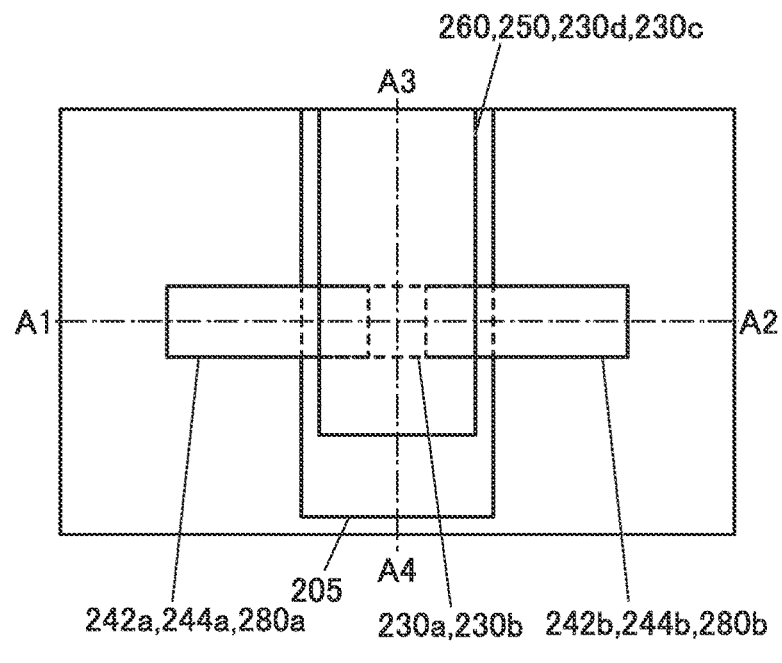
FIG. 11(A) is a top view illustrating a method for fabricating a semiconductor device of one embodiment of the present invention.
Figure 11C:
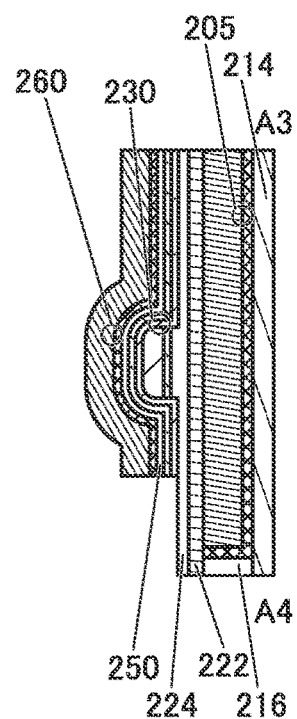
FIG. 11(B) and FIG. 11(C) are cross-sectional views illustrating a method for fabricating the semiconductor device of one embodiment of the present invention.
Figure 11B:
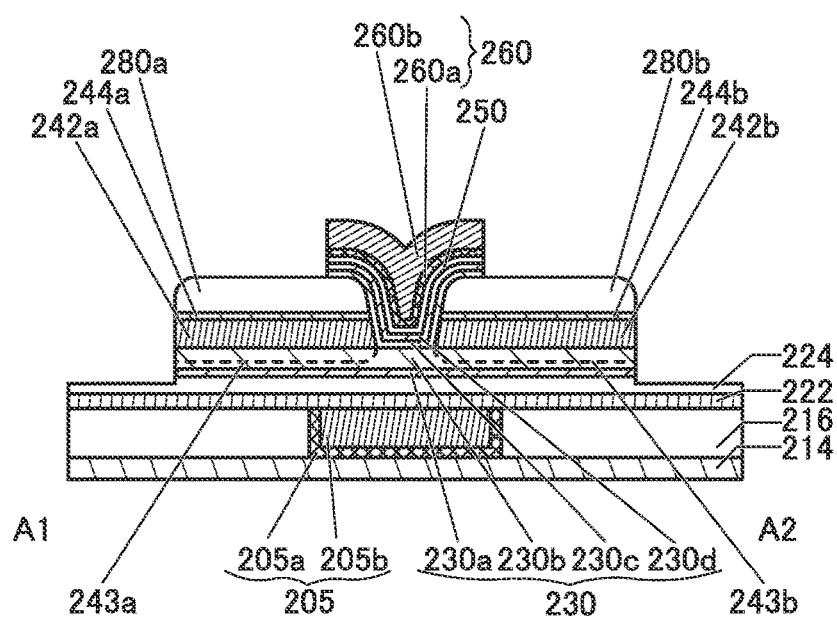

Next, parts of the oxide film 230C, the oxide film 230D, the insulating film 250A, the conductive film 260A, and the conductive film 260B are selectively removed by a photolithography method, so that the oxide 230c, the oxide 230d, the insulator 250, the conductor 260a, and the conductor 260b are formed (see FIG. 11). The oxide film 230C, the insulating film 250A, the conductive film 260A, and the conductive film 260B can be etched by a dry etching method or a wet etching method. The processing by a dry etching method is suitable for microfabrication.

In this manner, the oxide film 230C, the oxide film 230D, the insulating film 250A, the conductive film 260A, and the conductive film 260B are etched using the same mask, whereby the fabrication process of the transistor 200 can be simplified. In that case, end portions of the oxide 230c, the oxide 230d, the insulator 250, the conductor 260a, and the conductor 260b may be substantially aligned with each other in a top view.

Next, heat treatment may be performed. In this embodiment, the treatment is performed at 400° C. in a nitrogen atmosphere for one hour. The heat treatment can reduce the moisture concentration and the hydrogen concentration in the insulator 250 and the oxide insulator 280.

Figure 12A:
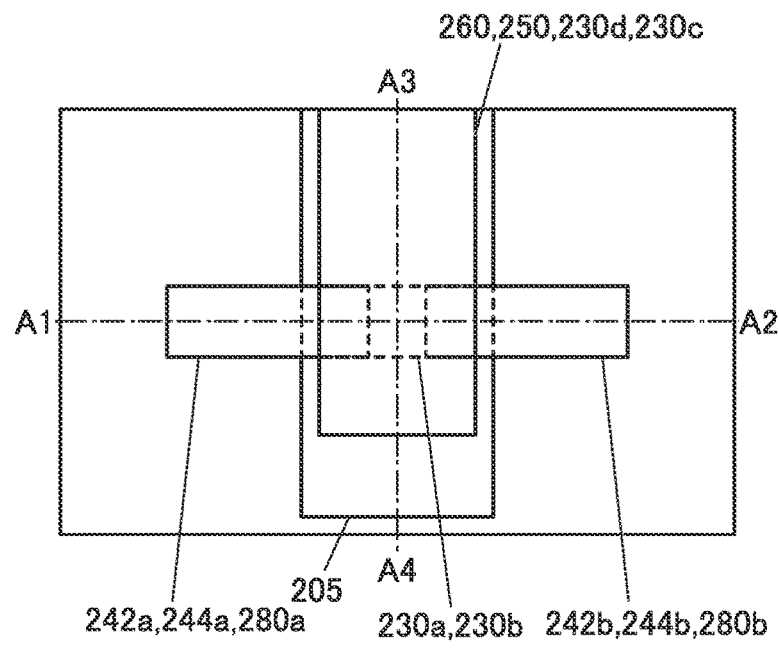
FIG. 12(A) is a top view illustrating a method for fabricating a semiconductor device of one embodiment of the present invention.
Figure 12C:
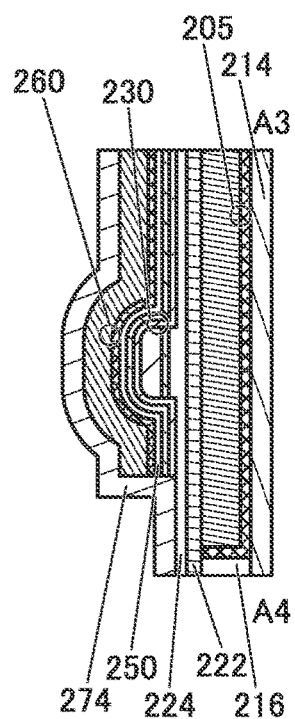
FIG. 12(B) and FIG. 12(C) are cross-sectional views illustrating a method for fabricating the semiconductor device of one embodiment of the present invention.
Figure 12B:
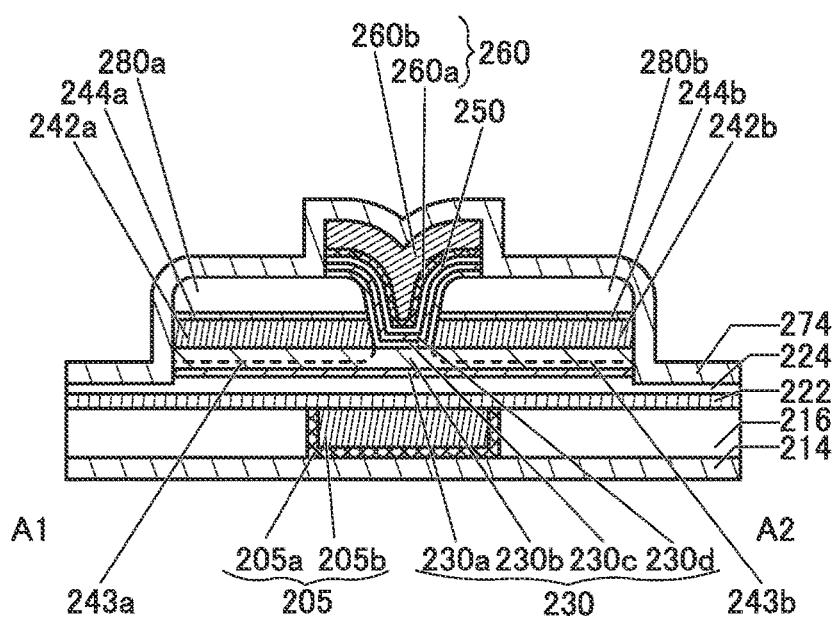

Next, the insulator 274 is deposited to cover the conductor 260, the insulator 250, the oxide insulator 280, the oxide 230, the insulator 244, the conductor 242, and the insulator 224 (see FIG. 12). The insulator 274 is preferably deposited by a sputtering method. For the insulator 274, an insulating material through which impurities such as water or hydrogen are less likely to pass is preferably used. For the insulator 274, an oxide of one or both of aluminum and hafnium having a barrier property is preferably used, for example. In this embodiment, as the insulator 274, an aluminum oxide film is deposited in an atmosphere containing oxygen by a sputtering method. Furthermore, silicon nitride may be deposited over the aluminum oxide film by a sputtering method.

The insulator 274 is deposited in an atmosphere containing oxygen by a sputtering method. Accordingly, oxygen can be introduced into the oxide insulator 280 during the deposition of the insulator 274. Furthermore, oxygen can be introduced into the insulator 224 at the same time. Although oxygen is added as an oxygen radical here, for example, the state of oxygen at the time of being added is not limited thereto. Oxygen may be added in the state of an oxygen atom, an oxygen ion, or the like. Heat treatment in a later process can diffuse oxygen such that oxygen can be supplied to the oxide 230 effectively.

Note that at the time of the deposition of the insulator 274, substrate heating is preferably performed. The substrate heating is preferably performed at higher than 100° C. and lower than or equal to 300° C. The substrate heating is further preferably performed at higher than or equal to 120° C. and lower than or equal to 250° C. When the substrate temperature is higher than 100° C., water in the oxide 230 can be removed. Furthermore, surface adsorbed water can be prevented from being attached to the formed film. Moreover, when the insulator 274 is deposited while the substrate heating is performed in this manner, oxygen can be diffused from the oxide insulator 280 into the insulator 224 and the oxide 230 during the deposition.

When the transistor 200 is sandwiched between the insulator 274 and the insulator 222, a large amount of oxygen can be contained in the oxide insulator 280, the insulator 224, and the oxide 230 without outward diffusion of oxygen. Moreover, impurities such as water or hydrogen can be prevented from entering from above the insulator 274 and from below the insulator 222; thus, the concentration of impurities in the oxide insulator 280, the insulator 224, and the oxide 230 can be reduced.

Subsequently, heat treatment is performed. The heat treatment is performed at higher than or equal to 250° C. and lower than or equal to 650° C., preferably higher than or equal to 300° C. and lower than or equal to 500° C. The heat treatment is performed in an oxygen atmosphere. Alternatively, the heat treatment is performed in an inert gas atmosphere or an atmosphere containing an oxidizing gas at 10 ppm or more, 1% or more, or 10% or more. Here, as the inert gas, for example, a nitrogen gas or a rare gas can be used. The heat treatment may be performed under a reduced pressure. Alternatively, the heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate for released oxygen. In this embodiment, the heat treatment is performed in an oxygen gas atmosphere at 400° C. for one hour.

In this embodiment, the oxide insulator 280 is provided in contact with the oxide 230c, and the oxide insulator 280 is isolated from the insulator 281, the conductor 260, the insulator 250, the conductor 242, and the oxide 230b. Therefore, oxygen added to the oxide insulator 280 in the heat treatment is diffused not directly into the insulator 281, the conductor 260, the insulator 250, and the conductor 242, but diffused into the oxide 230b through the oxide 230c as illustrated in FIG. 3. The oxygen contained in the insulator 224 is diffused into the oxide 230b through the oxide 230a without being diffused downward owing to the insulator 222. Accordingly, the oxygen is supplied to the oxide 230, in particular, the channel formation region, whereby oxygen vacancies can be reduced.

Note that oxygen may be added to the oxide insulator 280 through the insulator 274. As a method for adding oxygen, one or more methods selected from an ion implantation method, an ion doping method, a plasma treatment method, and a plasma immersion ion implantation method can be used. In that case, the use of an ion implantation method by which an ionized source gas is subjected to mass separation and then added is preferable because oxygen can be added to the oxide insulator 280 with high controllability. Note that the addition of oxygen to the oxide insulator 280 may be performed before the deposition of the insulator 274.

Next, an insulator to be the insulator 281 may be deposited over the insulator 274. An insulating film to be the insulator 281 can be deposited by a sputtering method, a CVD method, an MBE method, a PLD method, an ALD method, or the like.

Next, openings reaching the conductor 242a and the conductor 242b are formed in the insulator 244, the oxide insulator 280, the insulator 274, and the insulator 281. The openings are formed by a lithography method.

Next, an insulating film to be the insulator 241 is deposited and the insulating film is subjected to anisotropic etching, so that the insulator 241 is formed. The insulating film can be deposited by a sputtering method, a CVD method, an MBE method, a PLD method, an ALD method, or the like. As the insulating film to be the insulator 241, an insulating film having a function of inhibiting the passage of oxygen is preferably used. For example, an aluminum oxide film is preferably deposited by an ALD method. For the anisotropic etching, a dry etching method or the like is employed, for example. When side wall portions of the openings have such a structure, the passage of oxygen from the outside can be inhibited and oxidation of the conductor 240a and the conductor 240b to be formed next can be prevented. Furthermore, impurities such as water and hydrogen can be prevented from diffusing from the conductor 240a and the conductor 240b to the outside.

Next, a conductive film to be the conductor 240a and the conductor 240b is deposited. The conductive film to be the conductor 240a and the conductor 240b desirably has a stacked-layer structure that includes a conductor having a function of inhibiting the passage of impurities such as water and hydrogen. For example, a stack of tantalum nitride, titanium nitride, or the like and tungsten, molybdenum, copper, or the like can be employed. The conductive film to be the conductor 240 can be deposited by a sputtering method, a CVD method, an MBE method, a PLD method, an ALD method, or the like.

Next, CMP treatment is performed to remove part of the conductive film to be the conductor 240a and the conductor 240b, so that the insulator 281 is exposed. As a result, the conductive film remains only in the above openings, so that the conductor 240a and the conductor 240b having planar top surfaces can be formed (see FIG. 2). Note that the insulator 281 is partly removed by the CMP treatment in some cases.

A wiring, a circuit element, or the like may be provided over the insulator 281. Even when heat treatment is performed at the time of fabrication of a wiring, a circuit element, or the like, oxygen vacancies generated in the oxide 230 can be reduced by oxygen supplied from the oxide insulator 280. In this manner, the semiconductor device including the transistor 200 can be fabricated without deterioration of electrical characteristics and reliability due to excess heat treatment (thermal budget).

Through the above process, the semiconductor device including the transistor 200 illustrated in FIG. 2 can be fabricated. As illustrated in FIG. 4 to FIG. 12, with the use of the method for fabricating the semiconductor device described in this embodiment, the transistor 200 can be fabricated.

According to one embodiment of the present invention, a semiconductor device having favorable electrical characteristics can be provided. According to another embodiment of the present invention, a semiconductor device with favorable reliability can be provided. According to another embodiment of the present invention, a semiconductor device with high on-state current can be provided. According to another embodiment of the present invention, a semiconductor device with excellent frequency characteristics can be provided. According to another embodiment of the present invention, a semiconductor device with low off-state current can be provided. According to another embodiment of the present invention, a semiconductor device that can be miniaturized or highly integrated can be provided. According to another embodiment of the present invention, a semiconductor device with reduced power consumption can be provided. According to another embodiment of the present invention, a semiconductor device with high productivity can be provided.

MODIFICATION EXAMPLE OF SEMICONDUCTOR DEVICE

Examples of a semiconductor device including the transistor 200 of one embodiment of the present invention, which are different from the semiconductor device described in <Structure example of semiconductor device> above, will be described below with reference to FIG. 13 to FIG. 19.

In FIG. 13 and FIG. 15 to FIG. 19, (A) of each drawing is a top view. Moreover, (B) of each drawing is a cross-sectional view corresponding to a portion indicated by the dashed-dotted line A1-A2 in (A) of each drawing, and is also a cross-sectional view of the transistor 200 in the channel length direction. Furthermore, (C) of each drawing is a cross-sectional view corresponding to a portion indicated by the dashed-dotted line A3-A4 in (A) of each drawing, and is also a cross-sectional view of the transistor 200 in the channel width direction. Note that for simplification of the drawings, some components are not illustrated in the top view of (A) of each drawing.

Note that in semiconductor devices illustrated in FIG. 13 to FIG. 19, components having the same functions as the components in the semiconductor device described in <Structure example of semiconductor device> (see FIG. 2) are denoted by the same reference numerals. Note that in this section, the materials described in detail in <Structure example of semiconductor device> can be used as the constituent materials for the transistor 200.

Modification Example 1 of Semiconductor Device

Figure 13A:
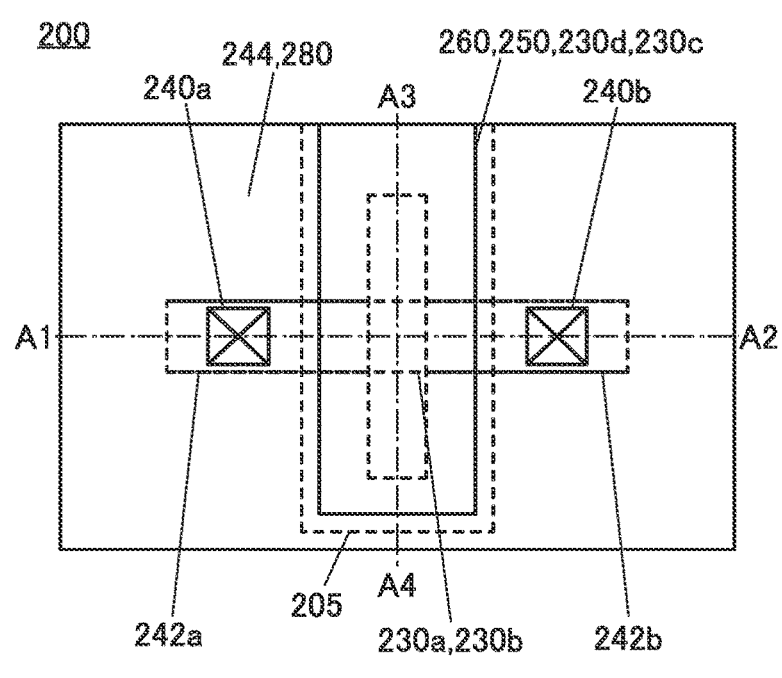
FIG. 13(A) is a top view of a semiconductor device of one embodiment of the present invention.
Figure 13C:
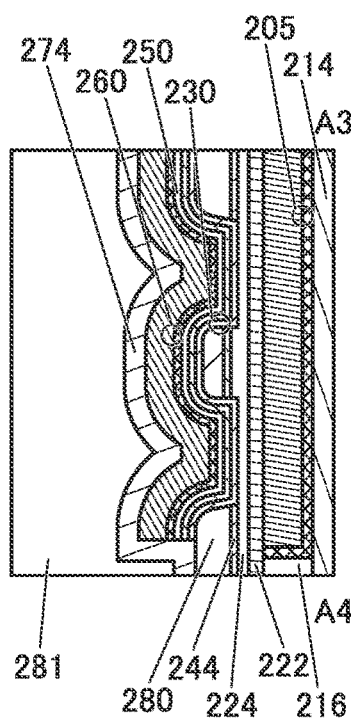
FIG. 13(B) and FIG. 13(C) are cross-sectional views of the semiconductor device of one embodiment of the present invention.
Figure 13B:
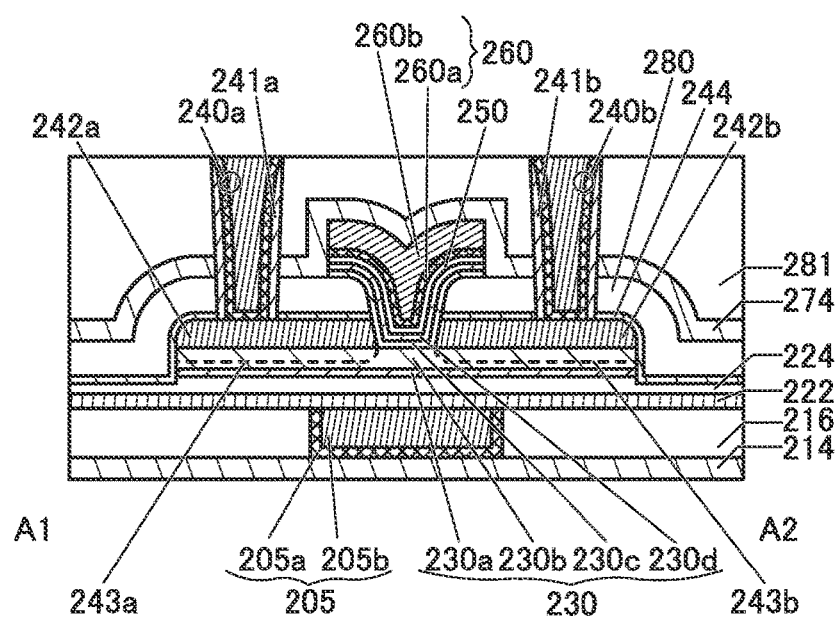

The transistor 200 illustrated in FIG. 13 is different from the transistor 200 illustrated in FIG. 2 in that the insulator 244 and the oxide insulator 280 are provided to cover the insulator 224, the oxide 230a, the oxide 230b, and the conductor 242. In FIG. 13, the insulator 244 is provided in contact with the top surface and the side surface of the conductor 242a, the top surface and the side surface of the conductor 242b, and the side surface of the oxide 230b. Furthermore, the oxide insulator 280 is provided in contact with a top surface of the insulator 244.

Although the oxide insulator 280 is provided only in a region overlapping with the conductor 242a and the conductor 242b in the transistor 200 illustrated in FIG. 2, the oxide insulator 280 can also be provided in a region not overlapping with the conductor 242a and the conductor 242b in the transistor 200 illustrated in FIG. 13. Accordingly, a larger amount of oxygen can be contained in the oxide insulator 280. Thus, even under thermal budget at a higher temperature or for a longer time, deterioration of electrical characteristics and reliability of the transistor 200 can be inhibited.

In the transistor 200 illustrated in FIG. 13, a structure in which the insulator 244 and the oxide insulator 280 are integrated on the conductor 242a side and the conductor 242b side, and have an opening overlapping with a region between the conductor 242a and the conductor 242b is employed. Note that this embodiment is not limited thereto, and a structure may be employed in which the insulator 244 and the oxide insulator 280 are divided into the insulator 244a and the oxide insulator 280a on the conductor 242a side, and the insulator 244b and the oxide insulator 280b on the conductor 242b side like the transistor illustrated in FIG. 2.

Figure 14A:
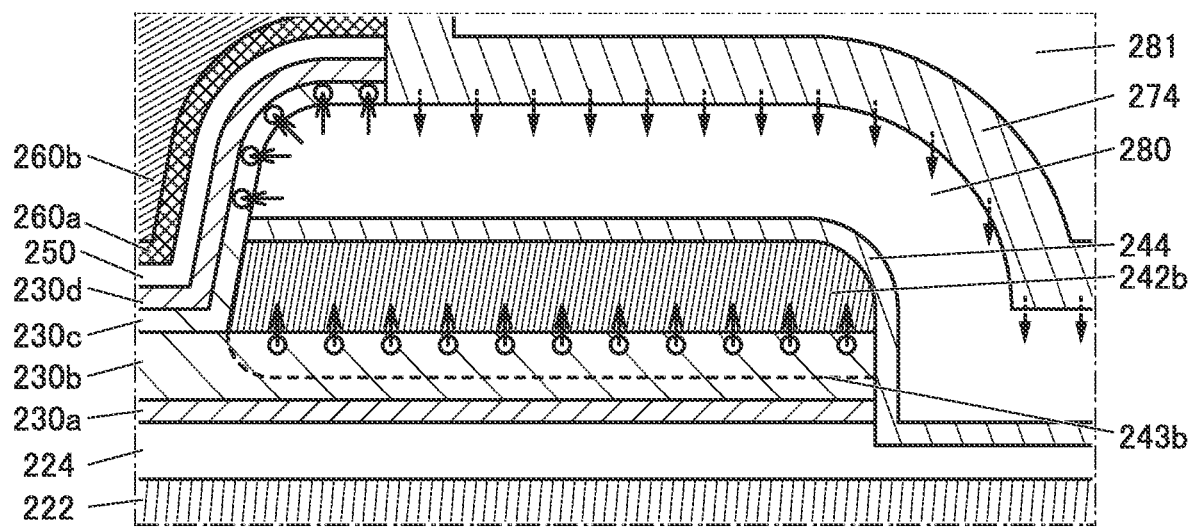
FIG. 14(A) and FIG. 14(B) are cross-sectional views of a semiconductor device of one embodiment of the present invention.
Figure 14B:
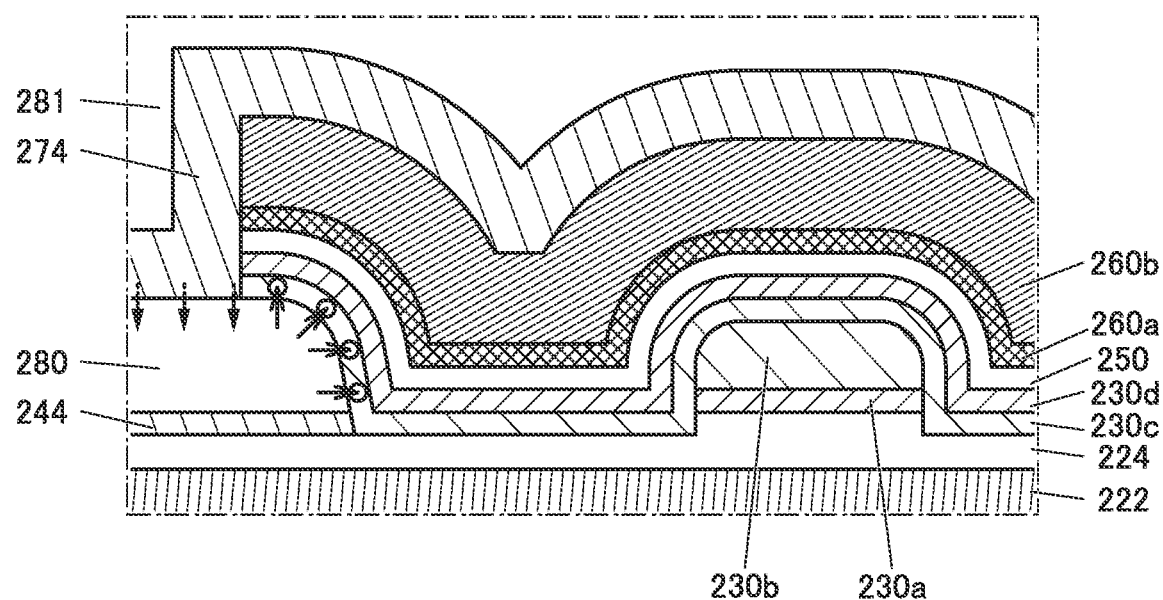

Here, the behavior of oxygen contained in the oxide insulator 280 at the time when heat treatment is performed in the fabrication process or after the fabrication of the transistor 200 illustrated in FIG. 13 will be described with reference to FIGS. 14(A) and 14(B). FIG. 14(A) is an enlarged view of the transistor 200 in the channel length direction, and FIG. 14(B) is an enlarged view of the transistor 200 in the channel width direction. Note that although FIG. 14(A) illustrates the conductor 242b side, the same applies to the conductor 242a side. Note that in FIGS. 14(A) and 14(B), solid arrows represent an example of the movement of oxygen diffused by heat treatment, dotted arrows represent an example of the movement of oxygen added at the time of depositing the insulator 274, and white circles represent oxygen vacancies formed in the oxide 230.

As illustrated in FIGS. 14(A) and 14(B), the insulator 274 is deposited over the oxide insulator 280 also in the region not overlapping with the conductor 242, so that a larger amount of oxygen can be contained in the oxide insulator 280. Furthermore, as illustrated in FIG. 14(B), also in the channel width direction of the transistor 200, the oxide insulator 280 and the oxide 230c are in contact with each other in a region, and a larger amount of oxygen can be supplied to the oxide 230 because oxygen can be diffused from the region.

Note that in FIG. 14, the insulator 274 is not in contact with the insulator 224; thus, excess oxygen is not formed in the insulator 224 when the insulator 274 is deposited. However, depositing the insulator 244 in an atmosphere containing oxygen by a sputtering method or adding oxygen to the insulator 224 by an ion implantation method or the like can form excess oxygen in the insulator 224. Therefore, also in the transistor 200 illustrated in FIG. 13, oxygen can be diffused from the insulator 224 to the oxide 230a and the oxide 230c.

Figure 15A:
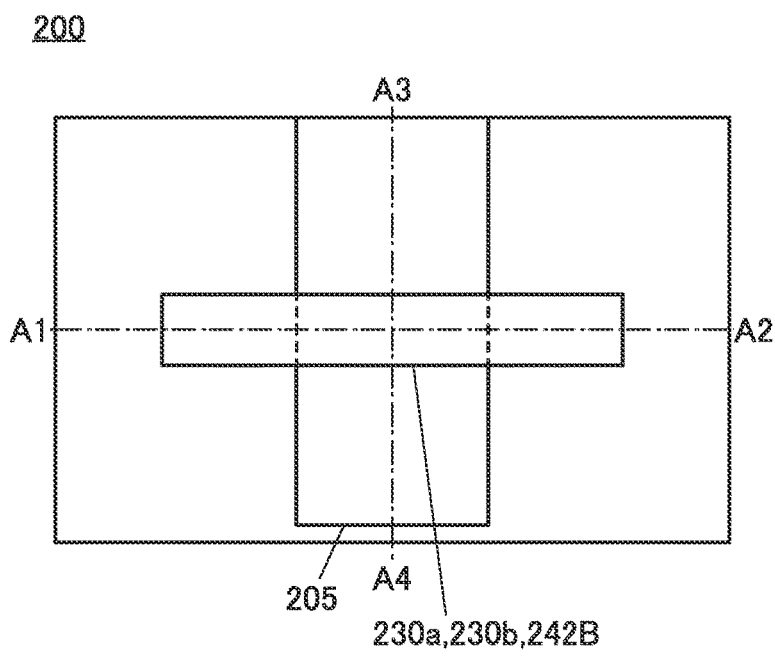
FIG. 15(A) is a top view illustrating a method for fabricating a semiconductor device of one embodiment of the present invention.
Figure 15C:
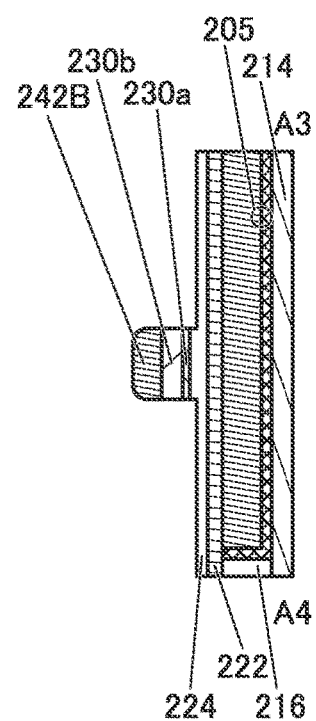
FIG. 15(B) and FIG. 15(C) are cross-sectional views illustrating a method for fabricating the semiconductor device of one embodiment of the present invention.
Figure 15B:
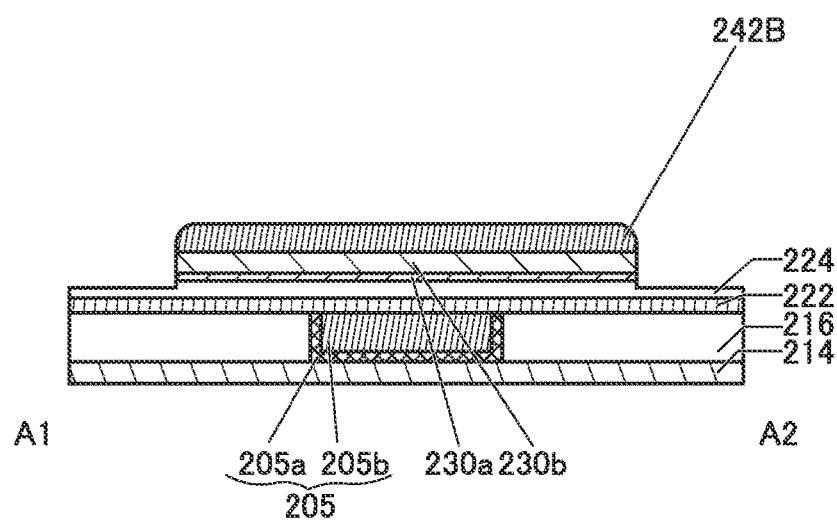

Here, a method for fabricating the transistor 200 illustrated in FIG. 13 will be described with reference to FIG. 15 to FIG. 17.

First, the processes up to the process illustrated in FIG. 4 are performed by the above method, and the insulator 214, the conductor 205, the insulator 216, the insulator 222, the insulator 224, the oxide film 230A, the oxide film 230B, and the conductive film 242A are formed.

Next, the oxide film 230A, the oxide film 230B, and the conductive film 242A are processed into an island shape to form the oxide 230a, the oxide 230b, and the conductor layer 242B. Note that in this process, the thickness of the insulator 224 in a region not overlapping with the oxide 230a is reduced in some cases (see FIG. 15). Here, the oxide 230a, the oxide 230b, and the conductor layer 242B are formed to at least partly overlap with the conductor 205.

Note that for the processing of the oxide films and the conductive film, a lithography method can be employed. The processing can be performed by a dry etching method or a wet etching method. The processing by a dry etching method is suitable for microfabrication.

Figure 16A:
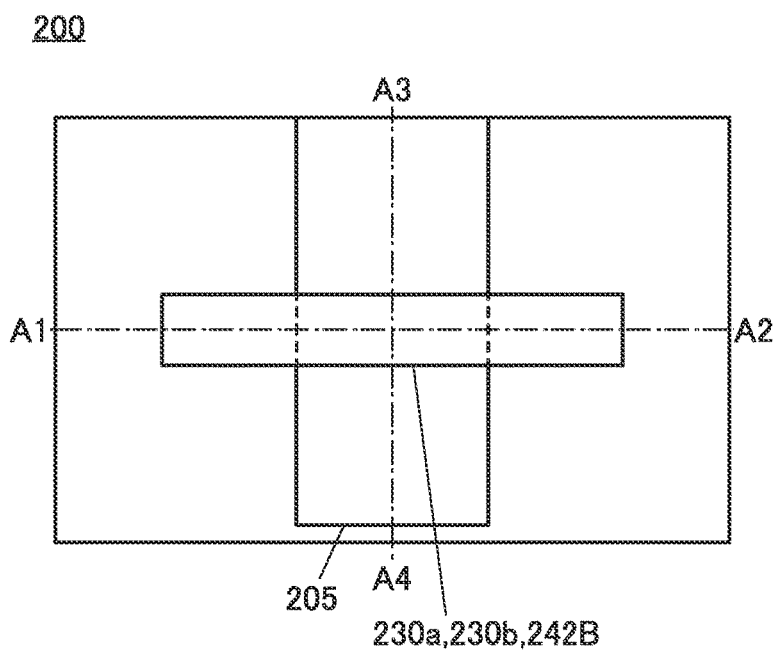
FIG. 16(A) is a top view illustrating a method for fabricating a semiconductor device of one embodiment of the present invention.
Figure 16C:
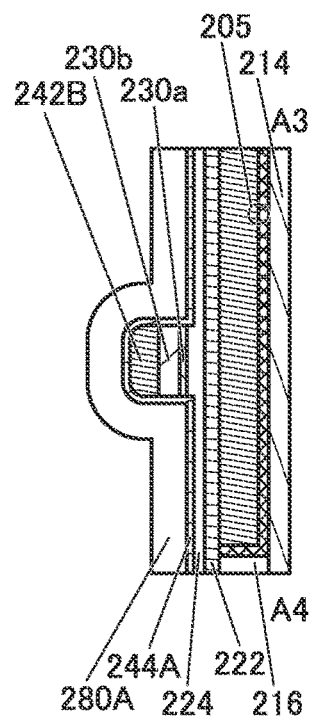
FIG. 16(B) and FIG. 16(C) are cross-sectional views illustrating a method for fabricating the semiconductor device of one embodiment of the present invention.
Figure 16B:
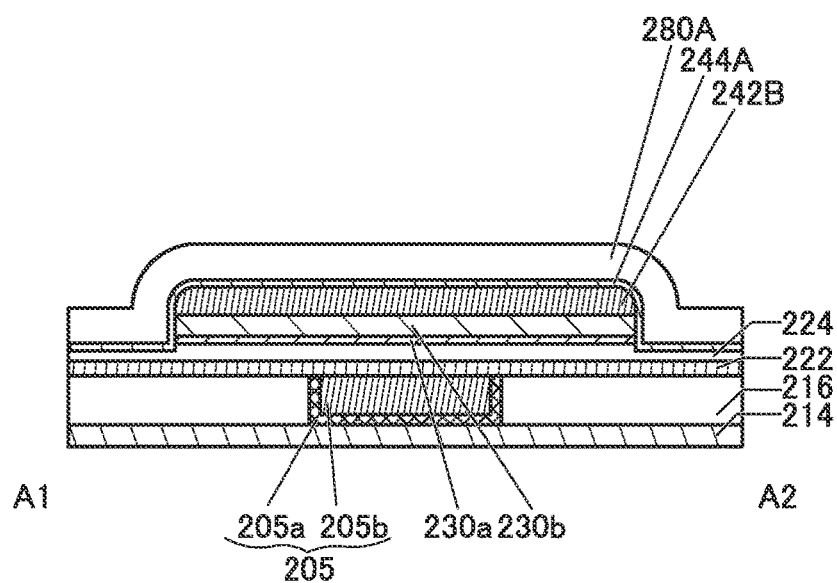
Figure 17A:
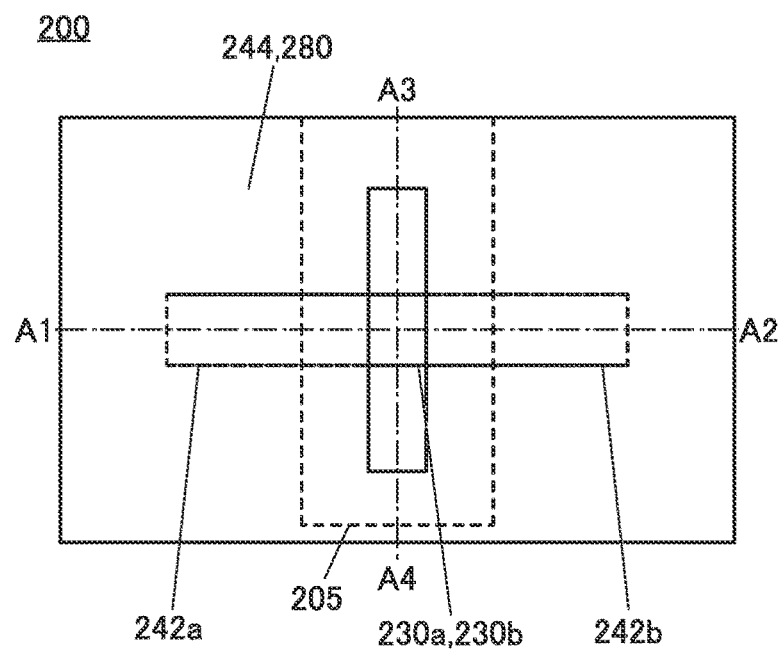
FIG. 17(A) is a top view illustrating a method for fabricating a semiconductor device of one embodiment of the present invention.
Figure 17C:
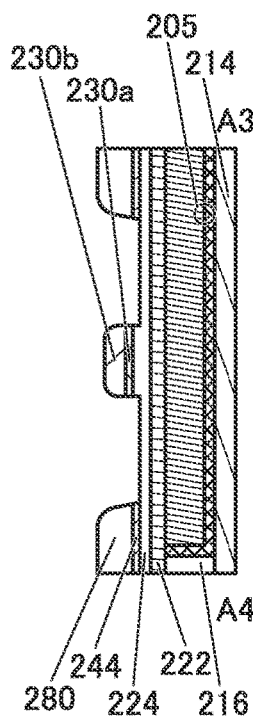
FIG. 17(B) and FIG. 17(C) are cross-sectional views illustrating a method for fabricating the semiconductor device of one embodiment of the present invention.
Figure 17B:
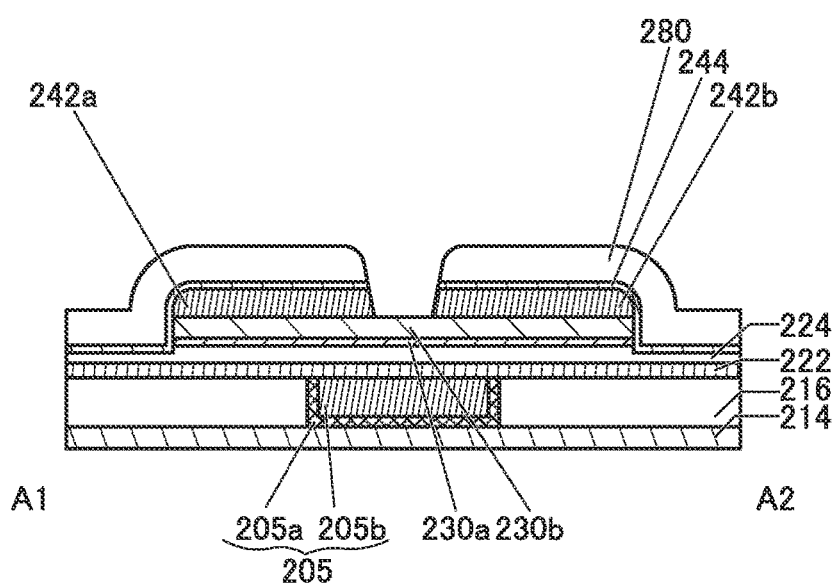

Next, the insulating film 244A is deposited over the insulator 224, the oxide 230a, the oxide 230b, and the conductor layer 242B (see FIG. 16).

As the insulating film 244A, an insulating film having a function of inhibiting the passage of oxygen is preferably used. For example, an aluminum oxide film is preferably deposited by a sputtering method. When an aluminum oxide film is deposited by a sputtering method using a gas containing oxygen, oxygen can be injected into the insulator 224. That is, the insulator 224 can contain excess oxygen.

Next, the oxide insulating film 280A to be the oxide insulator 280 is deposited over the insulating film 244A (see FIG. 16). The oxide insulating film 280A is deposited by a method similar to the above.

Then, part of the oxide insulating film 280A, part of the insulating film 244A, and part of the conductor layer 242B are processed to form an opening reaching the oxide 230b. The opening is preferably formed to overlap with the conductor 205. The conductor 242a, the conductor 242b, the insulator 244, and the oxide insulator 280 are formed by the opening (see FIG. 17).

Part of the oxide insulator 280, part of the insulating film 244A, and part of the conductor may be processed under different conditions. For example, part of the oxide insulating film 280A may be processed by a dry etching method, part of the insulating film 244A may be processed by a wet etching method, and part of the conductor layer 242B may be processed by a dry etching method.

Impurities remaining on the surface of the oxide 230b and the like can be removed by a method similar to the above. Hereinafter, the transistor 200 can be fabricated by the method of FIG. 10 to FIG. 12.

Modification Example 2 of Semiconductor Device

Figure 18A:
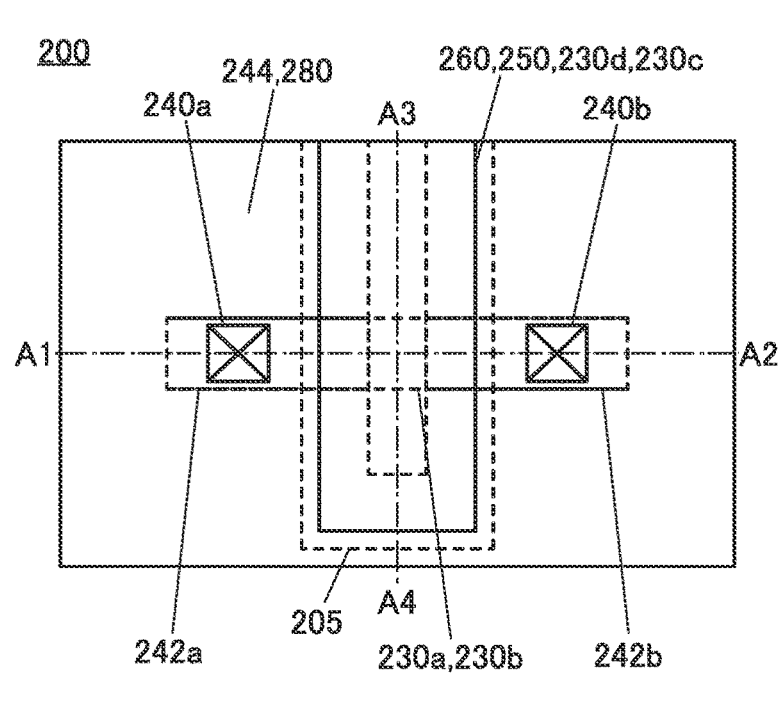
FIG. 18(A) is a top view of a semiconductor device of one embodiment of the present invention.
Figure 18C:
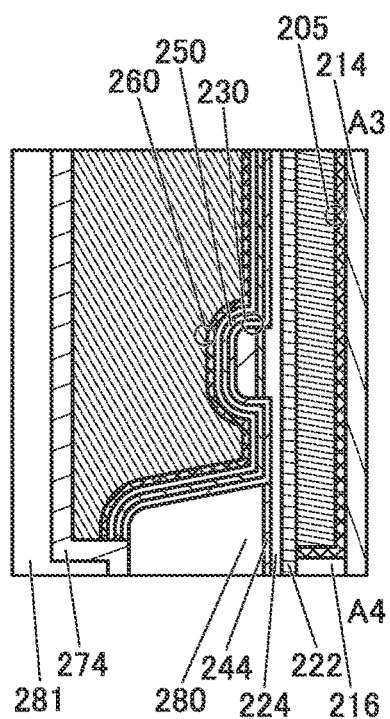
FIG. 18(B) and FIG. 18(C) are cross-sectional views of the semiconductor device of one embodiment of the present invention.
Figure 18B:
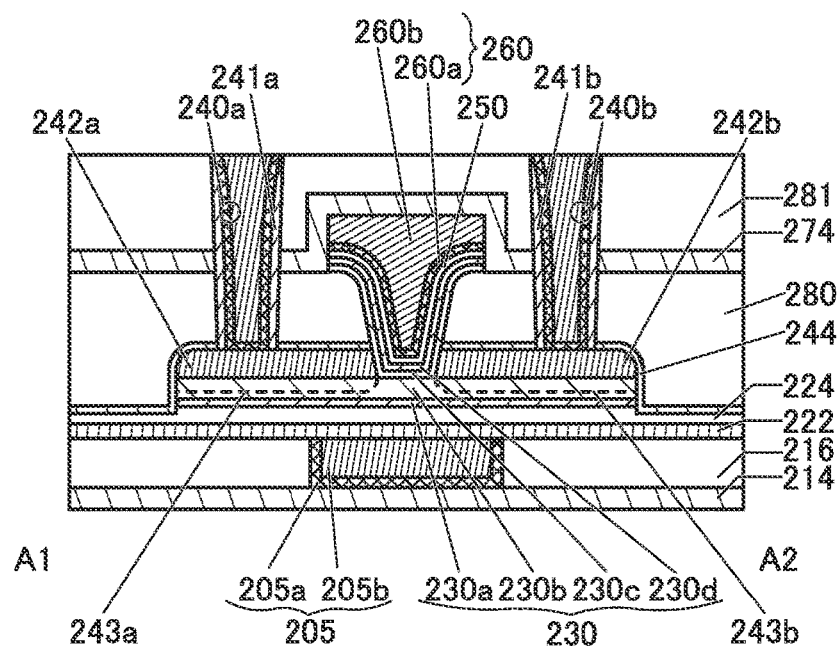

The transistor 200 illustrated in FIG. 18 is different from the transistor 200 illustrated in FIG. 13 in that the top surface of the oxide insulator 280 is planarized. As illustrated in FIG. 18(B), the thickness of the oxide insulator 280 in a region overlapping with the oxide 230b is smaller than that in a region not overlapping with the oxide 230b. When the top surface of the oxide insulator 280 is planarized, coverage of the insulator 274 can be favorable, and the oxide insulator 280 and the insulator 281 can be more surely isolated from each other.

For the transistor 200 illustrated in FIG. 18, in the process illustrated in FIG. 16, the oxide insulating film 280A is deposited to be thick, and CMP treatment is performed. When the oxide insulating film 280A is deposited to be thick, the volume of the oxide insulator 280 can be further increased, so that a larger amount of oxygen can be contained in the oxide insulator 280. Thus, even under thermal budget at a higher temperature or for a longer time, deterioration of electrical characteristics and reliability of the transistor 200 can be inhibited.

Note that also in the transistor 200 illustrated in FIG. 18, the structure in which the insulator 244 and the oxide insulator 280 are integrated on the conductor 242a side and the conductor 242b side, and have an opening overlapping with the region between the conductor 242a and the conductor 242b is employed. Note that this embodiment is not limited thereto, and the structure may be employed in which the insulator 244 and the oxide insulator 280 are divided into the insulator 244a and the oxide insulator 280a on the conductor 242a side and the insulator 244b and the oxide insulator 280b on the conductor 242b side like the transistor illustrated in FIG. 2.

Figure 19A:
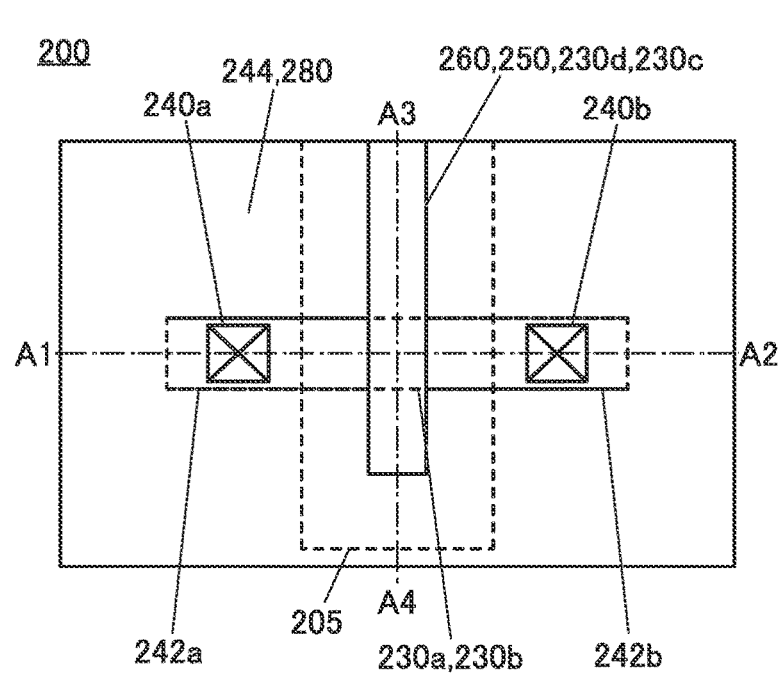
FIG. 19(A) is a top view of a semiconductor device of one embodiment of the present invention.
Figure 19C:
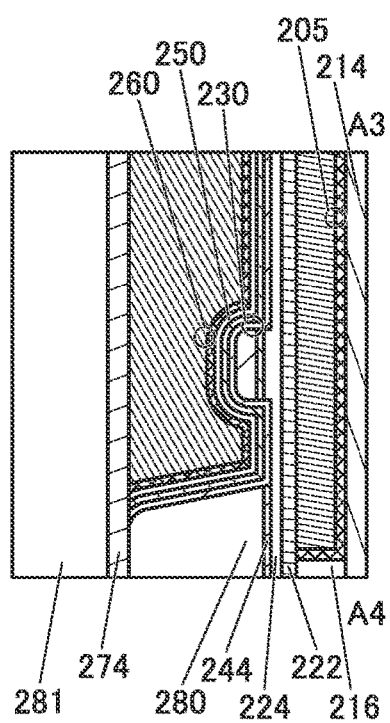
FIG. 19(B) and FIG. 19(C) are cross-sectional views of the semiconductor device of one embodiment of the present invention.
Figure 19B:
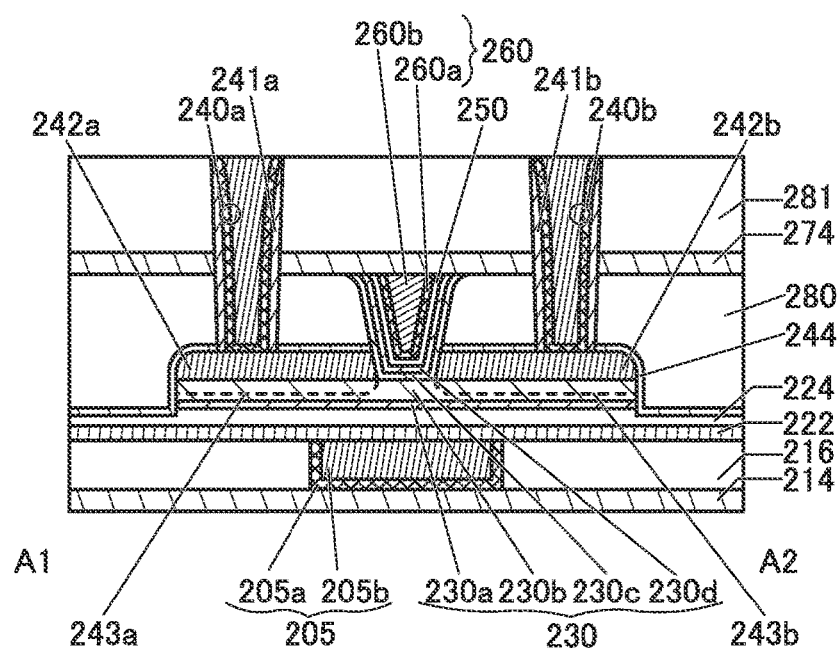

As illustrated in FIG. 19, a structure can be employed in which the oxide 230c, the oxide 230d, the insulator 250, and the conductor 260 in portions above the oxide insulator 280 are removed. Here, the insulator 274 is in contact with the top surface of each of the oxide 230c, the oxide 230d, the insulator 250, and the conductor 260. The insulator 274 is in contact with the top surface of the oxide 230c and the top surface of the oxide 230d, whereby the oxide insulator 280 can be isolated from the conductor 260 and the insulator 250.

The oxide film 230C, the oxide film 230D, the insulating film 250A, the conductive film 260A, and the conductive film 260B are polished until the oxide insulator 280 is exposed to remove the oxide 230c, the oxide 230d, the insulator 250, and the conductor 260 in the portions above the oxide insulator 280. For example, the oxide 230c, the oxide 230d, the insulator 250, and the conductor 260 in the portions above the oxide insulator 280 is removed by CMP treatment.

The structure, method, and the like described above in this embodiment can be used in an appropriate combination with the structures, methods, and the like described in the other embodiments and an example.

Embodiment 3

In this embodiment, one embodiment of a semiconductor device is described with reference to FIG. 20.

[Memory Device 1]

Figure 20:
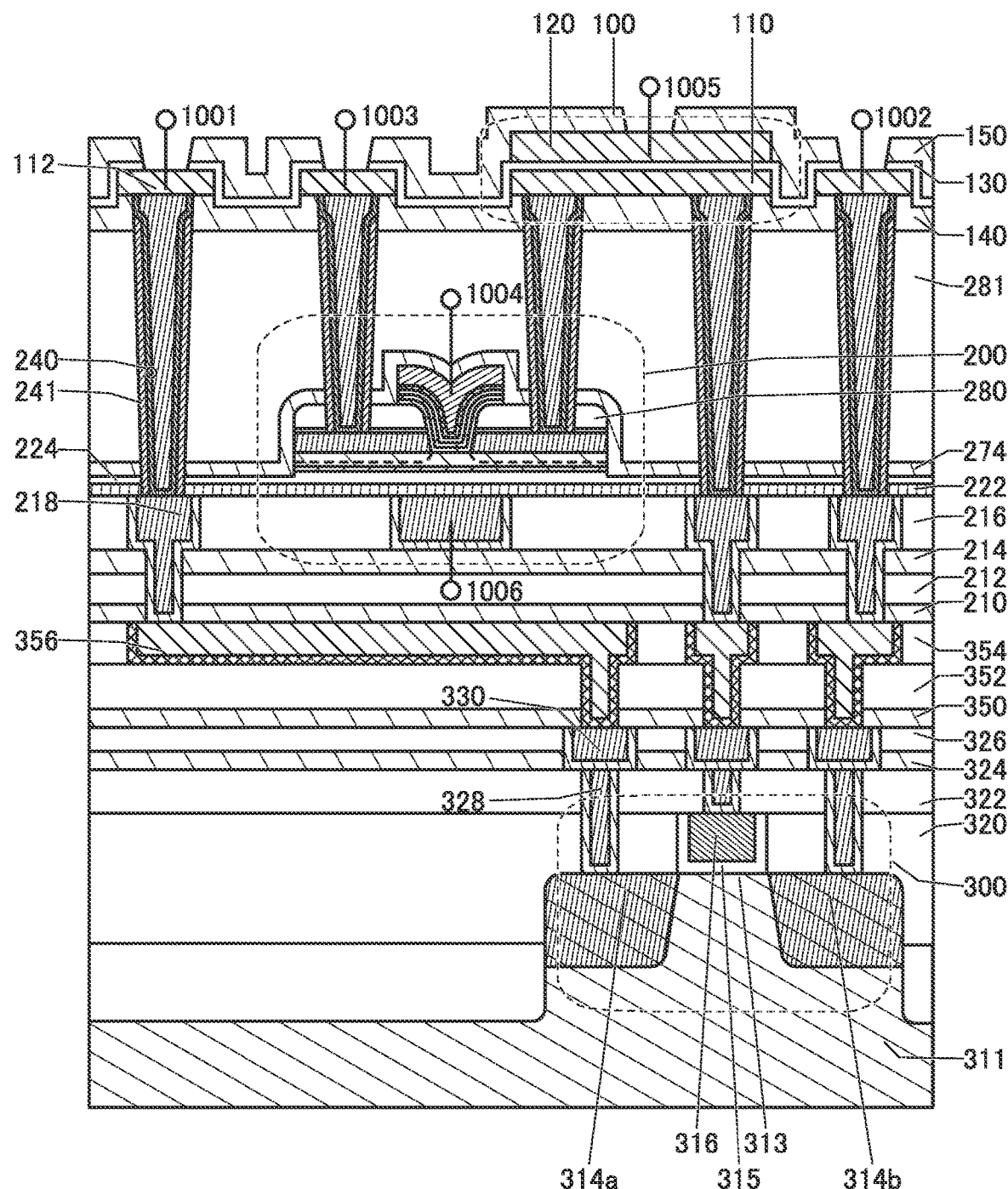
FIG. 20 is a cross-sectional view illustrating a structure of a memory device of one embodiment of the present invention.

FIG. 20 illustrates an example of a semiconductor device (memory device) in which the capacitor of one embodiment of the present invention is used. In the semiconductor device of one embodiment of the present invention, the transistor 200 is provided above a transistor 300, and a capacitor 100 is provided above the transistor 300 and the transistor 200. Note that the semiconductor device in this embodiment can be applied to logic circuits typified by a CPU (Central Processing Unit) and a GPU (Graphics Processing Unit) and memory circuits typified by a DRAM (Dynamic Random Access Memory) and an NVN (Non-Volatile Memory), for example.

Note that as the transistor 200, the transistor 200 or the like described in the above embodiment can be used. Although the transistor 200 described in FIG. 2 is used as the transistor 200 in FIG. 20, the present invention is not limited to this. For example, the transistor 200 illustrated in FIG. 13, FIG. 18, and FIG. 19 can be used.

The transistor 200 is a transistor whose channel is formed in a semiconductor layer including an oxide semiconductor. Since the transistor 200 has low off-state current, a memory device using the transistor 200 can retain stored data for a long time. In other words, such a memory device does not require refresh operation or has an extremely low frequency of refresh operation, leading to a sufficient reduction in power consumption of the memory device. The transistor 200 exhibits favorable electrical characteristics at high temperatures, in comparison with a transistor using silicon in a semiconductor layer. For example, the transistor 200 has favorable electrical characteristics even in the temperature range of 125° C. to 150° C. Moreover, the transistor 200 has an on/off ratio of 10 digits or larger in the temperature range of 125° C. to 150° C. In other words, in comparison with a transistor using silicon in a semiconductor layer, the transistor 200 excels in transistor characteristics such as on-state current and frequency characteristics at higher temperatures.

In the semiconductor device illustrated in FIG. 20, a wiring 1001 is electrically connected to a source of the transistor 300, and a wiring 1002 is electrically connected to a drain of the transistor 300. A wiring 1003 is electrically connected to one of the source and the drain of the transistor 200, a wiring 1004 is electrically connected to the first gate of the transistor 200, and a wiring 1006 is electrically connected to the second gate of the transistor 200. A gate of the transistor 300 and the other of the source and the drain of the transistor 200 is electrically connected to one electrode of the capacitor 100, and a wiring 1005 is electrically connected to the other electrode of the capacitor 100.

The semiconductor device illustrated in FIG. 20 is capable of retaining charge stored in the one electrode of the capacitor 100 by switching of the transistor 200; thus, data writing, retaining, and reading can be performed. The transistor 200 is an element having the source, the gate (front gate), the drain, and the back gate. That is, the transistor 200 is a four-terminal element; hence, its input and output can be controlled independently of each other in a simpler manner than that in two-terminal elements typified by MRAM (Magnetoresistive Random Access Memory) utilizing MTJ (Magnetic Tunnel Junction) properties, ReRAM (Resistive Random Access Memory), phase-change memory, and the like. In addition, the structure of MRAM, ReRAM, and phase-change memory may change at the atomic level when data is rewritten. By contrast, in the semiconductor device illustrated in FIG. 20, data rewriting is performed by charging or discharging of electrons with the transistor and the capacitor; thus, the semiconductor device features high write endurance and a few structure changes.

When the memory devices illustrated in FIG. 20 are arranged in a matrix, a memory cell array can be formed. In this case, the transistor 300 can be used for a read circuit, a driver circuit, or the like that is connected to the memory cell array. When the semiconductor device illustrated in FIG. 20 is used as a memory element, for example, an operating frequency of 200 MHz or higher can be achieved at a driving voltage of 2.5 V and an evaluation environment temperature ranging from −40° C. to 85° C.

<Transistor 300>

The transistor 300 is provided on a substrate 311 and includes a conductor 316 functioning as a gate electrode, an insulator 315 functioning as a gate insulator, a semiconductor region 313 that is formed of part of the substrate 311, and a low-resistance region 314*a* and a low-resistance region 314*b* functioning as a source region and a drain region. The transistor 300 can be a p-channel transistor or an n-channel transistor.

In the transistor 300 illustrated in FIG. 20, the semiconductor region 313 (part of the substrate 311) in which a channel is formed has a projecting shape. Moreover, the conductor 316 is provided to cover a side surface and a top surface of the semiconductor region 313 with the insulator 315 positioned therebetween. Note that a material adjusting a work function may be used for the conductor 316. The transistor 300 having such a structure is also referred to as a FIN transistor because the projecting portion of a semiconductor substrate is utilized. An insulator functioning as a mask for forming the projecting portion may be included in contact with an upper part of the projecting portion. Although the case where the projecting portion is formed by processing part of the semiconductor substrate is described here, a semiconductor film having a projecting shape may be formed by processing an SOI substrate.

Note that the transistor 300 illustrated in FIG. 20 is only an example and is not limited to having the structure shown therein; an appropriate transistor can be used in accordance with a circuit configuration or a driving method.

As illustrated in FIG. 20, the semiconductor device includes a stack of the transistor 300 and the transistor 200. For example, the transistor 300 can be formed using a silicon-based semiconductor material, and the transistor 200 can be formed using an oxide semiconductor. Thus, in the semiconductor device illustrated in FIG. 20, a silicon-based semiconductor material and an oxide semiconductor can be used in different layers. The semiconductor device illustrated in FIG. 20 can be fabricated in a process similar to that of a manufacturing apparatus used for a silicon-based semiconductor material, and can be highly integrated.

<Capacitor 100>

The capacitor 100 is provided above the transistor 200. The capacitor 100 includes a conductor 110 functioning as a first electrode, a conductor 120 functioning as a second electrode, and an insulator 130 functioning as a dielectric.

For example, the conductor 112 provided over the conductor 240 and the conductor 110 can be formed at the same time. Note that the conductor 112 has a function of a plug or a wiring electrically connected to the capacitor 100, the transistor 200, or the transistor 300.

Although the conductor 112 and the conductor 110 each having a single-layer structure are illustrated in FIG. 20, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

The insulator 130 can be formed to have a stacked-layer structure or a single-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, or hafnium nitride. As the insulator 130, an insulating film in which zirconium oxide, aluminum oxide, and zirconium oxide are stacked in order can be used, for example.

For example, the insulator 130 preferably has a stacked-layer structure using a material with high dielectric strength such as silicon oxynitride and a high permittivity (high-k) material. In the capacitor 100 having such a structure, a sufficient capacitance can be provided owing to the high permittivity (high-k) insulator, and the dielectric strength can be increased owing to the insulator with high dielectric strength, so that the electrostatic breakdown of the capacitor 100 can be inhibited.

Examples of an insulator of a high permittivity (high-k) material (a material having a high relative permittivity) include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium. The use of such a high-k material enables sufficient capacitance of the capacitor 100 to be ensured even if the insulator 130 has a large thickness. The insulator 130 having a large thickness can inhibit leakage current generated between the conductor 110 and the conductor 120.

Examples of a material with high dielectric strength (a material having a low relative permittivity) include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin. For example, it is possible to use an insulating film in which $SiN_x$ deposited by an ALD method, $SiO_x$ deposited by a PEALD method, and $SiN_x$ deposited by an ALD method are stacked in this order. The use of such an insulator having high dielectric strength can increase the dielectric strength and inhibit electrostatic breakdown of the capacitor 100.

Since the transistor 200 has a structure in which an oxide semiconductor is used, the transistor 200 is highly compatible with the capacitor 100. Specifically, since the transistor 200 using an oxide semiconductor has low off-state current, a combination of the transistor 200 and the capacitor 100 enables stored data to be retained for a long time.

<Wiring Layer>

A wiring layer provided with an interlayer film, a wiring, a plug, and the like may be provided between the structure bodies. A plurality of wiring layers can be provided in accordance with the design. Here, a plurality of conductors having a function of plugs or wirings are collectively denoted by the same reference numeral in some cases. Furthermore, in this specification and the like, a wiring and a plug electrically connected to the wiring may be a single component. That is, part of a conductor functions as a wiring in some cases, and part of a conductor functions as a plug in other cases.

For example, over the substrate 311, an insulator 320, an insulator 322, an insulator 324, and an insulator 326 are stacked in this order as interlayer films. Note that the insulator 315 and the conductor 316 are provided to be embedded in the insulator 320. A conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 each function as a plug or a wiring.

The insulator functioning as an interlayer film may function as a planarization film that covers a roughness thereunder. For example, a top surface of the insulator 322 may be planarized by planarization treatment using a chemical mechanical polishing (CMP) method or the like to improve the planarity.

A wiring layer may be provided over the insulator 326 and the conductor 330. For example, an insulator 350, an insulator 352, and an insulator 354 are stacked in this order in FIG. 20. A conductor 356 is formed in the insulator 350, the insulator 352, and the insulator 354. The conductor 356 functions as a plug or a wiring.

An insulator 210, an insulator 212, the insulator 214, and the insulator 216 are stacked in this order over the insulator 354 and the conductor 356. The conductor 218, a conductor (conductor 205) included in the transistor 200, and the like are embedded in the insulator 210, the insulator 212, the insulator 214, and the insulator 216. Note that the conductor 218 has a function of a plug or a wiring that is electrically connected to the capacitor 100 or the transistor 300. Furthermore, an insulator 150 is provided over the conductor 120 and the insulator 130.

Examples of an insulator that can be used for an interlayer film include an oxide, a nitride, an oxynitride, a nitride oxide, a metal oxide, a metal oxynitride, and a metal nitride oxide, each of which has an insulating property.

For example, when a material having a low dielectric constant is used for the insulator functioning as an interlayer film, the parasitic capacitance between wirings can be reduced. Accordingly, a material is preferably selected depending on the function of an insulator.

For example, the insulator 212, the insulator 352, the insulator 354, and the like preferably include an insulator with a low dielectric constant. The insulators each preferably include, for example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or a resin. Alternatively, the insulators each preferably have a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and a low relative permittivity. Examples of the resin include polyester, polyolefin, polyamide (e.g., nylon and aramid), polyimide, polycarbonate, and acrylic.

It is preferable that one or both of the insulator 130 and the insulator 150 provided over the conductor 112 or the conductor 120 be an insulator having a resistivity higher than or equal to $1.0 \times 10^{12}$ Ωcm and lower than or equal to $1.0 \times 10^{15}$ Ωcm, preferably higher than or equal to $5.0 \times 10^{12}$ Ωcm and lower than or equal to $1.0 \times 10^{14}$ Ωcm, further preferably higher than or equal to $1.0 \times 10^{13}$ Ωcm and lower than or equal to $5.0 \times 10^{13}$ Ωcm. One or both of the insulator 130 and the insulator 150 are preferably an insulator having resistivity in the above range because the insulator or the insulators can disperse charge accumulated between the transistor 200, the transistor 300, the capacitor 100, and wirings such as the conductor 112 and the conductor 120 and can inhibit poor characteristics and electrostatic breakdown of the transistor and a memory device including the transistor due to the charge, while maintaining the insulating property. For such an insulator, silicon nitride or silicon nitride oxide can be used.

In addition, as the insulator having resistivity described above, an insulator 140 may be provided below the conductor 112. In that case, the insulator 140 is formed over the insulator 281; an opening portion is formed in the insulator 140, the insulator 281, the insulator 274, the oxide insulator 280, the insulator 224, the insulator 222, and the like; and the insulator 241 is formed or the conductor 240 that is electrically connected to the transistor 200, the conductor 218, and the like is formed in the opening portion. For the insulator 140, a material similar to that of the insulator 130 or the insulator 150 can be used.

When the transistor using an oxide semiconductor is surrounded by an insulator having a function of inhibiting the passage of oxygen and impurities such as hydrogen, the electrical characteristics of the transistor can be stable. Thus, the insulator having a function of inhibiting the passage of oxygen and impurities such as hydrogen is used for the insulator 210, the insulator 350, and the like.

The insulator having a function of inhibiting the passage of oxygen and impurities such as hydrogen can have, for example, a single-layer structure or a stacked-layer structure of an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Specifically, as the insulator having a function of inhibiting the passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

The conductors that can be used as a wiring or a plug can be formed using a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like. Alternatively, a semiconductor having high electric conductivity, typified by polycrystalline silicon containing an impurity element such as phosphorus, or silicide such as nickel silicide may be used.

For example, as the conductor 328, the conductor 330, the conductor 356, the conductor 218, the conductor 110, the conductor 112, the conductor 120, and the like, a single layer or stacked layers of a conductive material such as a metal material, an alloy material, a metal nitride material, a metal oxide material, and the like that are formed using the above materials can be used. It is preferable to use a high-melting-point material that has both heat resistance and conductivity, such as tungsten or molybdenum, and it is particularly preferable to use tungsten. Alternatively, it is preferable to use a low-resistance conductive material such as aluminum or copper. The use of a low-resistance conductive material can reduce wiring resistance.

<<Wiring or Plug in Layer Provided with Oxide Semiconductor>>

When an oxide semiconductor is used in the transistor 200, an insulator including an excess-oxygen region is sometimes provided around the oxide semiconductor. In that case, an insulator having a barrier property is preferably provided between the insulator including the excess-oxygen region and a conductor provided in the insulator including the excess-oxygen region.

For example, in FIG. 20, the insulator 241 is preferably provided between the conductor 240 and the insulator 281, the insulator 274, the oxide insulator 280, the insulator 224, and the insulator 222. When the insulator 241 exists between the conductor 240 and the insulator 281, the insulator 274, the oxide insulator 280, the insulator 224, and the insulator 222, it is possible to inhibit absorption of oxygen contained in the insulators into the conductor 240, that is, oxidation of the conductor 240.

That is, the excess oxygen contained in the oxide insulator 280, the insulator 281, or the like can be inhibited from being absorbed into the conductor 240 when the insulator 241 is provided. In addition, diffusion of hydrogen, which is an impurity, into the transistor 200 through the conductor 240 can be inhibited when the insulator 241 is included.

Note that an insulating material having a function of inhibiting diffusion of oxygen and impurities such as water and hydrogen is preferably used for the insulator 241. For example, aluminum oxide, hafnium oxide, or the like is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The above is the description of the structure example. With the use of this structure, in the semiconductor device using the transistor including an oxide semiconductor, a change in electrical characteristics can be inhibited and the reliability can be improved. Alternatively, a transistor that includes an oxide semiconductor and has high on-state current can be provided. Alternatively, a transistor that includes an oxide semiconductor and has low off-state current can be provided. Alternatively, a semiconductor device with low power consumption can be provided.

This embodiment can be implemented in an appropriate combination with the structures described in the other embodiments, the example, and the like.

Embodiment 4

In this embodiment, a memory device of one embodiment of the present invention using a transistor in which an oxide is used for a semiconductor (hereinafter referred to as an OS transistor in some cases) and a capacitor (hereinafter, such a memory device is also referred to as an OS memory device in some cases), will be described with reference to FIG. 21 and FIG. 22. The OS memory device includes at least a capacitor and an OS transistor that controls the charging and discharging of the capacitor. Since the OS transistor has extremely low off-state current, the OS memory device has excellent retention characteristics and thus can function as a nonvolatile memory.

<Structure Example of Memory Device>

Figure 21A:
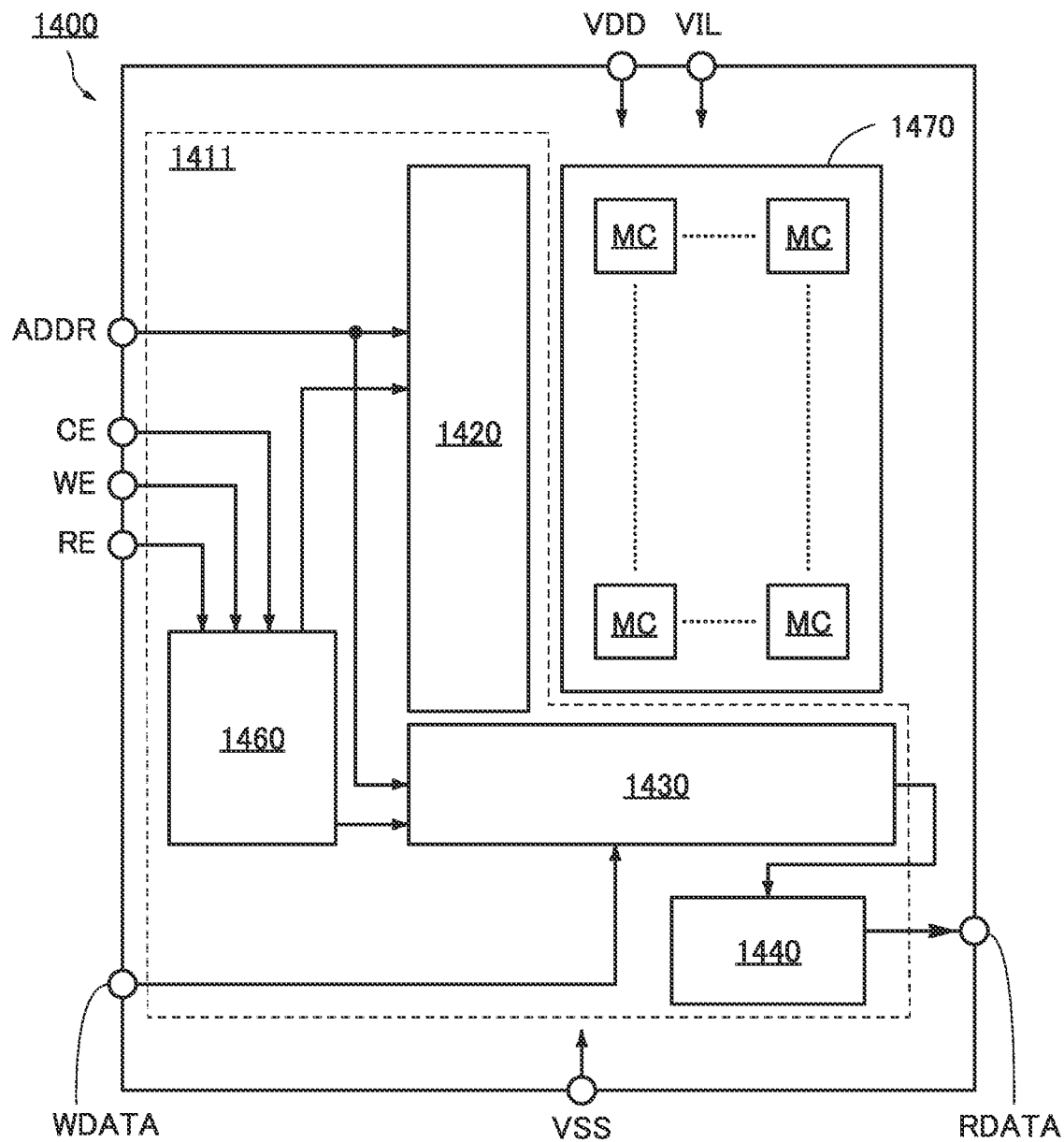
FIG. 21(A) is a block diagram illustrating a structure example of a memory device of one embodiment of the present invention.

FIG. 21(A) illustrates a structure example of the OS memory device. A memory device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a precharge circuit, a sense amplifier, a write circuit, and the like. The precharge circuit has a function of precharging wirings. The sense amplifier has a function of amplifying a data signal read from a memory cell. Note that the above wirings are connected to the memory cell included in the memory cell array 1470, and will be described later in detail. The amplified data signal is output as a data signal RDATA to the outside of the memory device 1400 through the output circuit 1440. The row circuit 1420 includes, for example, a row decoder and a word line driver circuit, and can select a row to be accessed.

As power supply voltages from the outside, a low power supply voltage (VSS), a high power supply voltage (VDD) for the peripheral circuit 1411, and a high power supply voltage (VIL) for the memory cell array 1470 are supplied to the memory device 1400. Control signals (CE, WE, and RE), an address signal ADDR, and a data signal WDATA are also input to the memory device 1400 from the outside. The address signal ADDR is input to the row decoder and the column decoder, and the data signal WDATA is input to the write circuit.

The control logic circuit 1460 processes the control signals (CE, WE, and RE) from the outside, and generates control signals for the row decoder and the column decoder. CE is a chip enable signal, WE is a write enable signal, and RE is a read-out enable signal. Signals processed by the control logic circuit 1460 are not limited thereto, and other control signals are input as necessary.

The memory cell array 1470 includes a plurality of memory cells MC arranged in a matrix and a plurality of wirings. Note that the number of the wirings that connect the memory cell array 1470 to the row circuit 1420 depends on the structure of the memory cell MC, the number of the memory cells MC in a column, and the like. The number of the wirings that connect the memory cell array 1470 to the column circuit 1430 depends on the structure of the memory cell MC, the number of the memory cells MC in a row, and the like.

Figure 21B:
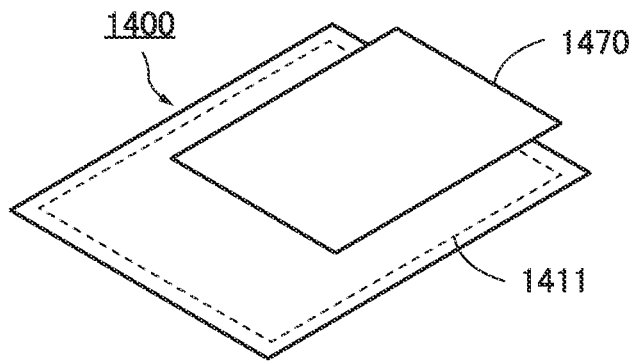
FIG. 21(B) is a schematic diagram illustrating a structure example of the memory device of one embodiment of the present invention.

Note that FIG. 21(A) illustrates an example in which the peripheral circuit 1411 and the memory cell array 1470 are formed on the same plane; however, this embodiment is not limited thereto. For example, as illustrated in FIG. 21(B), the memory cell array 1470 may be provided to overlap part of the peripheral circuit 1411. For example, the sense amplifier may be provided below the memory cell array 1470 so that they overlap with each other.

FIG. 22 illustrates configuration examples of memory cells applicable to the memory cell MC.

[DOSRAM]

Figure 22A:
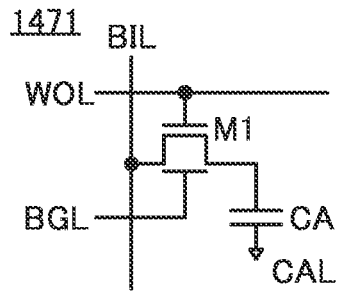
FIG. 22(A) to FIG. 22(H) are circuit diagrams each illustrating a configuration example of a memory device of one embodiment of the present invention.
Figure 22B:
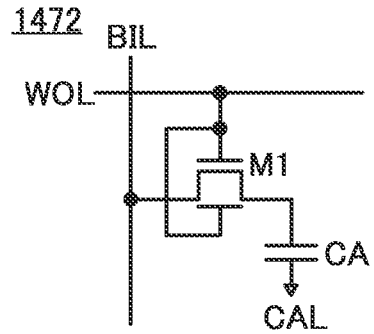
Figure 22C:
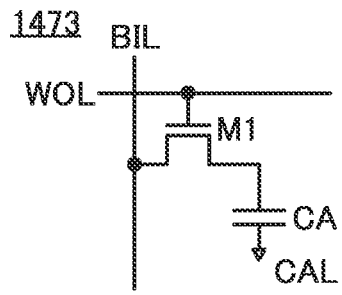
Figure 22D:
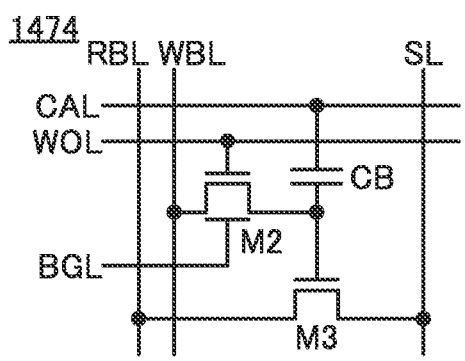
Figure 22E:
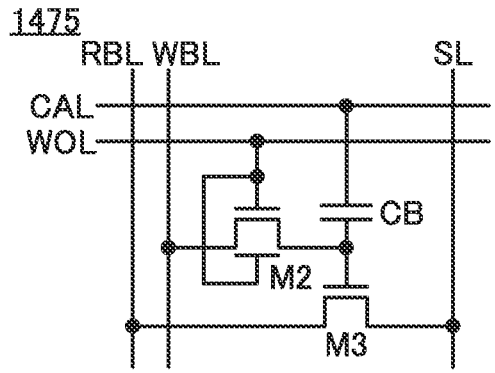
Figure 22F:
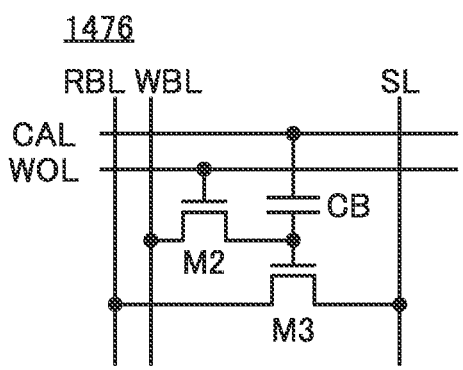
Figure 22G:
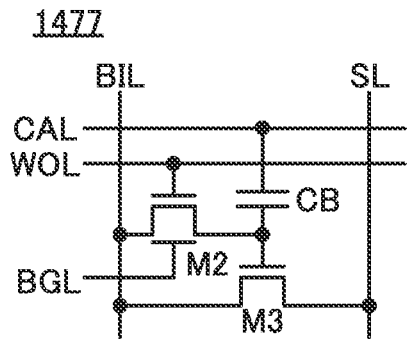

FIGS. 22(A) to 22(C) each illustrate a circuit configuration example of a memory cell of a DRAM. In this specification and the like, a DRAM using a memory cell including one OS transistor and one capacitor is referred to as a DOSRAM in some cases. A memory cell 1471 illustrated in FIG. 22(A) includes a transistor M1 and a capacitor CA. Note that the transistor M1 includes a gate (also referred to as a top gate in some cases) and a back gate.

A first terminal of the transistor M1 is connected to a first terminal of the capacitor CA, a second terminal of the transistor M1 is connected to a wiring BIL, the gate of the transistor M1 is connected to a wiring WOL, and the back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. At the time of data writing and data reading, a low-level potential is preferably applied to the wiring CAL. The wiring BGL functions as a wiring for applying a potential to the back gate of the transistor M1. Applying a given potential to the wiring BGL can increase or decrease the threshold voltage of the transistor M1.

The memory cell MC is not limited to the memory cell 1471, and the circuit configuration can be changed. For example, as in a memory cell 1472 illustrated in FIG. 22(B), the back gate of the transistor M1 may be connected not to the wiring BGL but to the wiring WOL in the memory cell MC. Alternatively, for example, the memory cell MC may be a memory cell including a single-gate transistor, that is, the transistor M1 not including a back gate, as in a memory cell 1473 illustrated in FIG. 22(C).

In the case where the semiconductor device described in any of the above embodiments is used in the memory cell 1471 and the like, the transistor 200 can be used as the transistor M1, and the capacitor 100 can be used as the capacitor CA. When an OS transistor is used as the transistor M1, the leakage current of the transistor M1 can be extremely low. That is, with the use of the transistor M1, written data can be retained for a long time, and thus the frequency of refresh operation for the memory cell can be decreased. In addition, the refresh operation of the memory cell can be unnecessary. In addition, since the transistor M1 has extremely low leakage current, multi-level data or analog data can be retained in the memory cell 1471, the memory cell 1472, and the memory cell 1473.

In the DOSRAM, when the sense amplifier is provided below the memory cell array 1470 so that they overlap with each other as described above, the bit line can be shortened. Thus, the bit line capacitance can be small, and the storage capacitance of the memory cell can be reduced.

[NOSRAM]

FIGS. 22(D) to 22(G) each illustrate a circuit configuration example of a gain-cell memory cell including two transistors and one capacitor. A memory cell 1474 illustrated in FIG. 22(D) includes a transistor M2, a transistor M3, and a capacitor CB. Note that the transistor M2 includes a top gate (simply referred to as a gate in some cases) and a back gate. In this specification and the like, a memory device including a gain-cell memory cell using an OS transistor as the transistor M2 is referred to as NOSRAM (Nonvolatile Oxide Semiconductor RAM) in some cases.

A first terminal of the transistor M2 is connected to a first terminal of the capacitor CB, a second terminal of the transistor M2 is connected to a wiring WBL, the gate of the transistor M2 is connected to the wiring WOL, and the back gate of the transistor M2 is connected to the wiring BGL. A second terminal of the capacitor CB is connected to the wiring CAL. A first terminal of the transistor M3 is connected to a wiring RBL, a second terminal of the transistor M3 is connected to a wiring SL, and a gate of the transistor M3 is connected to the first terminal of the capacitor CB.

The wiring WBL functions as a write bit line, the wiring RBL functions as a read bit line, and the wiring WOL functions as a word line. The wiring CAL functions as a wiring for applying a predetermined potential to the second terminal of the capacitor CB. While data writing, data retaining, and data reading, a low-level potential is preferably applied to the wiring CAL. The wiring BGL functions as a wiring for applying a potential to the back gate of the transistor M2. By application of a given potential to the wiring BGL, the threshold voltage of the transistor M2 can be increased or decreased.

The memory cell MC is not limited to the memory cell 1474, and the circuit configuration can be changed as appropriate. For example, as in a memory cell 1475 illustrated in FIG. 22(E), the back gate of the transistor M2 may be connected not to the wiring BGL but to the wiring WOL in the memory cell MC. Alternatively, for example, the memory cell MC may be a memory cell including a single-gate transistor, that is, the transistor M2 not including a back gate, as in a memory cell 1476 illustrated in FIG. 22(F). Alternatively, for example, in the memory cell MC, the wiring WBL and the wiring RBL may be combined into one wiring BIL, as in a memory cell 1477 illustrated in FIG. 22(G).

In the case where the semiconductor device described in any of the above embodiments is used in the memory cell 1474 and the like, the transistor 200 can be used as the transistor M2, the transistor 300 can be used as the transistor M3, and the capacitor 100 can be used as the capacitor CB. When an OS transistor is used as the transistor M2, the leakage current of the transistor M2 can be extremely low. Consequently, with the use of the transistor M2, written data can be retained for a long time, and thus the frequency of refresh operation for the memory cell can be decreased. In addition, the refresh operation of the memory cell can be unnecessary. In addition, since the transistor M2 has extremely low leakage current, multi-level data or analog data can be retained in the memory cell 1474. The same applies to the memory cell 1475 to the memory cell 1477.

Note that the transistor M3 may be a transistor containing silicon in a channel formation region (hereinafter, also referred to as a Si transistor in some cases). The conductivity type of the Si transistor may be either an n-channel type or a p-channel type. A Si transistor has higher field-effect mobility than an OS transistor in some cases. Therefore, a Si transistor may be used as the transistor M3 functioning as a reading transistor. Furthermore, the transistor M2 can be provided to be stacked over the transistor M3 when a Si transistor is used as the transistor M3; therefore, the area occupied by the memory cell can be reduced, leading to high integration of the memory device.

Alternatively, the transistor M3 may be an OS transistor. When an OS transistor is used as each of the transistor M2 and the transistor M3, the circuit of the memory cell array 1470 can be formed using only n-channel transistors.

Figure 22H:
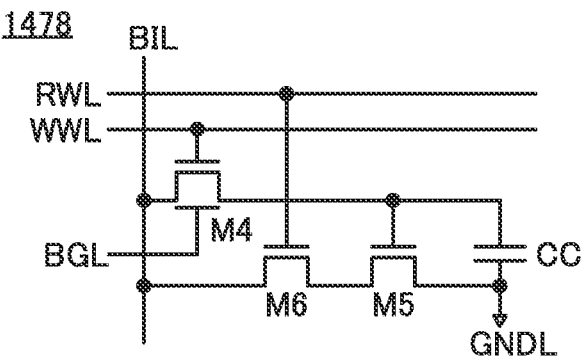

FIG. 22(H) illustrates an example of a gain-cell memory cell including three transistors and one capacitor. A memory cell 1478 illustrated in FIG. 22(H) includes a transistor M4 to a transistor M6 and a capacitor CC. The capacitor CC is provided as appropriate. The memory cell 1478 is electrically connected to the wiring BIL, a wiring RWL, a wiring WWL, the wiring BGL, and a wiring GNDL. The wiring GNDL is a wiring for supplying a low-level potential. Note that the memory cell 1478 may be electrically connected to the wiring RBL and the wiring WBL instead of the wiring BIL.

The transistor M4 is an OS transistor including a back gate, and the back gate is electrically connected to the wiring BGL. Note that the back gate and a gate of the transistor M4 may be electrically connected to each other. Alternatively, the transistor M4 does not necessarily include the back gate.

Note that each of the transistor M5 and the transistor M6 may be an n-channel Si transistor or a p-channel Si transistor. Alternatively, the transistor M4 to the transistor M6 may be OS transistors, in which case the circuit of the memory cell array 1470 can be formed using only n-channel transistors.

In the case where the semiconductor device described in any of the above embodiments is used in the memory cell 1478, the transistor 200 can be used as the transistor M4, the transistor 300 can be used as the transistor M5 and the transistor M6, and the capacitor 100 can be used as the capacitor CC. When an OS transistor is used as the transistor M4, the leakage current of the transistor M4 can be extremely low.

Note that the configurations of the peripheral circuit 1411, the memory cell array 1470, and the like described in this embodiment are not limited to the above. Positions and functions of these circuits, wirings connected to the circuits, circuit elements, and the like can be changed, removed, or added as needed.

The structure described in this embodiment can be used in an appropriate combination with the structures described in the other embodiments, the example, and the like.

Embodiment 5

In this embodiment, an example of a chip 1200 on which the semiconductor device of the present invention is mounted will be described with reference to FIG. 23. A plurality of circuits (systems) are mounted on the chip 1200. A technique for integrating a plurality of circuits (systems) into one chip is referred to as system on chip (SoC) in some cases.

Figure 23A:
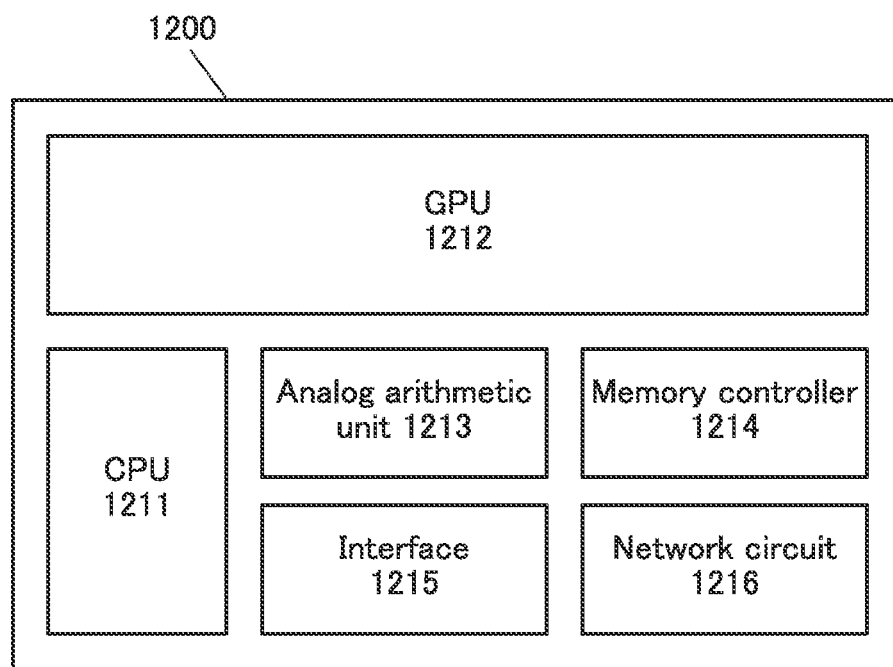
FIG. 23(A) and FIG. 23(B) are schematic diagrams of a semiconductor device of one embodiment of the present invention.

As illustrated in FIG. 23(A), the chip 1200 includes a CPU (Central Processing Unit) 1211, a GPU (Graphics Processing Unit) 1212, one or more of analog arithmetic units 1213, one or more of memory controllers 1214, one or more of interfaces 1215, one or more of network circuits 1216, and the like.

Figure 23B:
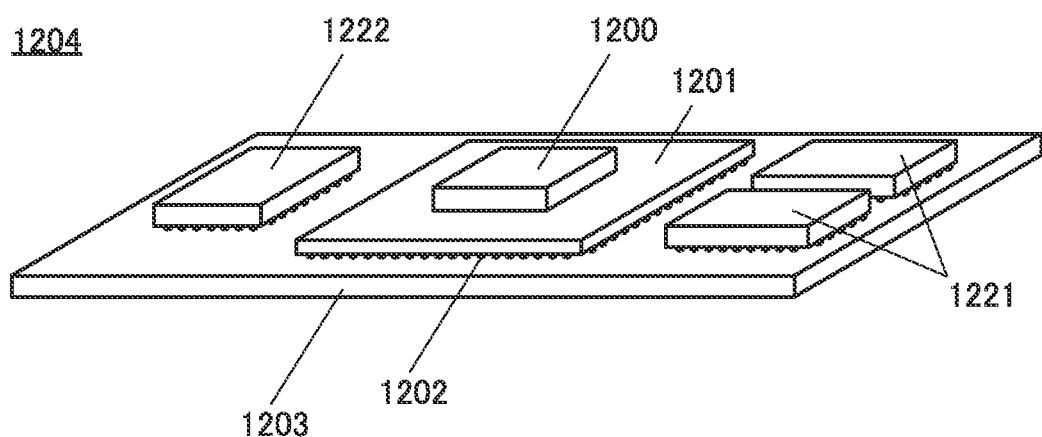

A bump (not illustrated) is provided on the chip 1200, and as illustrated in FIG. 23(B), the chip 1200 is connected to a first surface of a printed circuit board (PCB) 1201. In addition, a plurality of bumps 1202 are provided on a rear surface of the first surface of the PCB 1201, and the PCB 1201 is connected to a motherboard 1203.

Memory devices such as a DRAM 1221 and a flash memory 1222 may be provided over the motherboard 1203. For example, the DOSRAM described in the above embodiment can be used as the DRAM 1221. In addition, for example, the NOSRAM described in the above embodiment can be used as the flash memory 1222.

The CPU 1211 preferably includes a plurality of CPU cores. In addition, the GPU 1212 preferably includes a plurality of GPU cores. Furthermore, the CPU 1211 and the GPU 1212 may each include a memory for temporarily storing data. Alternatively, a memory common to the CPU 1211 and the GPU 1212 may be provided in the chip 1200. The NOSRAM or the DOSRAM described above can be used as the memory. Moreover, the GPU 1212 is suitable for parallel computation of many pieces of data and thus can be used for image processing or product-sum operation. When an image processing circuit or a product-sum operation circuit using an oxide semiconductor of the present invention is provided in the GPU 1212, image processing and product-sum operation can be performed with low power consumption.

In addition, since the CPU 1211 and the GPU 1212 are provided on the same chip, a wiring between the CPU 1211 and the GPU 1212 can be shortened, and the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/analog) converter circuit. Furthermore, the above product-sum operation circuit may be provided in the analog arithmetic unit 1213.

The memory controller 1214 includes a circuit functioning as a controller of the DRAM 1221 and a circuit functioning as an interface of the flash memory 1222.

The interface 1215 includes an interface circuit for an external connection device such as a display device, a speaker, a microphone, a camera, or a controller. Examples of the controller include a mouse, a keyboard, and a game controller. As such an interface, a USB (Universal Serial Bus), an HDMI (registered trademark) (High-Definition Multimedia Interface), or the like can be used.

The network circuit 1216 includes a network circuit such as a LAN (Local Area Network). The network circuit 1216 may further include a circuit for network security.

The above circuits (systems) can be formed in the chip 1200 through the same manufacturing process. Therefore, even when the number of circuits needed for the chip 1200 increases, there is no need to increase the number of manufacturing processes; thus, the chip 1200 can be fabricated at low cost.

The motherboard 1203 provided with the PCB 1201 on which the chip 1200 including the GPU 1212 is mounted, the DRAM 1221, and the flash memory 1222 can be referred to as a GPU module 1204.

The GPU module 1204 includes the chip 1200 using the SoC technology, and thus can have a small size. In addition, the GPU module 1204 is excellent in image processing, and thus is suitably used in a portable electronic device such as a smartphone, a tablet terminal, a laptop PC, or a portable (mobile) game machine. Furthermore, the product-sum operation circuit using the GPU 1212 can execute a method in a deep neural network (DNN), a convolutional neural network (CNN), a recurrent neural network (RNN), an autoencoder, a deep Boltzmann machine (DBM), a deep belief network (DBN), or the like; thus, the chip 1200 can be used as an AI chip or the GPU module 1204 can be used as an AI system module.

The structure described in this embodiment can be used in an appropriate combination with the structures described in the other embodiments, the example, and the like.

Embodiment 6

In this embodiment, application examples of the memory device using the semiconductor device described in the above embodiment will be described. The semiconductor device described in the above embodiment can be applied to, for example, memory devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is applied to a variety of removable memory devices such as memory cards (e.g., SD cards), USB memories, and SSDs (solid state drives). FIG. 24 schematically illustrates some structure examples of removable memory devices. The semiconductor device described in the above embodiment is processed into a packaged memory chip and used in a variety of storage devices and removable memories, for example.

FIG. 24(A) is a schematic diagram of a USB memory. A USB memory 1100 includes a housing 1101, a cap 1102, a USB connector 1103, and a substrate 1104. The substrate 1104 is held in the housing 1101. The substrate 1104 is provided with a memory chip 1105 and a controller chip 1106, for example. The semiconductor device described in the above embodiment can be incorporated in the memory chip 1105 or the like on the substrate 1104.

FIG. 24(B) is a schematic external diagram of an SD card, and FIG. 24(C) is a schematic diagram of the internal structure of the SD card. An SD card 1110 includes a housing 1111, a connector 1112, and a substrate 1113. The substrate 1113 is held in the housing 1111. The substrate 1113 is provided with a memory chip 1114 and a controller chip 1115, for example. When the memory chip 1114 is also provided on the rear surface side of the substrate 1113, the capacity of the SD card 1110 can be increased. In addition, a wireless chip with a radio communication function may be provided on the substrate 1113. Accordingly, data can be read from and written in the memory chip 1114 by radio communication between a host device and the SD card 1110.

The semiconductor device described in the above embodiment can be incorporated in the memory chip 1114 or the like on the substrate 1113.

FIG. 24(D) is a schematic external diagram of an SSD, and FIG. 24(E) is a schematic diagram of the internal structure of the SSD. An SSD 1150 includes a housing 1151, a connector 1152, and a substrate 1153. The substrate 1153 is held in the housing 1151. The substrate 1153 is provided with a memory chip 1154, a memory chip 1155, and a controller chip 1156, for example.

The memory chip 1155 is a work memory of the controller chip 1156, and a DOSRAM chip can be used, for example. When the memory chip 1154 is also provided on the rear surface side of the substrate 1153, the capacity of the SSD 1150 can be increased. The semiconductor device described in the above embodiment can be incorporated in the memory chip 1154 or the like on the substrate 1153.

This embodiment can be implemented in an appropriate combination with the structures described in the other embodiments, the example, and the like.

Embodiment 7

The semiconductor device of one embodiment of the present invention can be used for a processor such as a CPU and a GPU or a chip. FIG. 25 illustrates specific examples of electronic devices including a processor such as a CPU or a GPU or a chip of one embodiment of the present invention.

<Electronic Device and System>

The GPU or the chip of one embodiment of the present invention can be mounted on a variety of electronic devices. Examples of electronic devices include a digital camera, a digital video camera, a digital photo frame, a mobile phone, a portable game machine, a portable information terminal, and an audio reproducing device in addition to electronic devices provided with a relatively large screen, such as a television device, a desktop or laptop personal computer, a monitor for a computer and the like, digital signage, and a large game machine like a pachinko machine. When the integrated circuit or the chip of one embodiment of the present invention is provided in an electronic device, the electronic device can include artificial intelligence.

The electronic device of one embodiment of the present invention may include an antenna. When a signal is received by the antenna, the electronic device can display video, data, or the like on a display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radioactive rays, flow rate, humidity, gradient, oscillation, a smell, or infrared rays).

The electronic device of one embodiment of the present invention can have a variety of functions. For example, the electronic device can have a function of displaying a variety of data (a still image, a moving image, a text image, and the like) on a display portion, a touch panel function, a function of displaying a calendar, date, time, and the like, a function of executing a variety of software (programs), a wireless communication function, and a function of reading out a program or data stored in a recording medium. FIG. 25 illustrates examples of electronic devices.

[Mobile Phone]

Figure 25A:
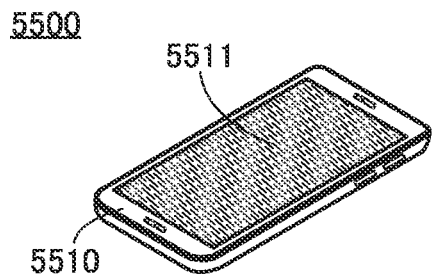

FIG. 25(A) illustrates a mobile phone (smartphone), which is a type of information terminal. An information terminal 5500 includes a housing 5510 and a display portion 5511. As input interfaces, a touch panel is provided in the display portion 5511 and a button is provided in the housing 5510.

The information terminal 5500 can execute an application utilizing artificial intelligence, with the use of the chip of one embodiment of the present invention. Examples of the application utilizing artificial intelligence include an application for recognizing a conversation and displaying its content on the display portion 5511; an application for recognizing letters, figures, and the like input to the touch panel of the display portion 5511 by a user and displaying them on the display portion 5511; and an application for biometric authentication using fingerprints, voice prints, or the like.

[Information Terminal]

Figure 25B:
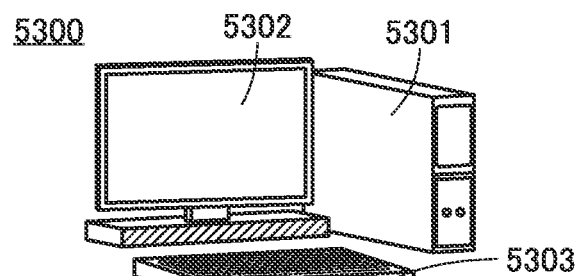

FIG. 25(B) illustrates a desktop information terminal 5300. The desktop information terminal 5300 includes a main body 5301 of the information terminal, a display 5302, and a keyboard 5303.

Like the information terminal 5500 described above, the desktop information terminal 5300 can execute an application utilizing artificial intelligence, with the use of the chip of one embodiment of the present invention. Examples of the application utilizing artificial intelligence include design-support software, text correction software, and software for automatic menu generation. Furthermore, with the use of the desktop information terminal 5300, novel artificial intelligence can be developed.

Note that in the above description, the smartphone and the desktop information terminal are illustrated as examples of the electronic devices in FIGS. 25(A) and 25(B); alternatively, the electronic device can be an information terminal other than the smartphone and the desktop information terminal. Examples of information terminals other than a smartphone and a desktop information terminal include a PDA (Personal Digital Assistant), a laptop information terminal, and a workstation.

[Household Appliance]

Figure 25C:
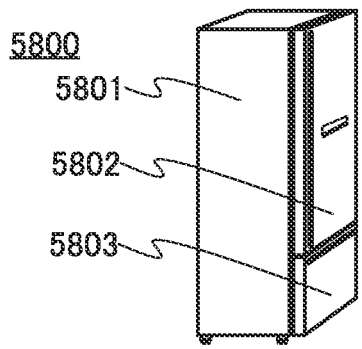

FIG. 25(C) illustrates an electric refrigerator-freezer 5800 as an example of a household appliance. The electric refrigerator-freezer 5800 includes a housing 5801, a refrigerator door 5802, a freezer door 5803, and the like.

When the chip of one embodiment of the present invention is used in the electric refrigerator-freezer 5800, the electric refrigerator-freezer 5800 including artificial intelligence can be achieved. Utilizing the artificial intelligence enables the electric refrigerator-freezer 5800 to have a function of automatically generating a menu based on foods stored in the electric refrigerator-freezer 5800 and expiration dates of the foods, for example, a function of automatically adjusting the temperature to be appropriate for the foods stored in the electric refrigerator-freezer 5800, and the like.

Although the electric refrigerator-freezer is described here as an example of a household appliance, other examples of a household appliance include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

[Game Machine]

Figure 25D:
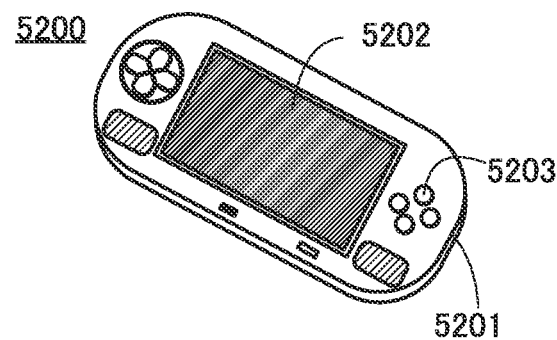
Figure 25D:
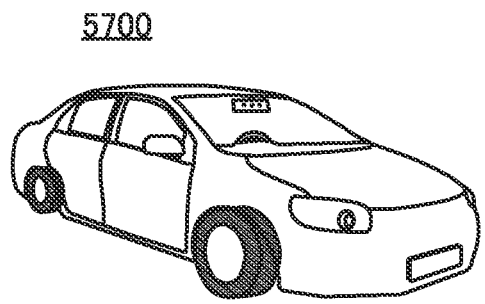
Figure 25D:
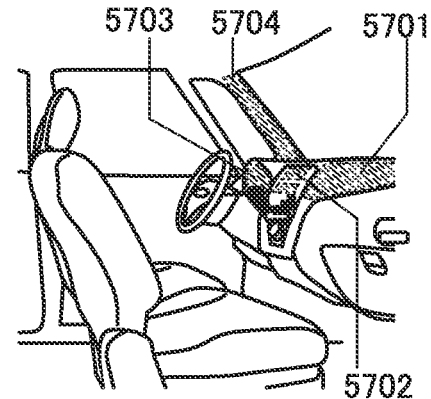

FIG. 25(D) illustrates a portable game machine 5200 as an example of a game machine. The portable game machine includes a housing 5201, a display portion 5202, a button 5203, and the like.

When the GPU or the chip of one embodiment of the present invention is used in the portable game machine 5200, the portable game machine 5200 with low power consumption can be achieved. Moreover, heat generation from a circuit can be reduced owing to low power consumption; thus, the influence of heat generation on the circuit, the peripheral circuit, and the module can be reduced.

Furthermore, when the GPU or the chip of one embodiment of the present invention is used in the portable game machine 5200, the portable game machine 5200 including artificial intelligence can be achieved.

Basically, the progress of a game, the actions and words of game characters, and expressions of a phenomenon and the like occurring in the game are determined by a program in the game; however, the use of artificial intelligence in the portable game machine 5200 enables expressions not limited by the game program. For example, expressions are possible in which a question posed by a player, the progress of the game, time, and the actions and words of game characters are changed.

When a game requiring a plurality of players is played on the portable game machine 5200, the artificial intelligence can create a virtual game player; thus, the game can be played alone with the game player created by the artificial intelligence as an opponent.

Although the portable game machine is illustrated as an example of a game machine in FIG. 25(D), the game machine using the GPU or the chip of one embodiment of the present invention is not limited thereto. Examples of the game machine using the GPU or the chip of one embodiment of the present invention include a home stationary game machine, an arcade game machine installed in entertainment facilities (a game center, an amusement park, and the like), and a throwing machine for batting practice installed in sports facilities.

[Moving Vehicle]

The GPU or the chip of one embodiment of the present invention can be used in an automobile, which is a moving vehicle, and the periphery of a driver's seat in the automobile.

FIG. 25(E1) illustrates an automobile 5700 as an example of a moving vehicle, and FIG. 25(E2) is a diagram illustrating the periphery of a windshield inside the automobile. FIG. 25(E2) illustrates a display panel 5701, a display panel 5702, and a display panel 5703 that are attached to a dashboard and a display panel 5704 that is attached to a pillar.

The display panel 5701 to the display panel 5703 can provide a variety of kinds of information by displaying a speedometer, a tachometer, a mileage, a fuel meter, a gearshift indicator, air-condition setting, and the like. The content, layout, or the like of the display on the display panels can be changed as appropriate to suit the user's preference, so that the design can be improved. The display panel 5701 to the display panel 5703 can also be used as lighting devices.

The display panel 5704 can compensate for the view obstructed by the pillar (a blind spot) by showing an image taken by an imaging device (not illustrated) provided for the automobile 5700. That is, displaying an image taken by the imaging device provided on the outside of the automobile 5700 leads to compensation for the blind spot and enhancement of safety. In addition, showing an image for compensating for the area which a driver cannot see makes it possible for the driver to confirm safety more easily and comfortably. The display panel 5704 can also be used as a lighting device.

Since the GPU or the chip of one embodiment of the present invention can be used as a component of artificial intelligence, the chip can be used in an automatic driving system of the automobile 5700, for example. The chip can also be used for a system for navigation, risk prediction, or the like. The display panel 5701 to the display panel 5704 may display information regarding navigation, risk prediction, and the like.

An example of a moving vehicle includes an automobile as described above, but is not limited thereto. Examples of moving vehicles include a train, a monorail train, a ship, and a flying object (a helicopter, an unmanned aircraft (a drone), an airplane, and a rocket), and these moving vehicles can include a system utilizing artificial intelligence when the chip of one embodiment of the present invention is applied to each of these moving vehicles.

[Broadcasting System]

The GPU or the chip of one embodiment of the present invention can be used in a broadcasting system.

Figure 25F:
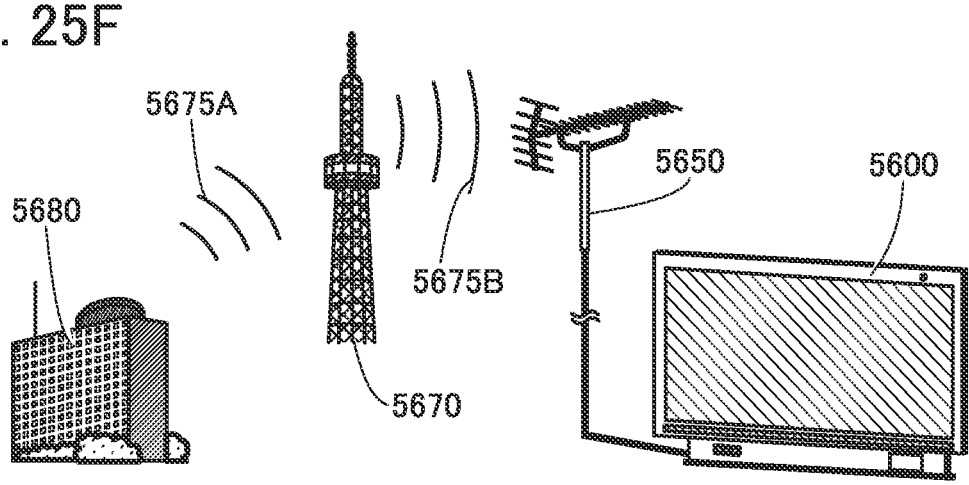

FIG. 25(F) schematically illustrates data transmission in a broadcasting system.

Specifically, FIG. 25(F) illustrates a path in which a radio wave (a broadcasting signal) transmitted from a broadcast station 5680 is delivered to a television receiver (TV) 5600 of each household. The TV 5600 includes a receiving device (not illustrated), and the broadcast signal received by an antenna 5650 is transmitted to the TV 5600 through the receiving device.

Although a UHF (Ultra High Frequency) antenna is illustrated as the antenna 5650 in FIG. 25(F), a BS/110° CS antenna, a CS antenna, or the like can also be used as the antenna 5650.

A radio wave 5675A and a radio wave 5675B are broadcast signals for terrestrial broadcasting; a radio wave tower 5670 amplifies the received radio wave 5675A and transmits the radio wave 5675B. Each household can view terrestrial TV broadcasting on the TV 5600 by receiving the radio wave 5675B with the antenna 5650. Note that the broadcasting system is not limited to the terrestrial broadcasting illustrated in FIG. 25(F) and may be satellite broadcasting using an artificial satellite, data broadcasting using an optical line, or the like.

The above broadcasting system may utilize artificial intelligence by using the chip of one embodiment of the present invention. When the broadcast data is transmitted from the broadcast station 5680 to the TV 5600 of each household, the broadcast data is compressed by an encoder, and when the antenna 5650 receives the broadcast data, the broadcast data is decompressed by a decoder of the receiving device included in the TV 5600. With the use of artificial intelligence, for example, a display pattern included in an image to be displayed can be recognized in motion compensation prediction, which is one of the compressing methods for the encoder. In-frame prediction utilizing artificial intelligence, for example, can also be performed. For another example, when the broadcast data with low resolution is received and displayed on the TV 5600 with high resolution, image interpolation such as upconversion can be performed in the broadcast data decompression by the decoder.

The above broadcasting system utilizing artificial intelligence is suitable for ultra-high definition television (UHDTV: 4K, 8K) broadcasting, which needs a large amount of broadcast data.

As an application of artificial intelligence in the TV 5600, a recording device including artificial intelligence may be provided in the TV 5600, for example. With such a structure, the artificial intelligence in the recording device can learn the user's preference, so that TV programs that suit the user's preference can be recorded automatically.

The electronic devices, the functions of the electronic devices, application examples of artificial intelligence, its effects, and the like described in this embodiment can be combined as appropriate with the description of another electronic device.

This embodiment can be implemented in combination as appropriate with the structures described in the other embodiments, the example, and the like.

Example

In this example, Sample 1A, Sample 1B, Sample 2A, and Sample 2B, which correspond to the oxide insulator 36, the oxide 22b, and the insulator 24 illustrated in FIG. 1 were fabricated, and analysis results of these Samples are described.

First, a method for fabricating Sample 1A, Sample 1B, Sample 2A, and Sample 2B is described.

First, for each of Sample 1A, Sample 1B, Sample 2A, and Sample 2B, by thermal oxidation of a silicon wafer, a silicon oxide film was formed on a surface of the silicon wafer to have a target thickness of 100 nm.

Next, for each of Sample 1A, Sample 1B, Sample 2A, and Sample 2B, an aluminum oxide film was deposited to have a target thickness of 7 nm by an ALD method.

Next, for each of Sample 1A, Sample 1B, Sample 2A, and Sample 2B, a silicon oxynitride film was deposited to have a target thickness of 35 nm by a PECVD method. An $SiH_4$ gas at 1 sccm and an $N_2O$ gas at 800 sccm were used as the deposition gas, the deposition pressure was 40 Pa, the deposition power was 150 W (60 MHz), the substrate temperature was 400° C., and the distance between electrodes was 28 mm. The silicon oxynitride film corresponds to the oxide insulator 36.

Next, for each of Sample 1A and Sample 1B, Sample 2A, and Sample 2B, an aluminum oxide film was deposited to have a target thickness of 50 nm by an RF sputtering method. Note that an $Al_2O_3$ target was used for the deposition of the aluminum oxide film. An argon gas at 25 sccm and an oxygen gas at 25 sccm were used as the deposition gas, the deposition pressure was 0.4 Pa (measured by B-A Gauge BRG-1B manufactured by CANON ANELVA CORPORATION), the deposition power was 2500 W, the substrate temperature was 250° C., and the distance between the target and the substrate was 60 mm. By the deposition of the aluminum oxide film, oxygen was added to the oxide insulator 36.

Next, each of Sample 1A, Sample 1B, Sample 2A, and Sample 2B were subjected to CMP treatment to remove the aluminum oxide film.

Next, for each of Sample 1A, Sample 1B, Sample 2A, and Sample 2B, an In—Ga—Zn oxide film (hereinafter referred to as an IGZO film) was deposited over the above silicon oxynitride film to have a target thickness of 5 nm by a DC sputtering method.

For Sample 1A and Sample 1B, a target with In:Ga:Zn=4:2:4.1 [atomic ratio] was used for the formation of the IGZO film (hereinafter, the IGZO film is referred to as an IGZO film (423)). An oxide gas at 45 sccm was used as the deposition gas, the deposition pressure was 0.7 Pa (measured by Miniature Gauge MG-2 manufactured by CANON ANELVA CORPORATION), the deposition power was 500 W, the substrate temperature was 200° C., and the distance between the target and the substrate was 60 mm. The IGZO film (423) corresponds to the oxide 22b.

For Sample 2A and Sample 2B, a target with In:Ga:Zn=1: 3:4 [atomic ratio] was used for the formation of the IGZO film (hereinafter, the IGZO film is referred to as an IGZO film (134)). An oxide gas at 45 sccm was used as the deposition gas, the deposition pressure was 0.7 Pa (measured by Miniature Gauge MG-2 manufactured by CANON ANELVA CORPORATION), the deposition power was 500 W, the substrate temperature was 200° C., and the distance between the target and the substrate was 60 mm. The IGZO film (134) corresponds to the oxide 22b.

Next, for each of Sample 1A, Sample 1B, Sample 2A, and Sample 2B, a silicon oxynitride film was deposited to have a target thickness of 10 nm by a PECVD method. An $SiH_4$ gas at 1 sccm and an $N_2O$ gas at 800 sccm were used as the deposition gas, the deposition pressure was 200 Pa, the deposition power was 150 W (60 MHz), the substrate temperature was 400° C., and the distance between electrodes was 28 mm. The silicon oxynitride film corresponds to the insulator 24.

Next, Sample 1A and Sample 2A were subjected to heat treatment at 400° C. for one hour in a nitrogen atmosphere.

Next, Sample 1A, Sample 1B, Sample 2A, and Sample 2B were subjected to wet etching using an ammonia hydrogen peroxide mixture (a mixture of hydrogen peroxide water, ammonia water, and water) at a liquid temperature of 60° C. to remove the 10-nm-thick silicon oxynitride film and the 5-nm-thick IGZO film.

Figure 26A:
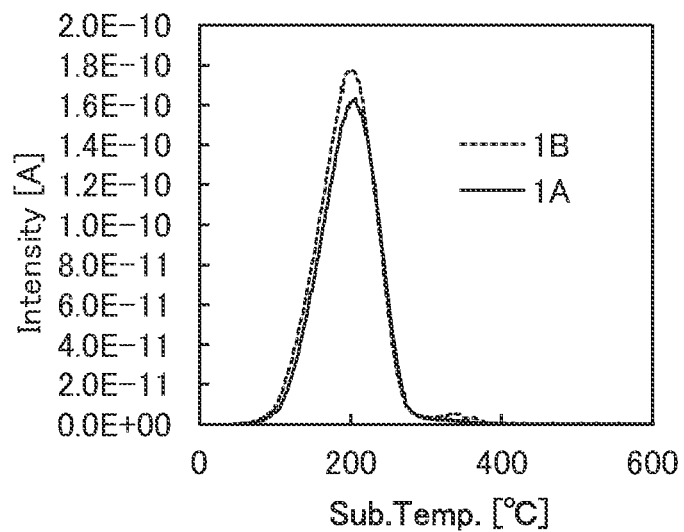
FIG. 26(A) and FIG. 26(B) are diagrams each showing TDS analysis results of samples of the example.
Figure 26B:
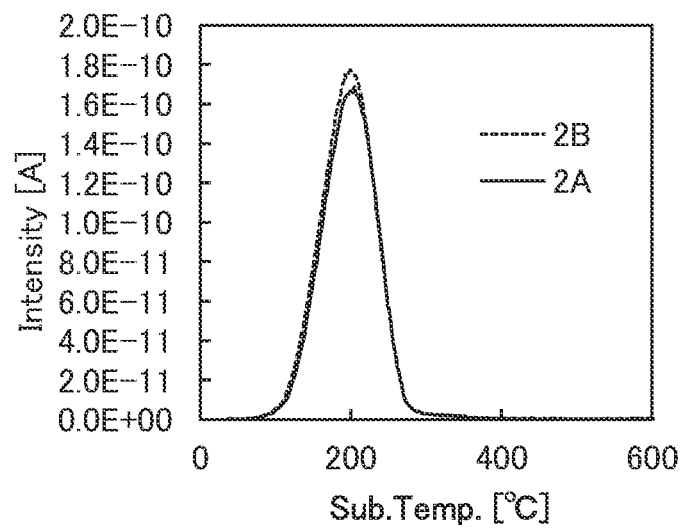

FIG. 26(A) shows the results of TDS analysis performed on Sample 1A and Sample 1B fabricated in the above manner. In addition, FIG. 26(B) shows the results of TDS analysis performed on Sample 2A and Sample 2B. Note that in the TDS analysis, the amount of a released gas with a mass-to-charge ratio m/z=32, which corresponds to an oxygen molecule, was measured. In FIGS. 26(A) and 26(B), the horizontal axis represents substrate heating temperature [° C.] and the vertical axis represents intensity proportional to the amount of the released gas with a mass-to-charge ratio.

The amount of oxygen molecules released from Sample 1A and Sample 1B, which was calculated from the TDS profile shown in FIG. 26(A), was $9.5 \times 10^{14}$ molecules/cm² for Sample 1A and $1.1 \times 10^{15}$ molecules/cm² for Sample 1B. In other words, the amount of oxygen molecules released from Sample 1A subjected to heat treatment is smaller than that released from Sample 1B not subjected to heat treatment. Therefore, it is supposed that oxygen contained in the silicon oxynitride film is diffused into the IGZO film (423) in Sample 1A subjected to heat treatment.

The amount of oxygen molecules released from Sample 2A and Sample 2B, which was calculated from the TDS profile shown in FIG. 26(B), was $9.3 \times 10^{14}$ molecules/cm² for Sample 2A and $1.1 \times 10^{15}$ molecules/cm² for Sample 2B. In other words, the amount of oxygen molecules released from Sample 2A subjected to heat treatment is smaller than that released from Sample 2B not subjected to heat treatment. Therefore, it is supposed that oxygen contained in the silicon oxynitride film is diffused into the IGZO film (134) in Sample 2A subjected to heat treatment.

Accordingly, it is indicated that excess oxygen contained in the oxide insulator 36 is diffused into the oxide 22b as illustrated in the model of FIG. 1.

Next, Sample 2C which corresponds to the oxide insulator 36, the oxide 22b, the insulator 24, and the conductor 26 illustrated in FIG. 1 was fabricated, and TDS analysis was performed.

Sample 2C is a sample in which a conductive film corresponding to the conductor 26 was deposited after the deposition of the silicon oxynitride film corresponding to the insulator 24 in the fabrication process of Sample 2A. The conductive film is a conductive film in which a 10-nm-thick titanium nitride film and a 150-nm-thick tungsten film are deposited in this order using a CVD apparatus.

Figure 27:
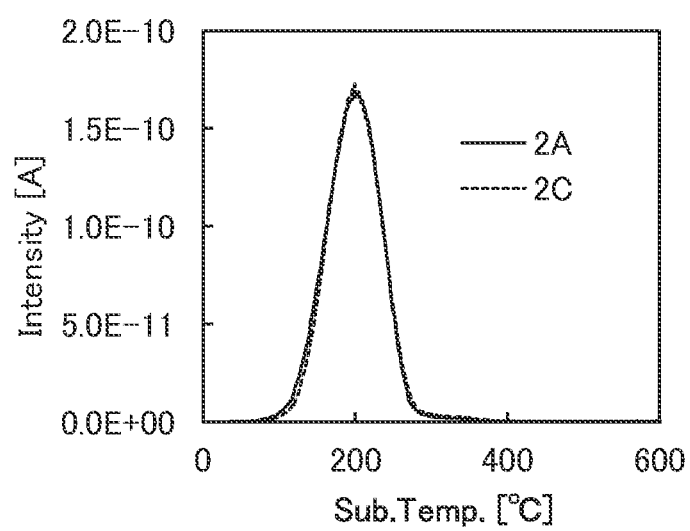
FIG. 27 is a diagram showing TDS analysis results of samples of the example.

FIG. 27 shows the TDS analysis results of Sample 2A and Sample 2C. Note that in the TDS analysis, the amount of a released gas with a mass-to-charge ratio m/z=32, which corresponds to an oxygen molecule, was measured. In FIG. 27, the horizontal axis represents substrate heating temperature [° C.] and the vertical axis represents intensity proportional to the amount of the released gas with a mass-to-charge ratio.

As shown in FIG. 27, the profiles of Sample 2A and Sample 2C had substantially the same shape, and no significant difference was found in the released amount of oxygen molecules. This indicates that the amount of oxygen absorbed from the silicon oxynitride corresponding to the oxide insulator 36 does not change depending on whether the conductive film corresponding to the conductor 26 is included or not.

Accordingly, as illustrated in the model of FIG. 1, it is indicated that when the oxide insulator 36 is isolated from the insulator 24 and the conductor 26 with the oxide 22b therebetween, an excessive amount of oxygen is not absorbed from the oxide insulator 36 into the conductor 26 through the insulator 24 at the time of heat treatment.

REFERENCE NUMERALS

20: transistor, 22: oxide, 22a: oxide, 22b: oxide, 24: insulator, 26: conductor, 28: conductor, 28a: conductor, 28b: conductor, 34: insulator, 34a: insulator, 34b: insulator, 36: oxide insulator, 36a: oxide insulator, 36b: oxide insulator, 200: transistor, 205: conductor, 205a: conductor, 205b: conductor, 210: insulator, 212: insulator, 214: insulator, 216: insulator, 218: conductor, 220: insulator, 222: insulator, 224: insulator, 230: oxide, 230a: oxide, 230A: oxide film, 230b: oxide, 230B: oxide film, 230c: oxide, 230C: oxide film, 230d: oxide, 230D: oxide film, 234: region, 240: conductor, 240a: conductor, 240b: conductor, 241: insulator, 241a: insulator, 241b: insulator, 242: conductor, 242a: conductor, 242A: conductive film, 242b: conductor, 242B: conductor layer, 243: region, 243a: region, 243b: region, 244: insulator, 244a: insulator, 244A: insulating film, 244b: insulator, 244B: insulator layer, 250: insulator, 250A: insulating film, 260: conductor, 260a: conductor, 260A: conductive film, 260b: conductor, 260B: conductive film, 274: insulator, 280: oxide insulator, 280a: oxide insulator, 280A: oxide insulating film, 280b: oxide insulator, 280B: insulator layer, 281: insulator, 284a: conductor, 284A: conductive film, 284b: conductor, 284B: conductor layer

The invention claimed is:
1. A semiconductor device comprising:
a first oxide;
a first insulator;
a second insulator;
a third insulator;
a first conductor;
a second conductor;

a third conductor; and first and second oxide insulators, wherein the first conductor is over the first oxide, wherein the second conductor and the third conductor are over the first oxide with the first conductor therebetween, wherein the first oxide insulator is over the second conductor, wherein the second oxide insulator is over the third conductor, wherein the first insulator is between the first conductor and the first oxide, wherein the second insulator is between the second conductor and the first oxide insulator, wherein the third insulator is between the third conductor and the second oxide insulator, wherein the first oxide insulator and the second oxide insulator are in contact with none of the first conductor, the second conductor, the third conductor, and the first oxide, and wherein the first conductor is over the first oxide insulator and the second oxide insulator.

2. The semiconductor device according to claim 1, wherein the second insulator and the third insulator are less likely to allow oxygen to diffuse than the first oxide insulator and the second oxide insulator.

3. The semiconductor device according to claim 1, further comprising a second oxide, wherein the second oxide is in contact with a side surface of the first oxide insulator, a side surface of the second oxide insulator, and a top surface of the first oxide.

4. The semiconductor device according to claim 3, wherein the first oxide and the second oxide each comprise In, an element M (M is Al, Ga, Y, or Sn), and Zn.

5. The semiconductor device according to claim 3, further comprising a third oxide under the first oxide, wherein the third oxide comprises In, an element M (M is Al, Ga, Y, or Sn), and Zn, and wherein an atomic ratio of In to the element M in the third oxide is lower than an atomic ratio of In to the element M in the first oxide.

6. The semiconductor device according to claim 5, further comprising a fourth oxide between the second oxide and the first insulator, wherein the fourth oxide comprises In, an element M (M is Al, Ga, Y, or Sn), and Zn, and wherein an atomic ratio of In to the element M in the fourth oxide is lower than an atomic ratio of In to the element M in the second oxide.

7. A semiconductor device comprising:

a first oxide;

a first insulator;

a second insulator;

a third insulator;

a fourth insulator;

a first conductor;

a second conductor;

a third conductor; and first and second oxide insulators, wherein the first conductor is over the first oxide, wherein the second conductor and the third conductor are over the first oxide with the first conductor therebetween, wherein the first oxide insulator is over the second conductor, wherein the second oxide insulator is over the third conductor, wherein the first insulator is between the first conductor and the first oxide, wherein a part of the first conductor and a part of the first insulator overlap with a part of the first oxide insulator and a part of the second oxide insulator, wherein the second insulator is between the second conductor and the first oxide insulator, wherein the third insulator is between the third conductor and the second oxide insulator, wherein the fourth insulator covers the first oxide insulator, the second oxide insulator, and the first conductor, and wherein the fourth insulator is in contact with a side surface of the first conductor and a side surface of the first insulator.

8. The semiconductor device according to claim 7, further comprising a second oxide, wherein the second oxide is in contact with a side surface of the first oxide insulator, a side surface of the second oxide insulator, and a top surface of the first oxide.

9. The semiconductor device according to claim 8, wherein the first oxide insulator is isolated from the first conductor, the second conductor, the first insulator, and the first oxide by the second insulator, the second oxide, and the fourth insulator, and wherein the second oxide insulator is isolated from the first conductor, the third conductor, the first insulator, and the first oxide by the third insulator, the second oxide, and the fourth insulator.

10. The semiconductor device according to claim 8, wherein the first oxide and the second oxide each comprise In, an element M (M is Al, Ga, Y, or Sn), and Zn.

11. The semiconductor device according to claim 8, further comprising a third oxide under the first oxide, wherein the third oxide comprises In, an element M (M is Al, Ga, Y, or Sn), and Zn, and wherein an atomic ratio of In to the element M in the third oxide is lower than an atomic ratio of In to the element M in the first oxide.

12. The semiconductor device according to claim 11, further comprising a fourth oxide between the second oxide and the first insulator, wherein the fourth oxide comprises In, an element M (M is Al, Ga, Y, or Sn), and Zn, and wherein an atomic ratio of In to the element M in the fourth oxide is lower than an atomic ratio of In to the element M in the second oxide.

13. The semiconductor device according to claim 7, wherein the fourth insulator is in contact with a top surface of the first oxide insulator and a top surface of the second oxide insulator.

14. The semiconductor device according to claim 7, wherein the fourth insulator is an oxide comprising aluminum.

15. The semiconductor device according to claim 7, wherein the fourth insulator is less likely to allow oxygen to diffuse than the first oxide insulator and the second oxide insulator.

16. The semiconductor device according to claim 7, wherein the second insulator and the third insulator are less likely to allow oxygen to diffuse than the first oxide insulator and the second oxide insulator.

17. A semiconductor device comprising:

a first oxide;

a first insulator;

a second insulator;

a third insulator;

atoll a fourth insulator;
a first conductor;
a second conductor;
a third conductor; and
first and second oxide insulators,
wherein the first conductor is over the first oxide,
wherein the second conductor and the third conductor are over the first oxide with the first conductor therebetween,
wherein the first oxide insulator is over the second conductor,
wherein the second oxide insulator is over the third conductor,
wherein the first insulator is between the first conductor and the first oxide,
wherein a part of the first conductor and a part of the first insulator overlap with a part of the first oxide insulator and a part of the second oxide insulator,
wherein the second insulator is in contact with a top surface and a side surface of the second conductor and a side surface of the first oxide,
wherein the third insulator is in contact with a top surface and a side surface of the third conductor and the side surface of the first oxide,
wherein the fourth insulator is over the first oxide insulator, the second oxide insulator, and the first conductor, and
wherein the fourth insulator is in contact with a side surface of the first conductor and a side surface of the first insulator.

18. The semiconductor device according to claim 17, wherein a thickness of the first oxide insulator and the second oxide insulator in a region overlapping with the first oxide is smaller than a thickness of the first oxide insulator and the second oxide insulator in a region not overlapping with the first oxide.

19. The semiconductor device according to claim 17, wherein the first oxide insulator and the second oxide insulator are integrated and have an opening overlapping with a region between the second conductor and the third conductor, and
wherein the second insulator and the third insulator are integrated and have an opening overlapping with the region between the second conductor and the third conductor.

20. The semiconductor device according to claim 17, wherein the fourth insulator is in contact with a top surface of the first oxide insulator and a top surface of the second oxide insulator.

21. The semiconductor device according to claim 17, wherein the fourth insulator is an oxide comprising aluminum.

22. The semiconductor device according to claim 17, wherein the fourth insulator is less likely to allow oxygen to diffuse than the first oxide insulator and the second oxide insulator.

23. The semiconductor device according to claim 17, wherein the second insulator and the third insulator are less likely to allow oxygen to diffuse than the first oxide insulator and the second oxide insulator.

24. The semiconductor device according to claim 17, further comprising a second oxide,
wherein the second oxide is in contact with a side surface of the first oxide insulator, a side surface of the second oxide insulator, and a top surface of the first oxide.

25. The semiconductor device according to claim 24,
wherein the first oxide insulator is isolated from the first conductor, the second conductor, the first insulator, and the first oxide by the second insulator, the second oxide, and the fourth insulator, and
wherein the second oxide insulator is isolated from the first conductor, the third conductor, the first insulator, and the first oxide by the third insulator, the second oxide, and the fourth insulator.

26. The semiconductor device according to claim 24,
wherein the first oxide and the second oxide each comprise In, an element M (M is Al, Ga, Y, or Sn), and Zn.

27. The semiconductor device according to claim 24,
further comprising a third oxide under the first oxide,
wherein the third oxide comprises In, an element M (M is Al, Ga, Y, or Sn), and Zn, and
wherein an atomic ratio of In to the element M in the third oxide is lower than an atomic ratio of In to the element M in the first oxide.

28. The semiconductor device according to claim 27, further comprising a fourth oxide between the second oxide and the first insulator,
wherein the fourth oxide comprises In, an element M (M is Al, Ga, Y, or Sn), and Zn, and
wherein an atomic ratio of In to the element M in the fourth oxide is lower than an atomic ratio of In to the element M in the second oxide.

* * * * *